US012735435B2

(12) United States Patent
Yang et al.

(10) Patent No.: US 12,735,435 B2
(45) Date of Patent: Sep. 15, 2026

(54) POLYCYCLIC AROMATIC DERIVATIVE COMPOUND AND ORGANIC LIGHT-EMITTING DEVICE USING SAME

(71) Applicant: SFC CO., LTD., Cheongju-si (KR)

(72) Inventors: Byung-sun Yang, Cheongju-si (KR); Sung-hoon Joo, Cheongju-si (KR); Bong-ki Shin, Cheongju-si (KR); Ji-hwan Kim, Cheongju-si (KR); Hyeon-jun Jo, Cheongju-si (KR); Sung-eun Choi, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 983 days.

(21) Appl. No.: 17/794,847

(22) PCT Filed: Jan. 25, 2021

(86) PCT No.: PCT/KR2021/000952
§ 371 (c)(1),
(2) Date: Jul. 22, 2022

(87) PCT Pub. No.: WO2021/150080
PCT Pub. Date: Jul. 29, 2021

(65) Prior Publication Data

US 2023/0287010 A1 Sep. 14, 2023

(30) Foreign Application Priority Data

Jan. 23, 2020 (KR) ........................ 10-2020-0009047

(51) Int. Cl.

| | |
|---|---|
| ***C07F 5/02*** | (2006.01) |
| ***C07F 7/08*** | (2006.01) |
| ***C07F 9/53*** | (2006.01) |
| ***H10K 71/10*** | (2023.01) |
| ***H10K 85/40*** | (2023.01) |
| ***H10K 85/60*** | (2023.01) |

(52) U.S. Cl.
CPC ............ *C07F 5/027* (2013.01); *C07F 7/0812* (2013.01); *C07F 9/53* (2013.01); *H10K 71/10* (2023.02); *H10K 85/40* (2023.02); *H10K 85/615* (2023.02); *H10K 85/622* (2023.02); *H10K 85/636* (2023.02); *H10K 85/652* (2023.02); *H10K 85/657* (2023.02); *H10K 85/6572* (2023.02); *H10K 85/6574* (2023.02); *H10K 85/6576* (2023.02); *H10K 85/658* (2023.02); *C07B 2200/05* (2013.01)

(58) Field of Classification Search
CPC .......... C07F 5/027; C07F 7/0812; C07F 9/53; C07F 5/02; H10K 71/10; H10K 85/40; H10K 85/615; H10K 85/622; H10K 85/636; H10K 85/652; H10K 85/657; H10K 85/6572; H10K 85/6574; H10K 85/6576; H10K 85/658; H10K 50/11; H10K 85/626; C07B 2200/05; C07B 59/004; C09K 11/06; Y02E 10/549
See application file for complete search history.

(56) References Cited

U.S. PATENT DOCUMENTS

2019/0115538 A1 4/2019 Lim et al.
2020/0190115 A1* 6/2020 Hatakeyama .......... C09K 11/06
2022/0112221 A1 4/2022 Lee et al.

FOREIGN PATENT DOCUMENTS

| | | |
|---|---|---|
| CN | 107735879 A | 2/2018 |
| CN | 109192874 A | 1/2019 |
| CN | 109671852 A | 4/2019 |
| CN | 110612304 A | 12/2019 |
| CN | 110719914 A | 1/2020 |
| JP | 2021-28320 | 2/2021 |
| JP | 2022-534204 A | 7/2022 |
| KR | 10-2019-0042791 | 4/2019 |
| KR | 10-2020-0006965 A | 1/2020 |
| WO | WO 2016/152418 A1 | 9/2016 |
| WO | WO 2018/212169 A1 | 11/2018 |
| WO | WO 2019/009052 A1 | 1/2019 |
| WO | WO 2019/164331 A1 | 8/2019 |
| WO | WO 2020/242165 A1 | 12/2020 |
| WO | WO 2020/251049 A1 | 12/2020 |

OTHER PUBLICATIONS

WO 2020/251049 A1 (publication date Dec. 2020)—description summary in English. (Year: 2020).*
Hirai, M., Tanaka, N., Sakai, M., & Yamaguchi, S. (2019). Structurally constrained boron-, nitrogen-, silicon-, and phosphorus-centered polycyclic TT-conjugated systems. Chemical reviews, 119(14), 8291-8331. (Year: 2019).*
Partial translation of WO 2020/251049 A1 (publication date Dec. 2020) by WIPO. (Year: 2020).*
International Search Report issued on May 18, 2021, in counterpart PCT Patent Application No. PCT/KR2021/000952 (3 pages in Korean).
Chinese Office Action Issued on Jul. 12, 2024, in Counterpart Chinese Patent Application No. 202180015648.4 (7 Pages in Chinese).
Japanese Office Action issued on Aug. 8, 2023 in corresponding Japanese Patent Application No. 2022-544838 (3 pages in Japanese).

* cited by examiner

*Primary Examiner* — Dawn L Garrett
(74) *Attorney, Agent, or Firm* — NSIP Law

(57) ABSTRACT

A polycyclic aromatic derivative compound according to the present invention is employed in an organic layer in a device, thus being able to implement a high-efficiency organic light-emitting device, and thus can be industrially and effectively used in various display devices such as flexible displays, and illumination apparatuses such as monochromatic or white flat illumination and monochromatic or white flexible illumination.

17 Claims, No Drawings

POLYCYCLIC AROMATIC DERIVATIVE COMPOUND AND ORGANIC LIGHT-EMITTING DEVICE USING SAME

CROSS REFERENCE TO RELATED APPLICATIONS

This application is a U.S. National Stage Application of International Application No. PCT/KR2021/000952, filed on Jan. 25, 2021, which claims the benefit under 35 USC 119(a) and 365(b) of Korean Patent Application No. 10-2020-0009047 filed on Jan. 23, 2020, in the Korean Intellectual Property Office, the entire disclosure of which is incorporated herein by reference for all purposes.

TECHNICAL FIELD

The present invention relates to a polycyclic aromatic derivative and a highly efficient organic electroluminescent device with significantly improved luminous efficiency using the polycyclic aromatic derivative.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

As such, there is a continued need to develop structures of organic electroluminescent devices optimized to improve their luminescent properties and new materials capable of supporting the optimized structures of organic electroluminescent devices.

DISCLOSURE

Technical Problem

Accordingly, the present invention intends to provide an organic electroluminescent compound that is employed in an organic layer of an organic electroluminescent device to achieve high efficiency of the device. The present invention also intends to provide an organic electroluminescent device including the organic electroluminescent compound.

Technical Solution

One aspect of the present invention provides a compound represented by Formula A:

[Formula A]

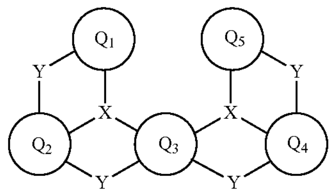

More specific structures of Formula A, definitions of $Q_1$ to $Q_5$, X, and Y in Formula A, and specific polycyclic aromatic compounds that can be represented by Formula A are described below.

A further aspect of the present invention provides an organic electroluminescent device including a first electrode, a second electrode opposite to the first electrode, and one or more organic layers interposed between the first and second electrodes wherein one of the organic layers includes at least one of the specific polycyclic aromatic compounds that can be represented by Formula A.

Advantageous Effects

The polycyclic aromatic derivative of the present invention can be employed in an organic layer of an organic electroluminescent device to achieve high efficiency of the device.

BEST MODE

The present invention will now be described in more detail.

The present invention is directed to a polycyclic aromatic derivative for use in an organic electroluminescent device, represented by Formula A:

[Formula A]

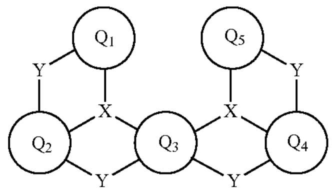

wherein $Q_1$ to $Q_5$ are identical to or different from each other and are each independently a substituted or unsubstituted $C_6$-$C_{50}$ aromatic hydrocarbon ring or a substituted or unsubstituted $C_2$-$C_{50}$ aromatic heterocyclic ring, each X is independently selected from B, P, P═O, and P═S, each Y is independently selected from N—$R_1$, $CR_2R_3$, O, S, Se, and $SiR_4R_5$, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to one of the rings $Q_1$ and $Q_5$ to form an alicyclic or aromatic monocyclic or polycyclic ring, $R_2$ and $R_3$ are optionally linked to each other to form an alicyclic or aromatic monocyclic or polycyclic ring, and $R_4$ and $R_5$ are optionally linked to each other to form an alicyclic or aromatic monocyclic or polycyclic ring.

According to one embodiment of the present invention, X in Formula A may be boron (B). The presence of boron (B) in the structure of the polycyclic aromatic derivative ensures high efficiency and long lifetime of the organic electroluminescent device.

The use of the polycyclic aromatic derivative makes the organic electroluminescent device highly efficient and long lasting.

The polycyclic aromatic derivative represented by Formula A according to the present invention has the following structural features:

(i) either or both of $Q_1$ and $Q_5$ are selected from structures represented by Structural Formulae B-1 to B-3:

[Structural Formula B-1]

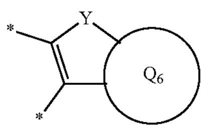

[Structural Formula B-2]

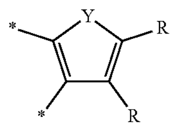

[Structural Formula B-3]

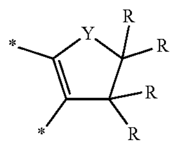

wherein each Y is independently selected from N—$R_1$, $CR_2R_3$, O, S, Se, and $SiR_4R_5$, $R_1$ to $R_5$ are as defined in Formula A, $Q_6$ is a substituted or unsubstituted $C_6$-$C_{50}$ aromatic hydrocarbon ring or a substituted or unsubstituted $C_2$-$C_{50}$ aromatic heterocyclic ring, each R is independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other or are each independently optionally bonded to one of the rings $Q_1$ and $Q_5$ to form an alicyclic or aromatic monocyclic or polycyclic ring, and each * represents a position at which the corresponding ring $Q_1$ or $Q_5$ is bonded to the adjacent X and Y in Formula A;

(ii) $Q_3$ is selected from structures represented by Structural Formulae B-4 to B-6:

[Structural Formula B-4]

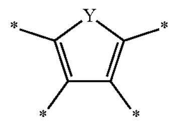

[Structural Formula B-5]

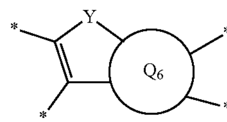

[Structural Formula B-6]

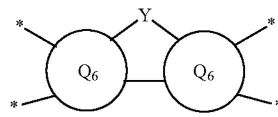

wherein Y and $Q_6$ are as defined above and each * represents a position at which the ring $Q_3$ is bonded to the adjacent X and Y in Formula A; or (iii) either or both of $Q_1$ and $Q_5$ are selected from the structures represented by Structural Formulae B-1 to B-3 and $Q_3$ is selected from the structures represented by Structural Formulae B-4 to B-6.

According to the structural features of the polycyclic aromatic derivative represented by Formula A according to the present invention, when either $Q_1$ or $Q_5$ is selected from the structures represented by Structural Formulae B-1 to B-3, Formula A may have one of the following skeleton structures represented by Formulae A-1 to A-6:

A-1

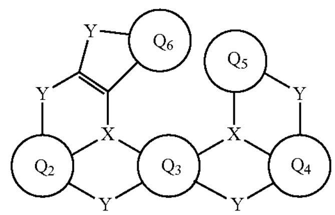

A-2

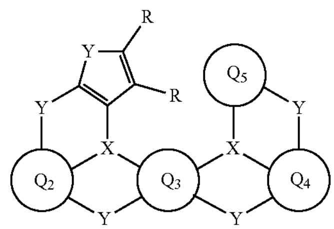

A-3

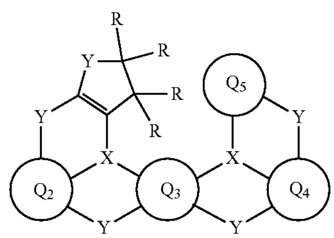

-continued

A-4

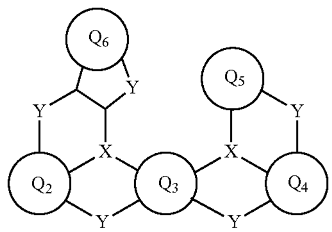

A-5

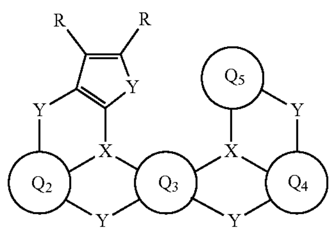

A-6

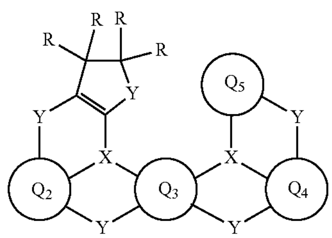

wherein X, Y, R, and $Q_2$ to $Q_6$ are as defined in Formula A.

According to the structural features of the polycyclic aromatic derivative represented by Formula A according to the present invention, when both $Q_1$ and $Q_5$ are selected from the structures represented by Structural Formulae B-1 to B-3, Formula A may have one of the following skeleton structures represented by Formulae A-7 to A-15:

A-7

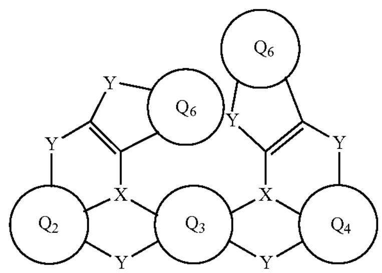

A-8

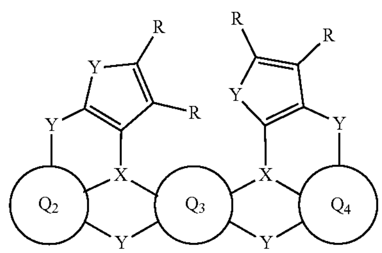

-continued

A-9

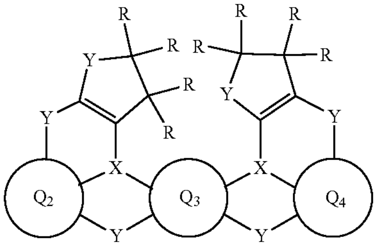

A-10

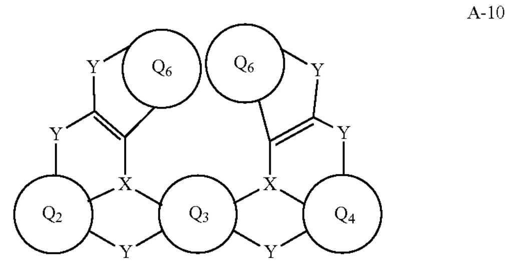

A-11

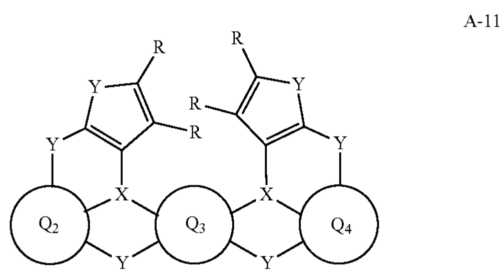

A-12

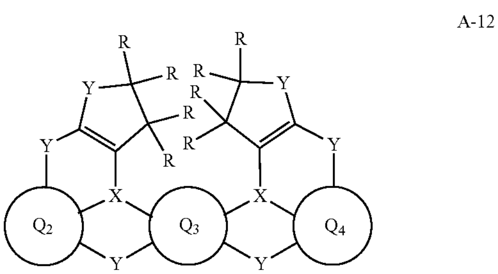

A-13

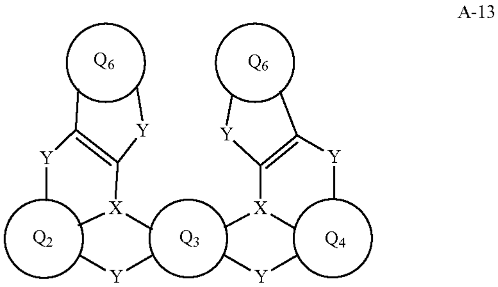

A-14

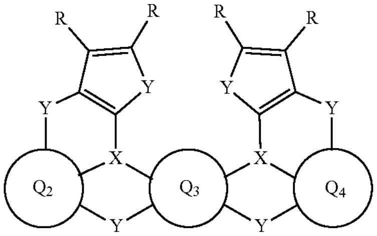

-continued

A-15

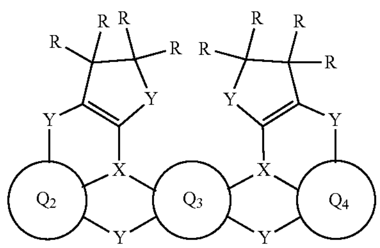

wherein X, Y, R, $Q_2$, $Q_3$, $Q_4$, and $Q_6$ are as defined in Formula A.

According to the structural features of the polycyclic aromatic derivative represented by Formula A according to the present invention, when $Q_3$ is selected from the structures represented by Structural Formulae B-4 to B-6, Formula A may have one of the following skeleton structures represented by Formulae A-16 to A-21:

A-16

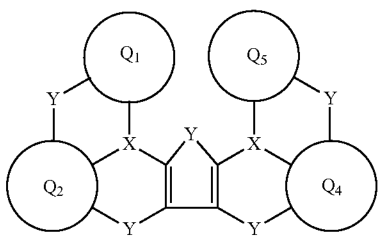

A-17

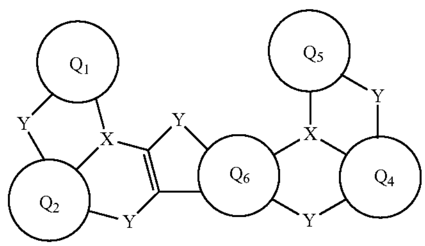

A-18

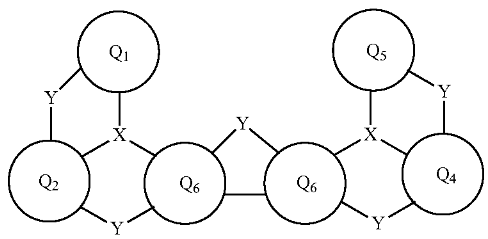

A-19

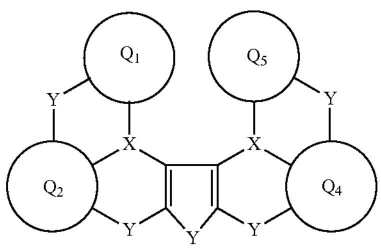

-continued

A-20

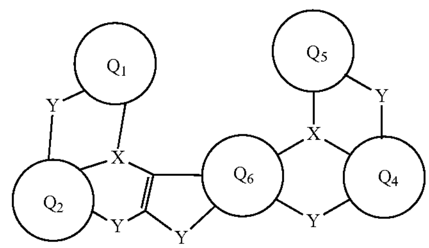

A-21

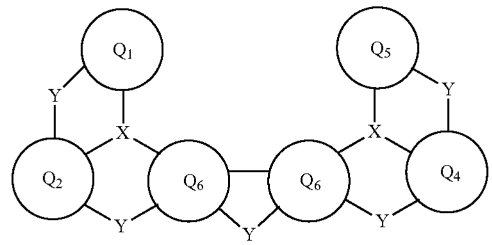

wherein X, Y, $Q_1$, $Q_2$, $Q_4$, $Q_5$, and $Q_6$ are as defined in Formula A.

According to the structural features of the polycyclic aromatic derivative represented by Formula A according to the present invention, when $Q_3$ is selected from the structures represented by Structural Formulae B-4 to B-6 and either $Q_1$ or $Q_5$ is selected from the structures represented by Structural Formulae B-1 to B-3, Formula A may have one of the following skeleton structures represented by Formulae A-22 to A-53:

A-22

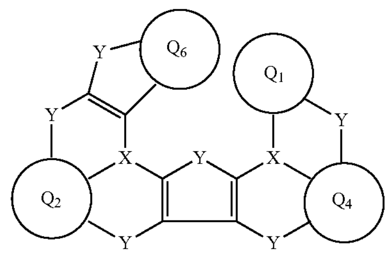

A-23

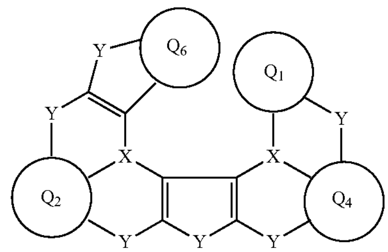

A-24

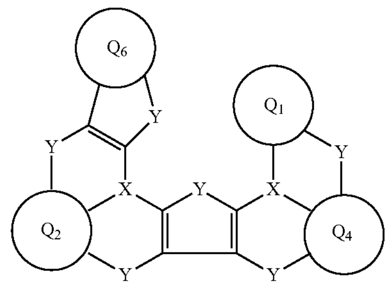

-continued
A-25
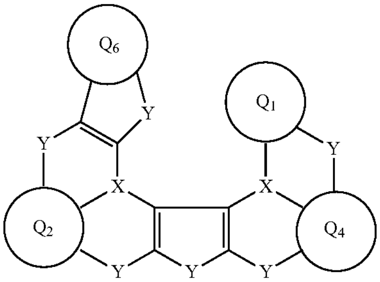
A-26
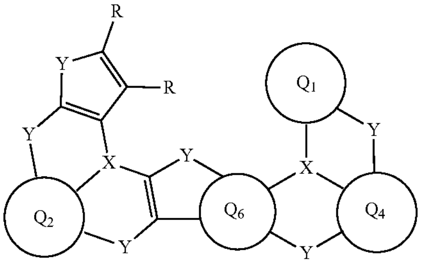
A-27
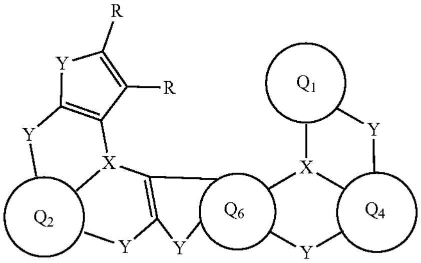
A-28
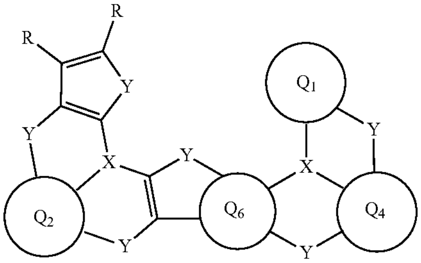
A-29
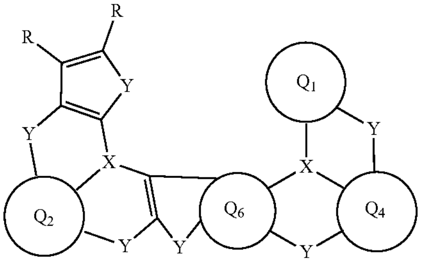
A-30
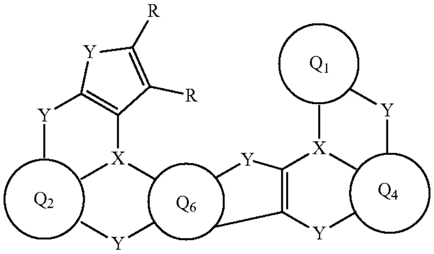
-continued
A-31
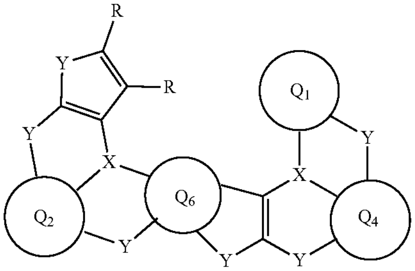
A-32
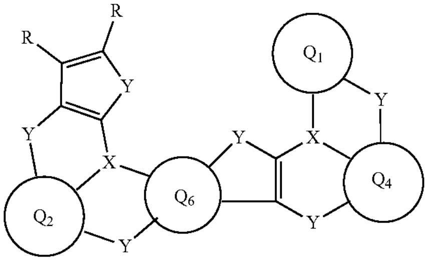
A-33
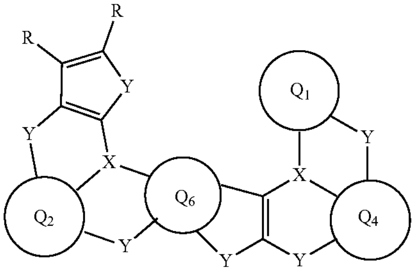
A-34
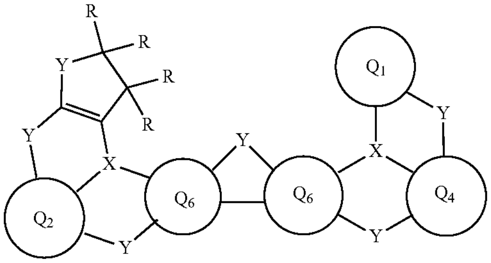
A-35
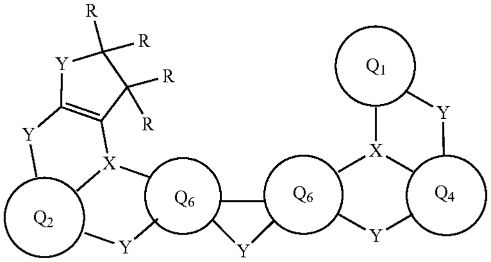

-continued
A-36
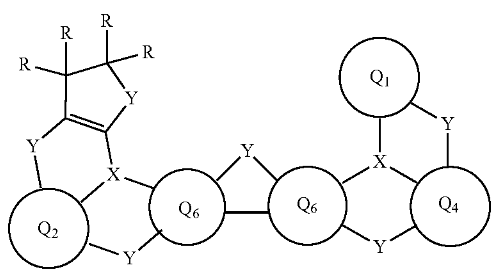
A-37
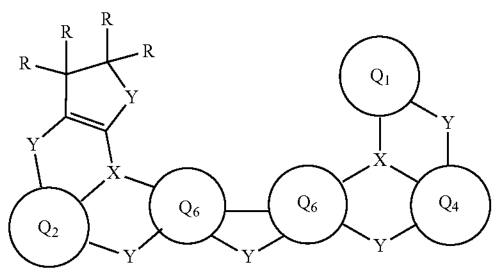
A-38
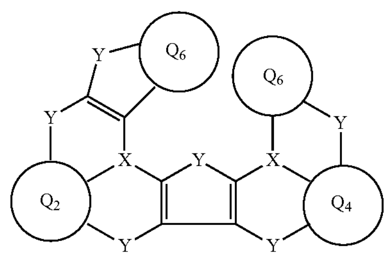
A-39
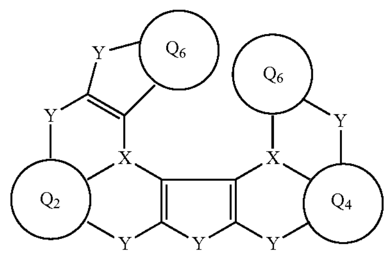
A-40
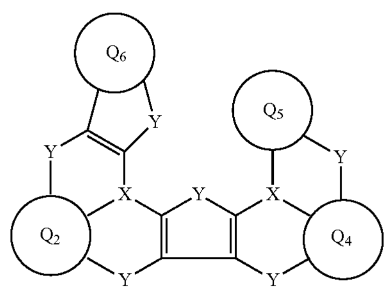
-continued
A-41
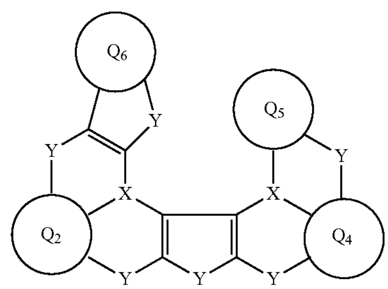
A-42
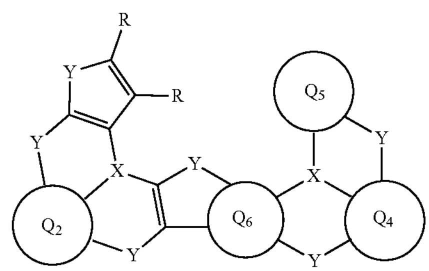
A-43
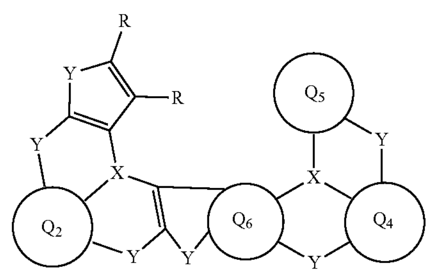
A-44
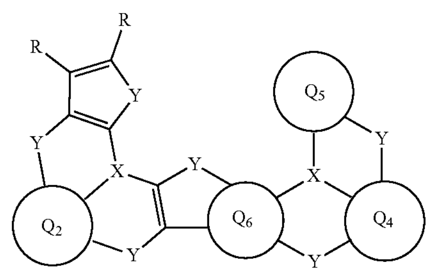
A-45
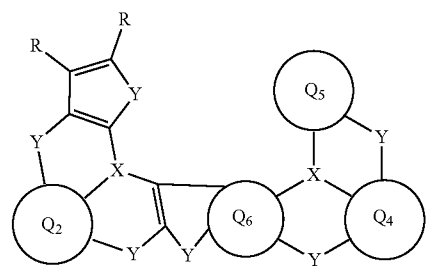
A-46
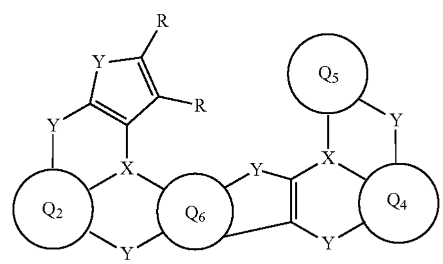

-continued

A-47

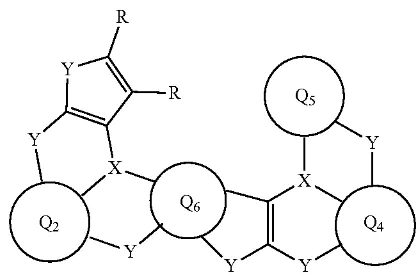

A-48

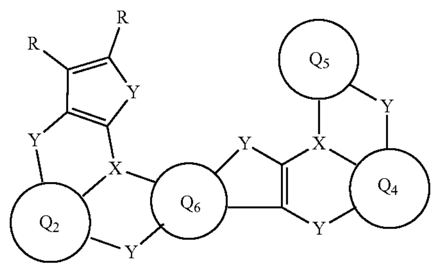

A-49

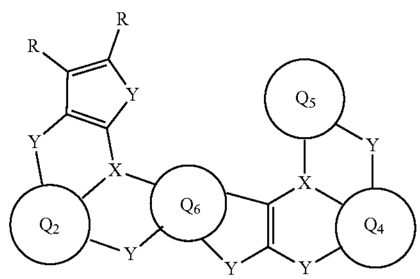

A-50

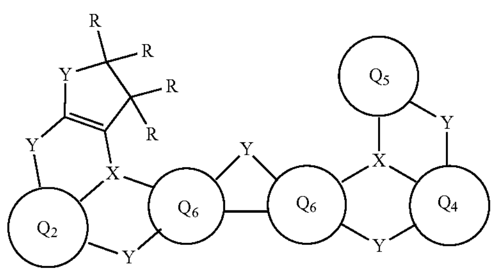

A-51

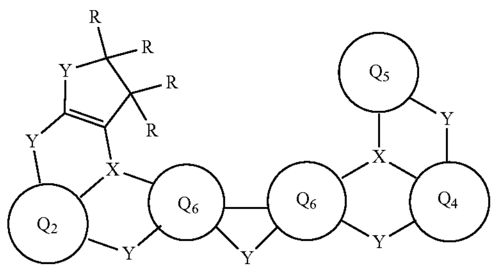

A-52

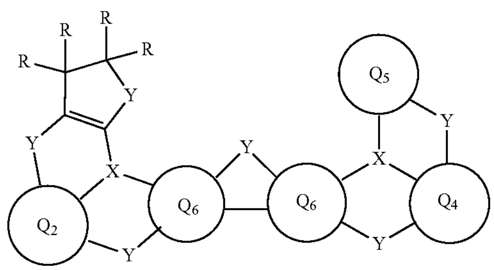

-continued

A-53

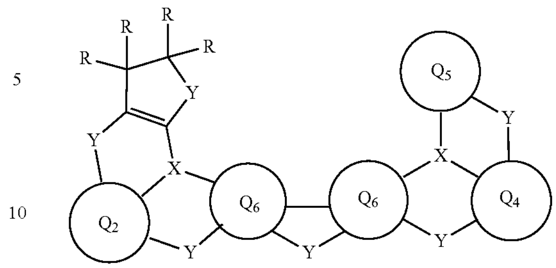

wherein X, Y, $Q_1$, $Q_2$, $Q_4$, $Q_5$, and $Q_6$ are as defined in Formula A.

According to the structural features of the polycyclic aromatic derivative represented by Formula A according to the present invention, when $Q_3$ is selected from the structures represented by Structural Formulae B-4 to B-6 and both $Q_1$ and $Q_5$ are selected from the structures represented by Structural Formulae B-1 to B-3, Formula A may have one of the following skeleton structures represented by Formulae A-54 to A-79:

A-54

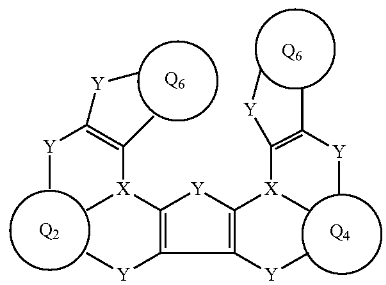

A-55

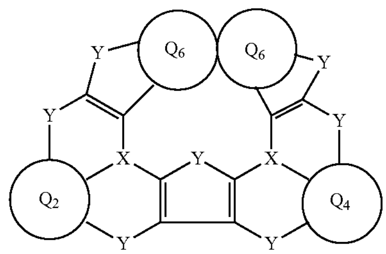

A-56

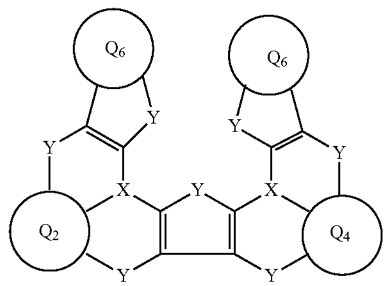

-continued
A-57
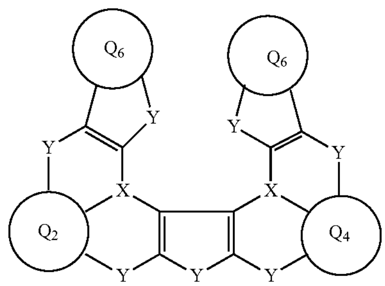
A-58
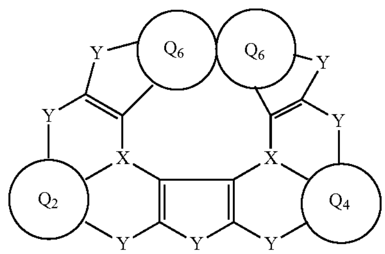
A-59
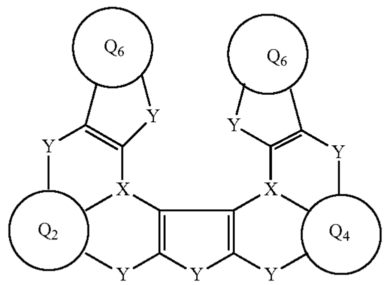
A-60
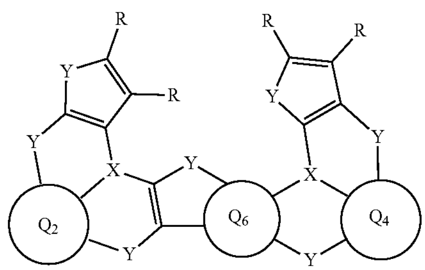
A-61
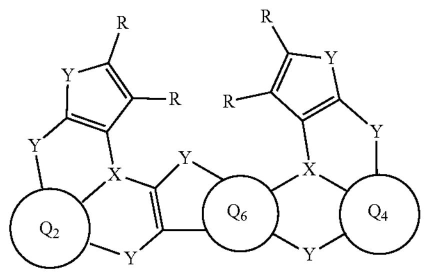
A-62
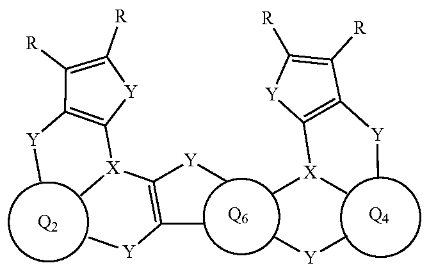
-continued
A-63
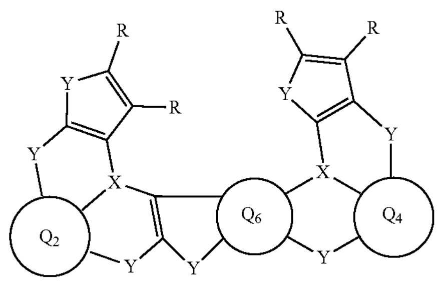
A-64
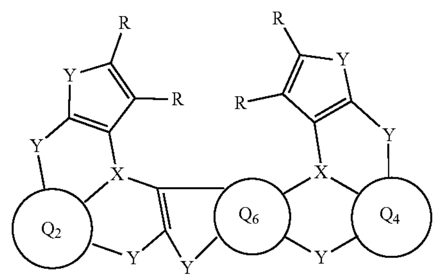
A-65
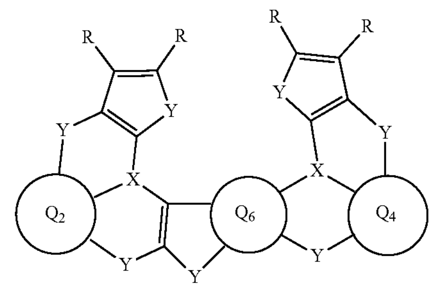
A-66
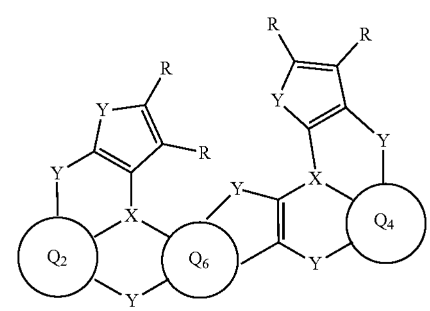
A-67
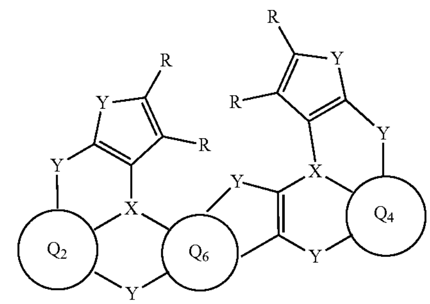

-continued
A-70
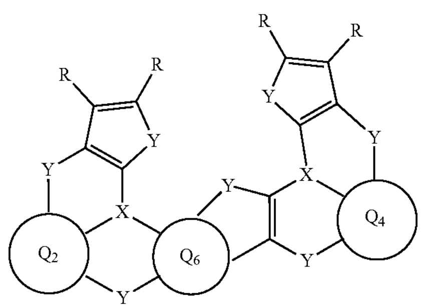
A-71
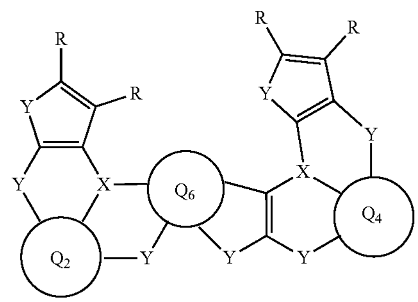
A-72
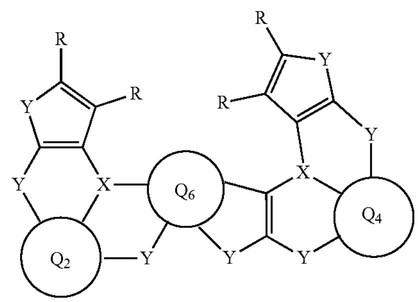
A-73
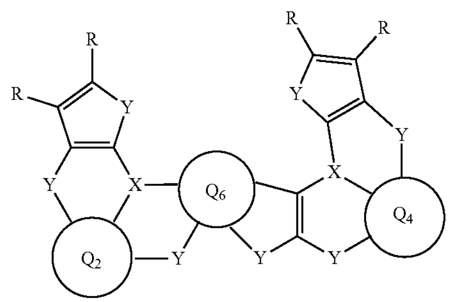
A-74
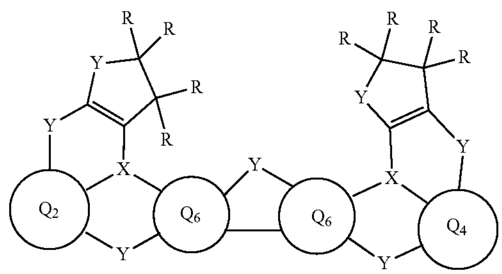
-continued
A-75
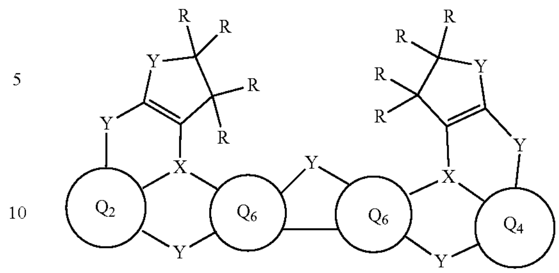
A-76
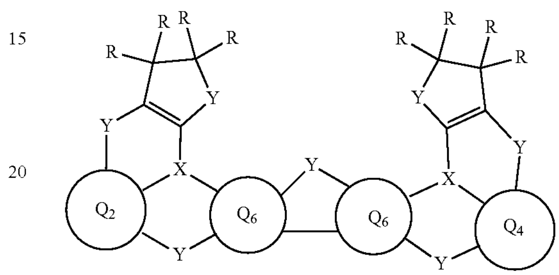
A-77
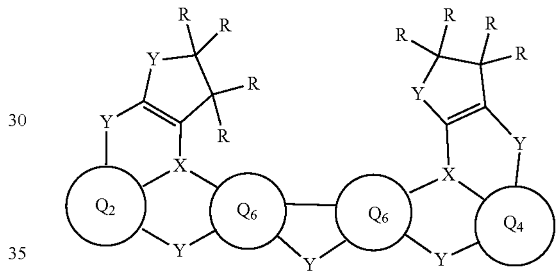
A-78
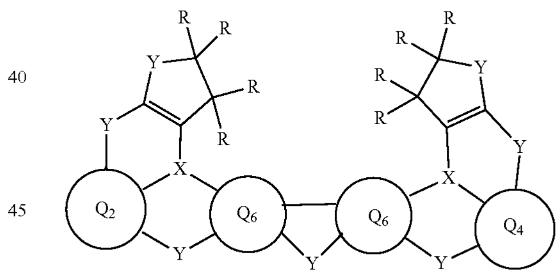
A-79
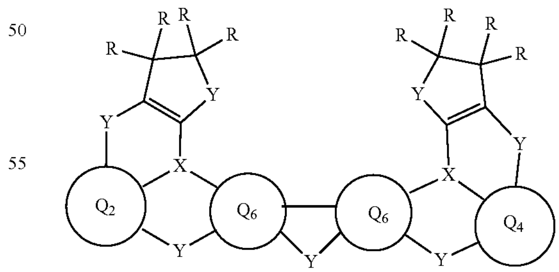
wherein X, Y, R, $Q_2$, $Q_4$, and $Q_6$ are as defined in Formula A.
Although not specified in Formulae 1 to 79, it should be understood that $Q_1$ and $Q_5$ are identical to or different from each other and are each independently from the structures represented by Structural Formulae B-1 to B-3.

The use of the various polycyclic aromatic skeleton structures such as the structures represented by Formulae A-1 to A-79 meets the desired requirements of various organic layers of organic electroluminescent devices to achieve high efficiency and long lifetime of the devices.

According to one embodiment of the present invention, $Q_1$ to $Q_6$ may be identical to or different from each other and may be each independently represented by Structural Formula Q-1:

[Structural Formula Q-1]

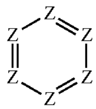

wherein each Z is independently CR or N and each R is independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other or are each independently optionally linked to an adjacent substituent to form an alicyclic or aromatic monocyclic or polycyclic ring, one or more of the carbon atoms in the alicyclic or aromatic monocyclic or polycyclic ring are optionally replaced with heteroatoms selected from N, S, and O, and Z structurally bonded to each of the adjacent X and Y is C—H unless otherwise defined.

As used herein, the term "substituted" in the definition of $Q_1$ to $Q_3$, R, $R_1$ to $R_{13}$, and $R_{21}$ to $R_{24}$ indicates substitution with one or more substituents selected from deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. As used herein, the term "unsubstituted" indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The alkyl groups may be straight or branched. The number of carbon atoms in the alkyl groups is not particularly limited but is preferably 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl) vinyl-1-yl, 2,2-bis(diphenyl-1-yl) vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, and heteroarylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl moieties in the arylamine groups may be monocyclic or polycyclic ones. The arylamine groups may include two or more aryl moieties. In this case, the aryl moieties may be all either monocyclic or polycyclic ones. Alternatively, the arylamine groups may include one or more monocyclic aryl moieties and one or more polycyclic aryl moieties. The aryl moieties in the arylamine groups may be selected from those exemplified above for the aryl groups.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic aromatic derivative represented by Formula A according to the present invention may be selected from the following compounds 1 to 267:

1

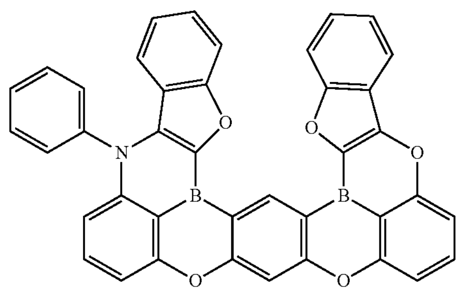

2

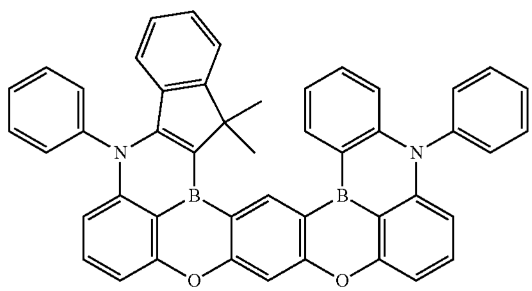

3

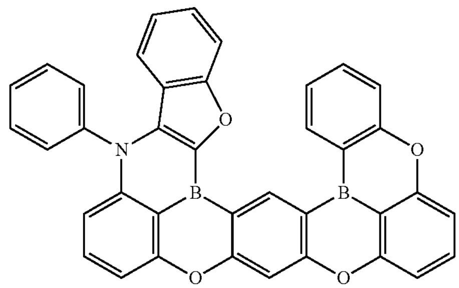

4

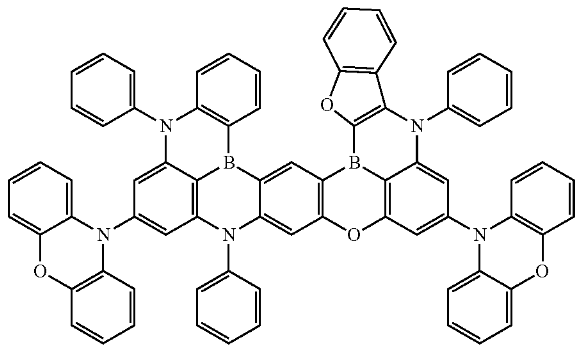

5

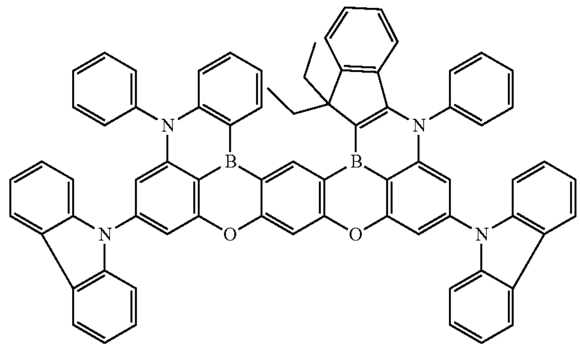

6

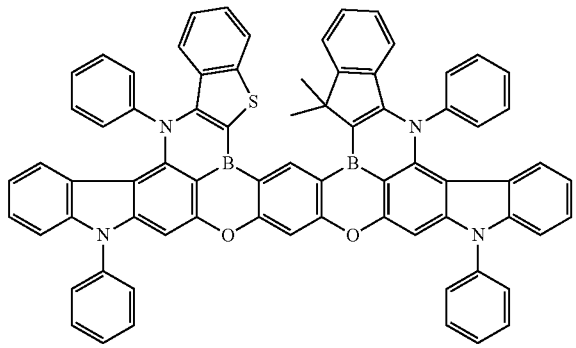

-continued
7
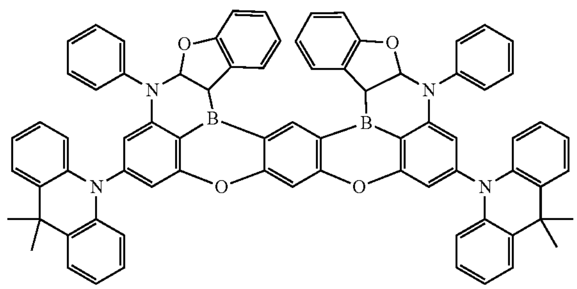
8
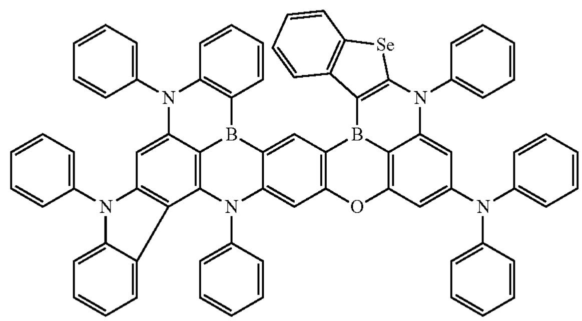
9
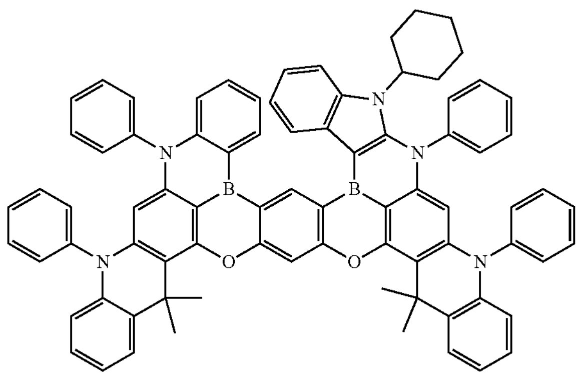
10
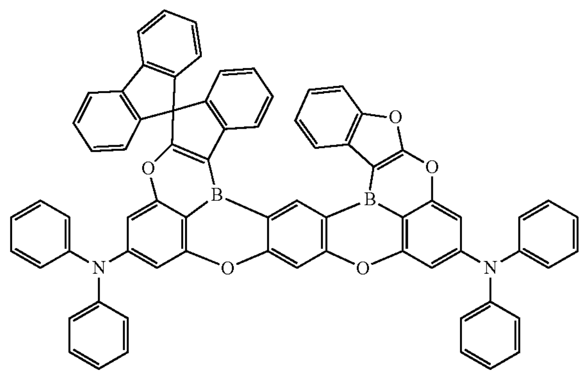
11
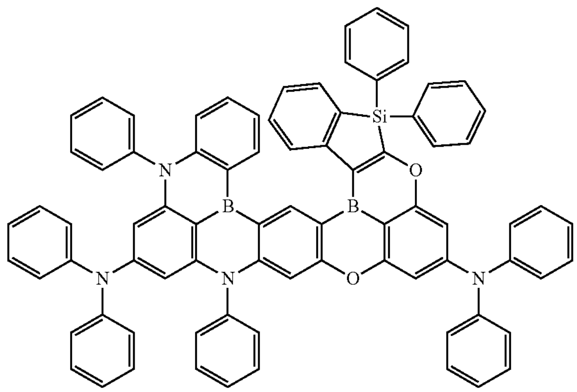
12
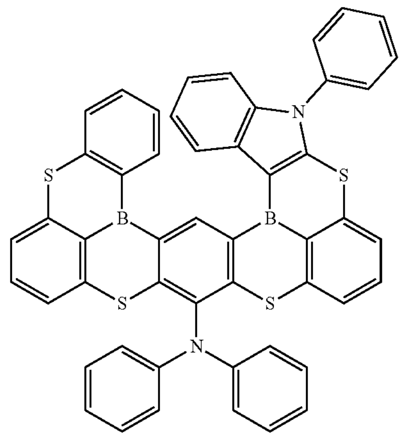
13
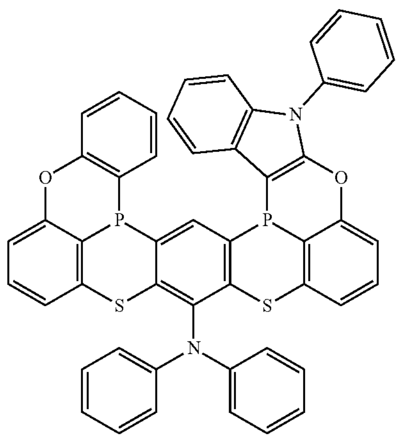
14
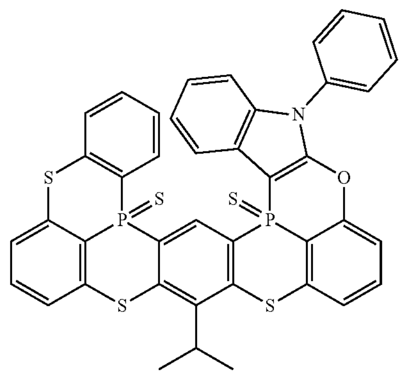

-continued
15
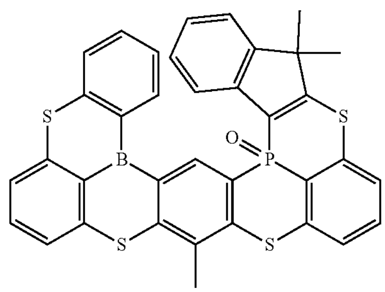
16
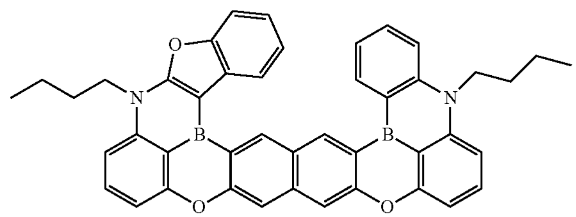
17
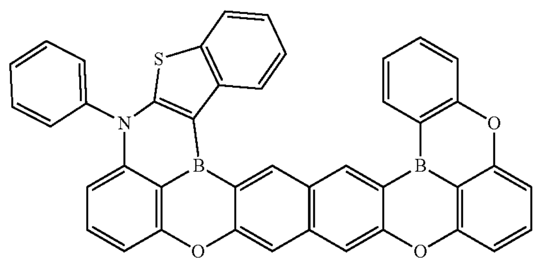
18
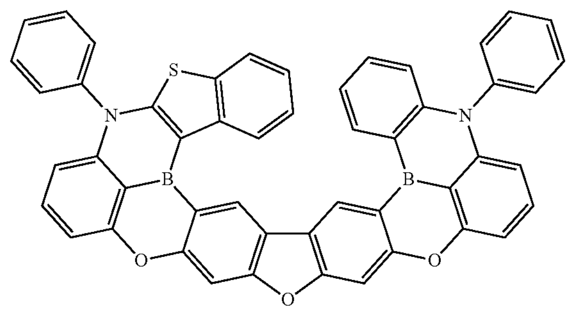
19
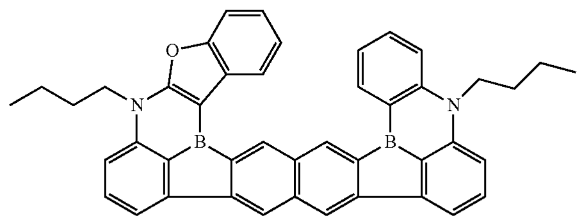
20
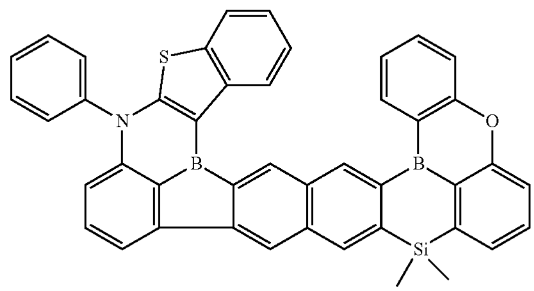
21
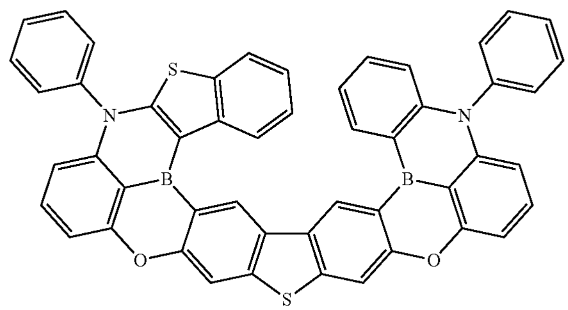
22
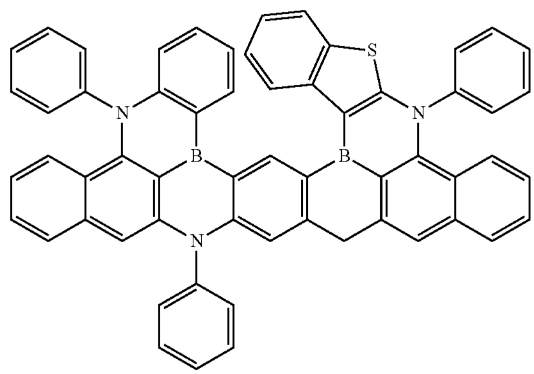

-continued
23
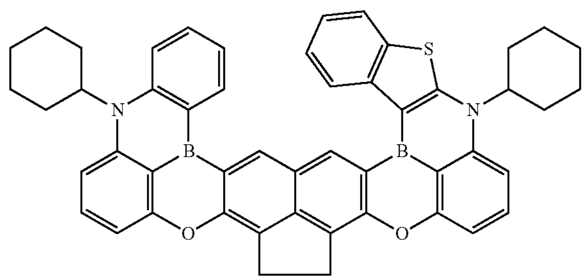
24
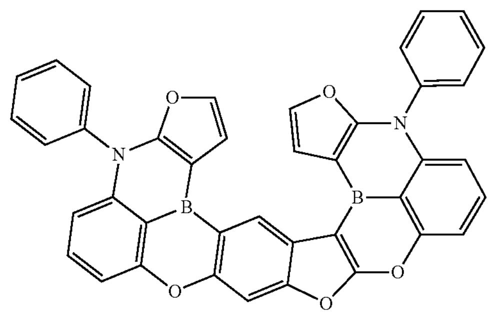
25
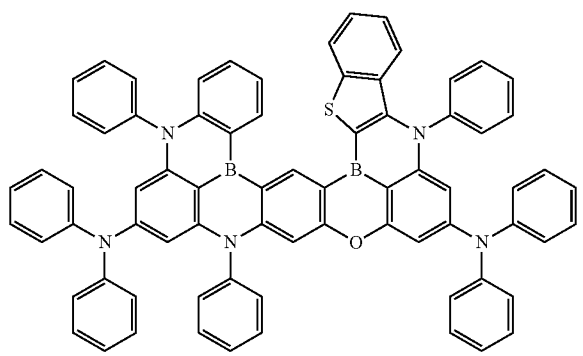
26
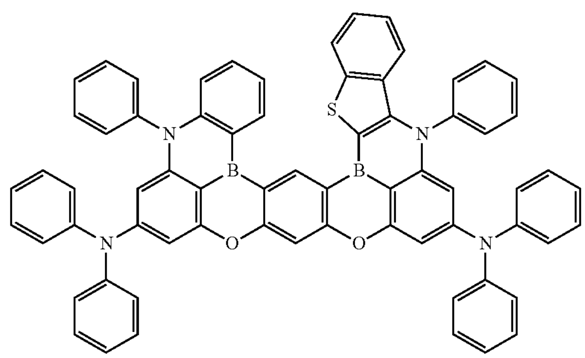
27
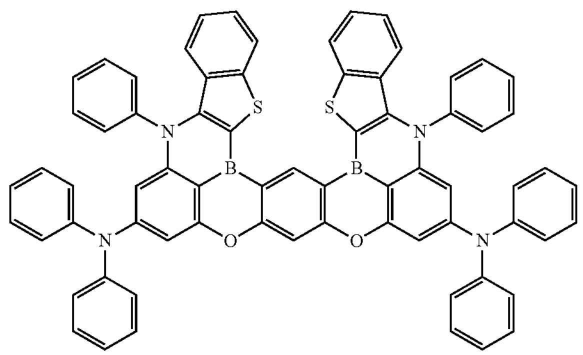
28
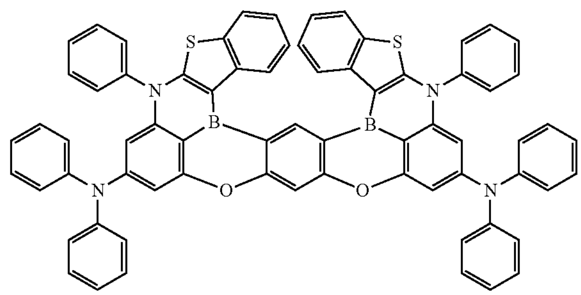
29
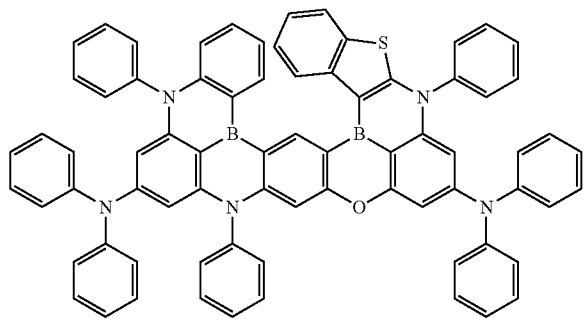
30
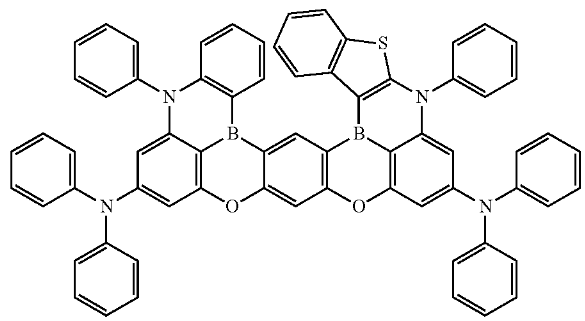

-continued
31
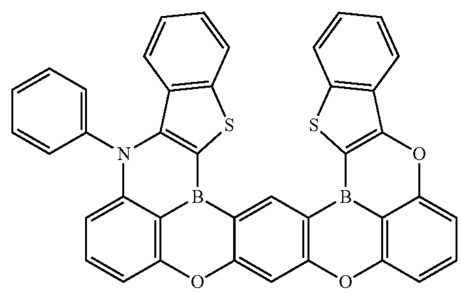
32
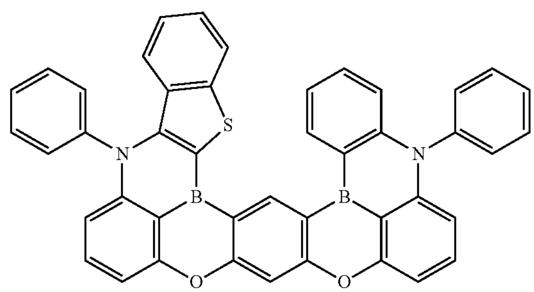
33
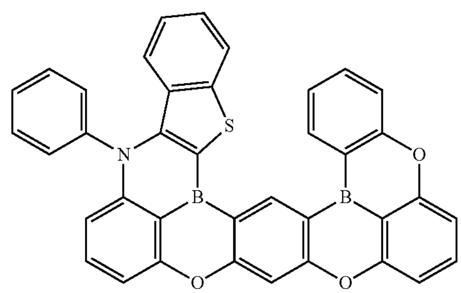
34
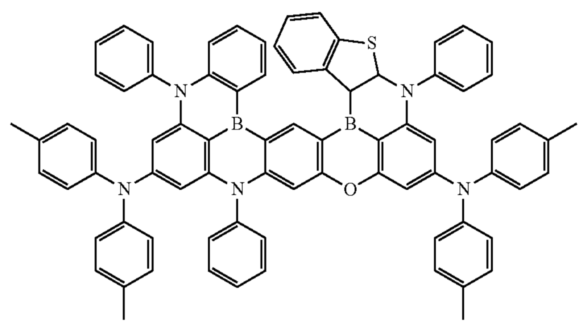
35
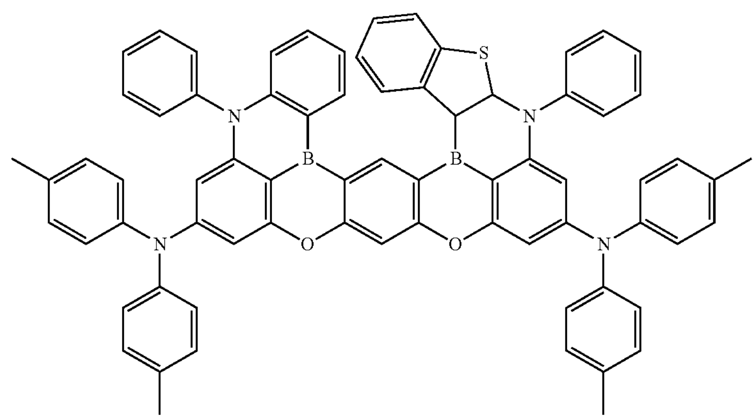
36
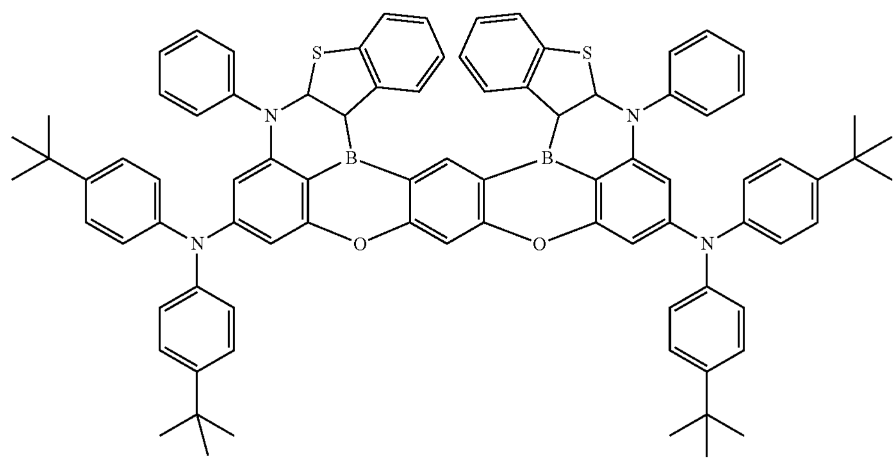

-continued
37
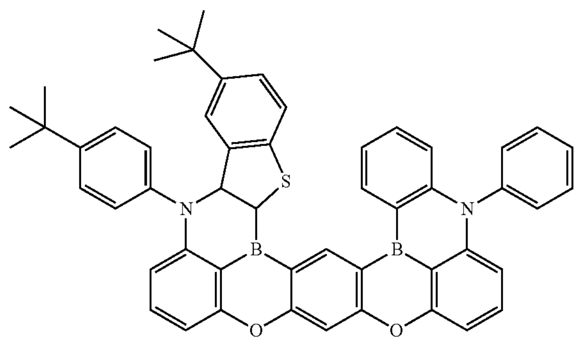
38
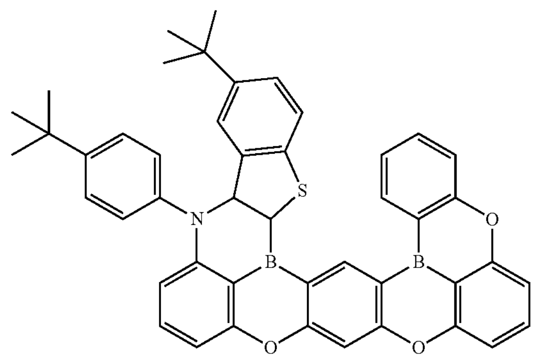
39
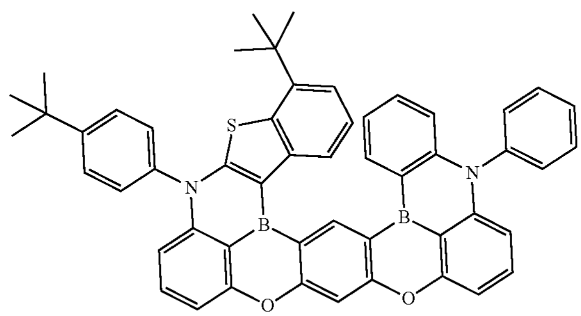
40
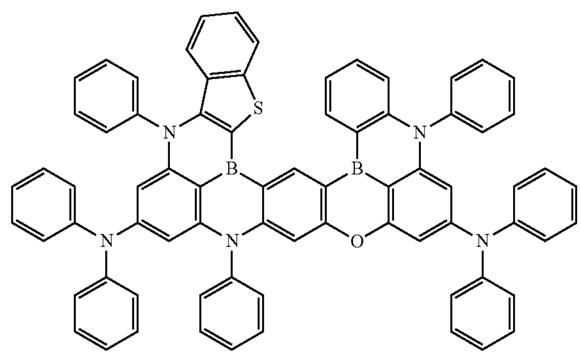
41
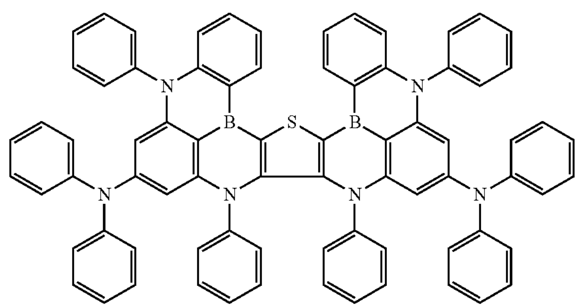
42
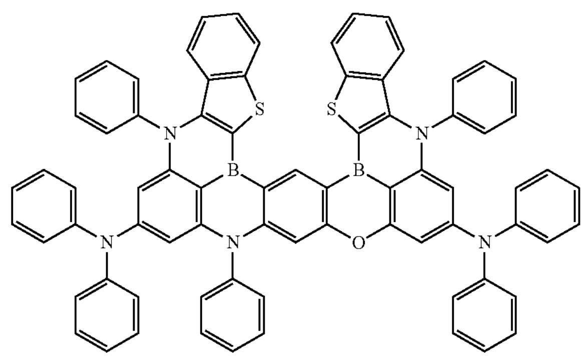
43
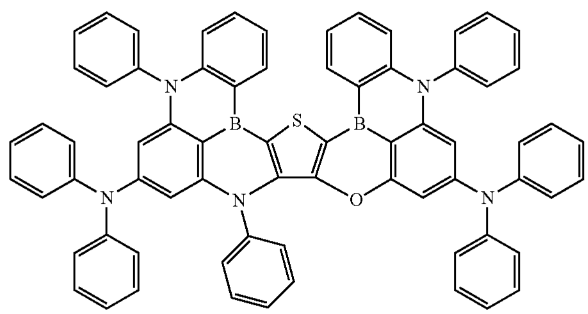
44
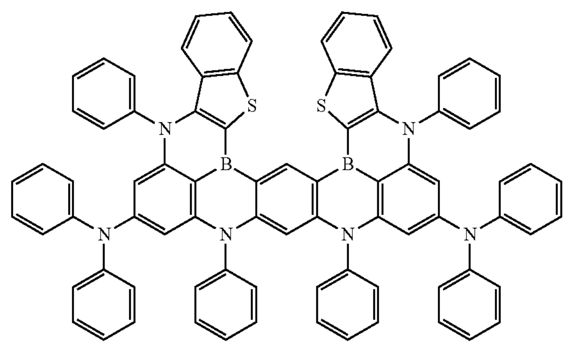

-continued
45
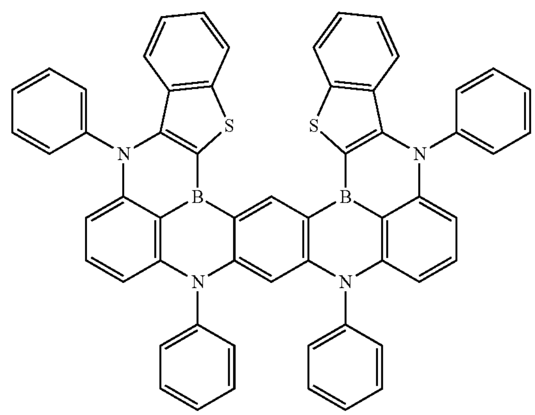
46
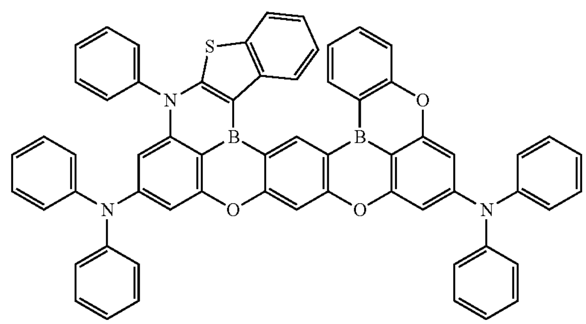
47
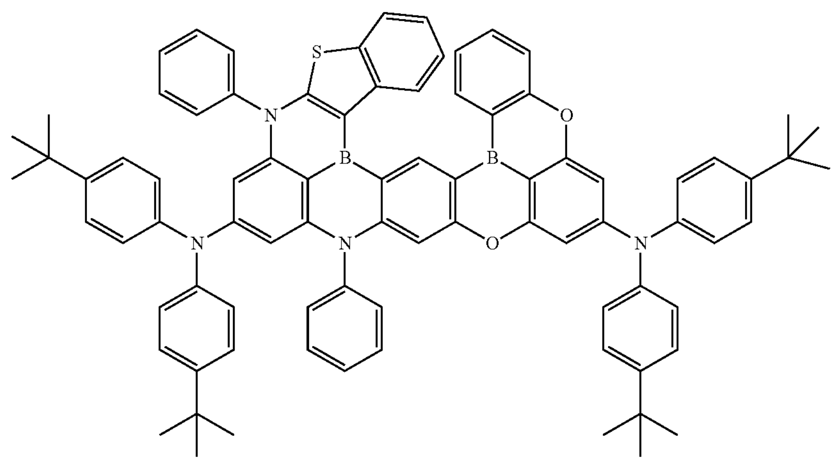
48
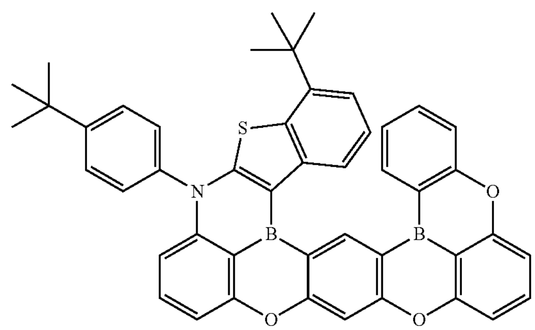
49
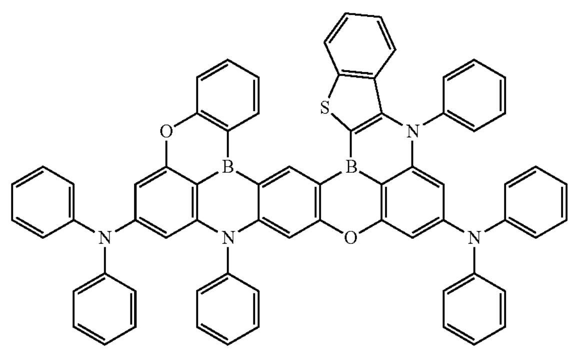

-continued
50
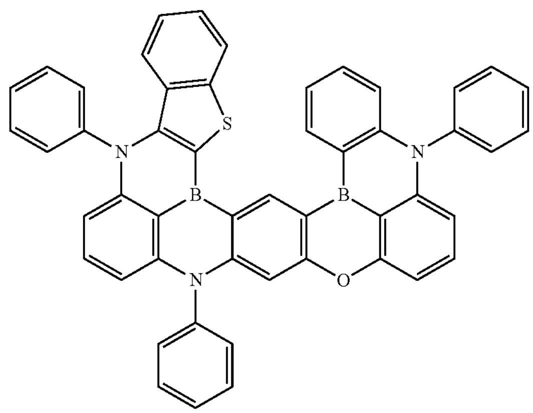
51
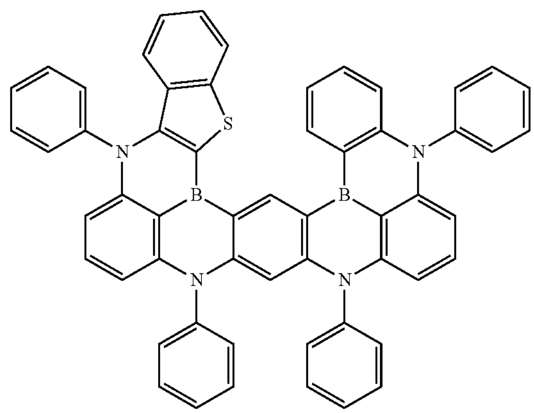
52
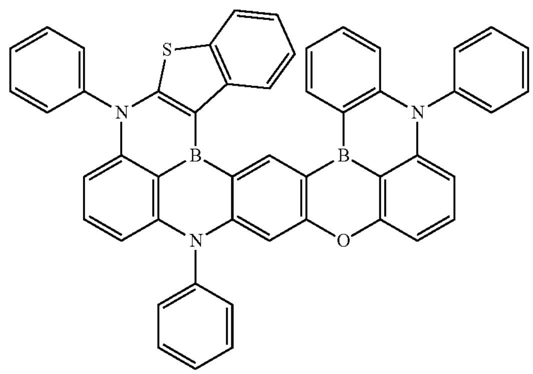
53
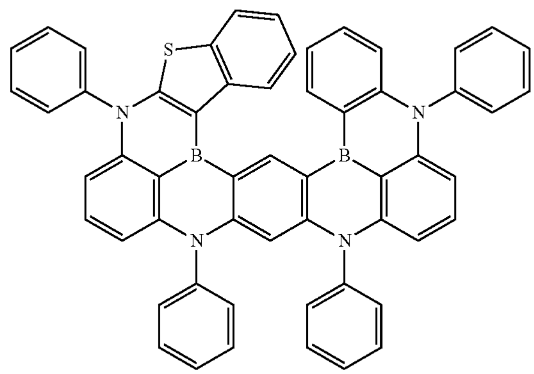
54
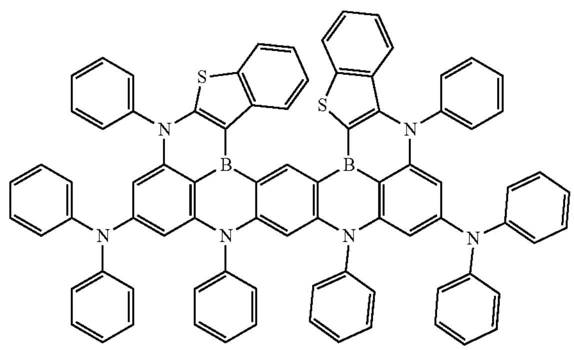
55
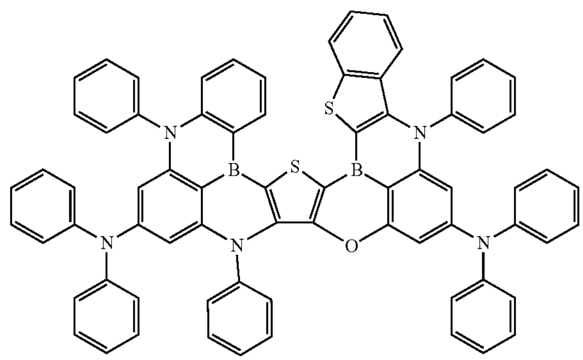
56
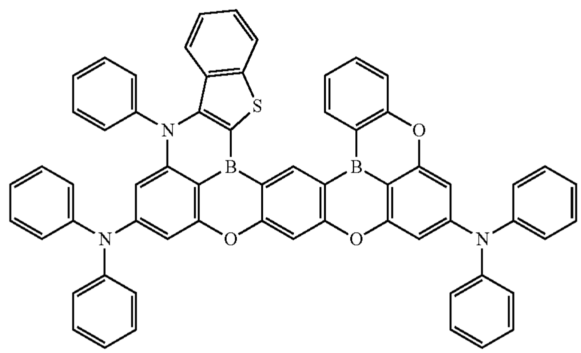
57
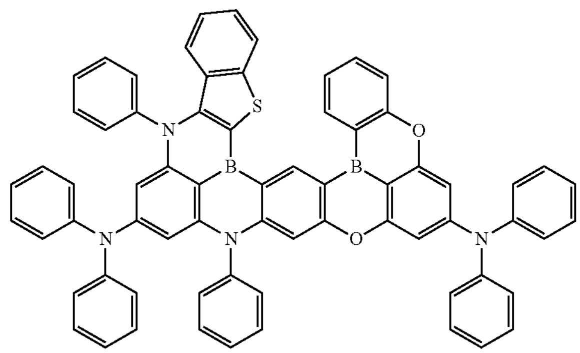

-continued
58
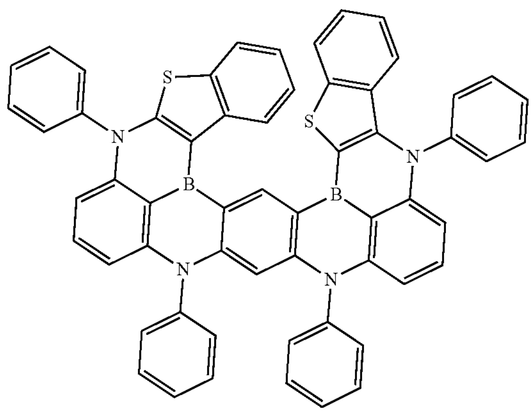
59
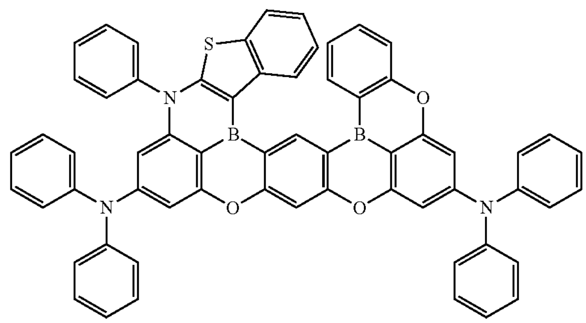
60
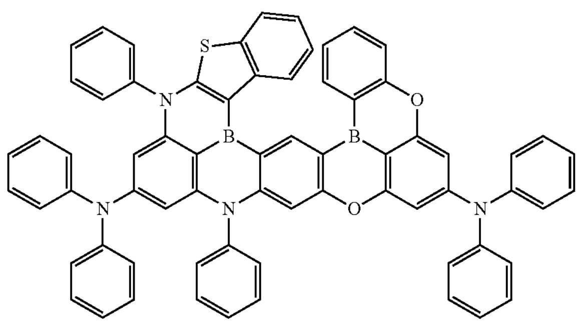
61
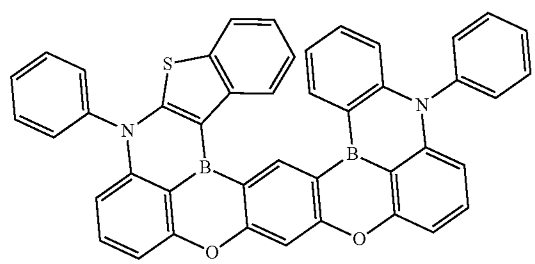
62
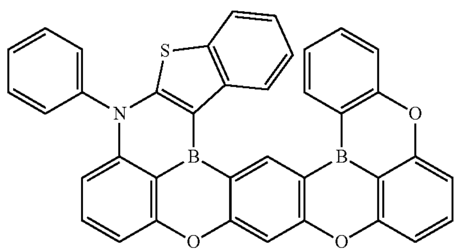
63
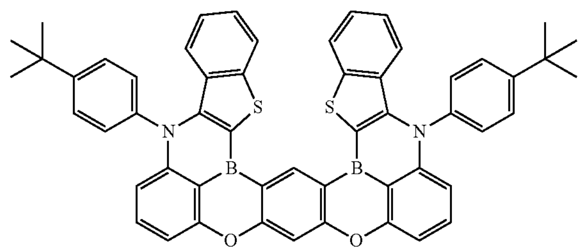
64
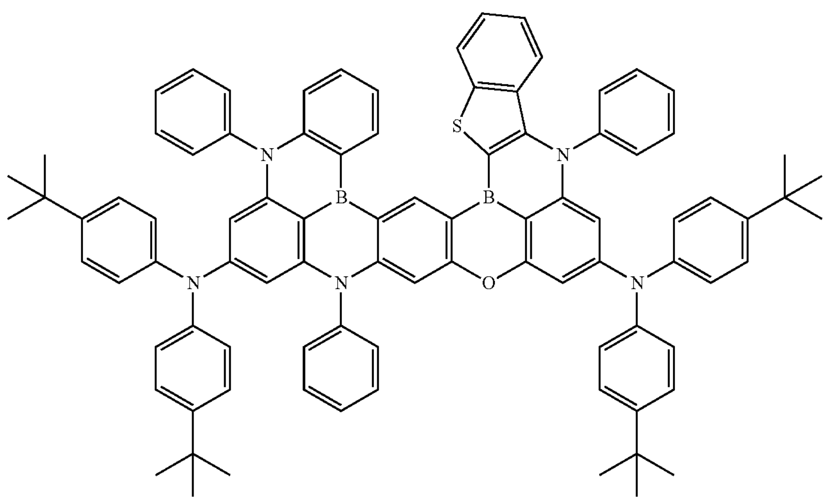

-continued
65
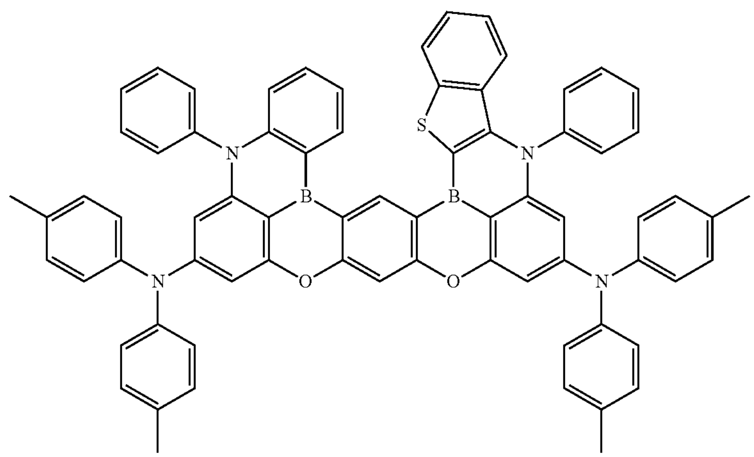
66
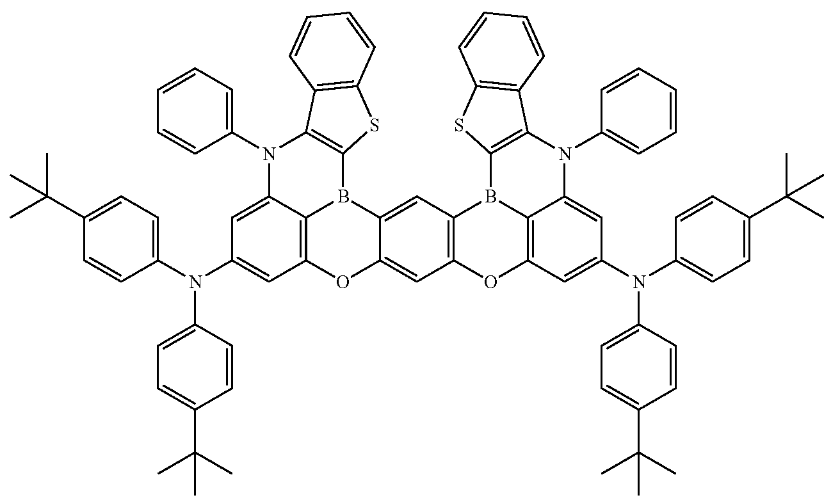
67
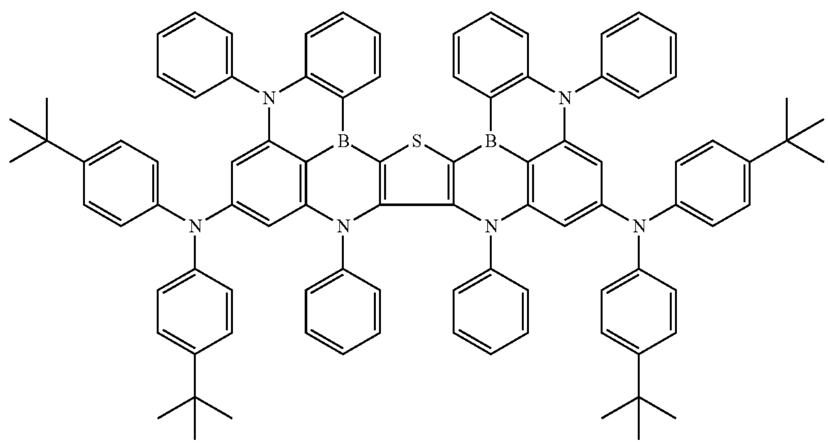

-continued
68
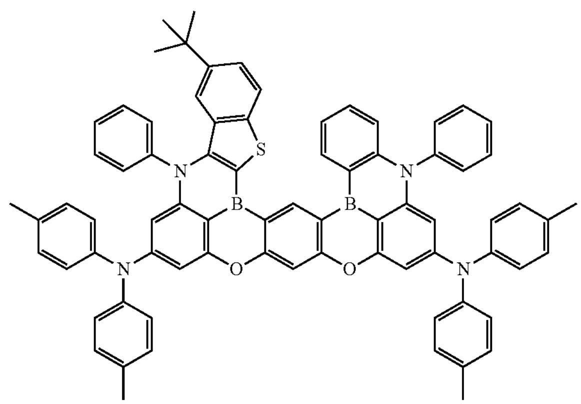
69
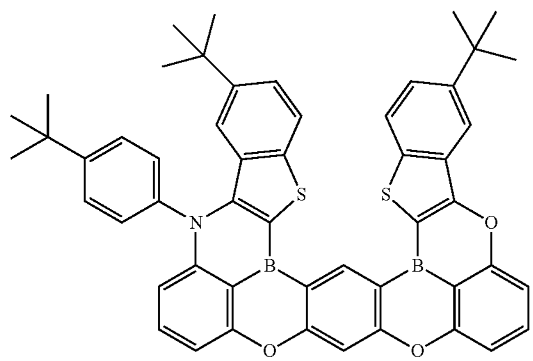
70
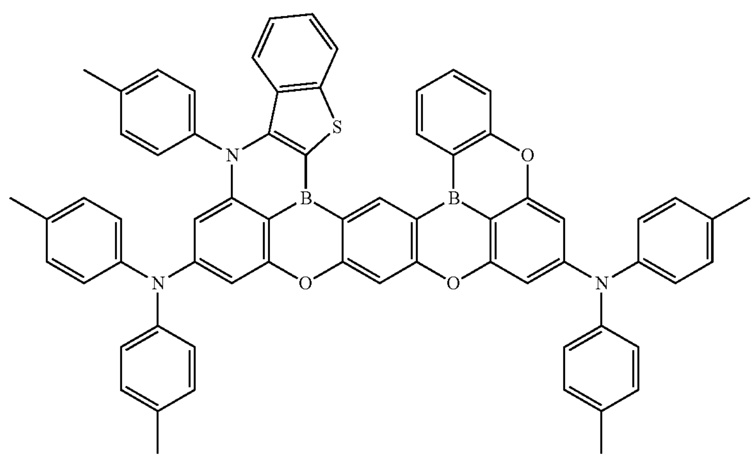
71
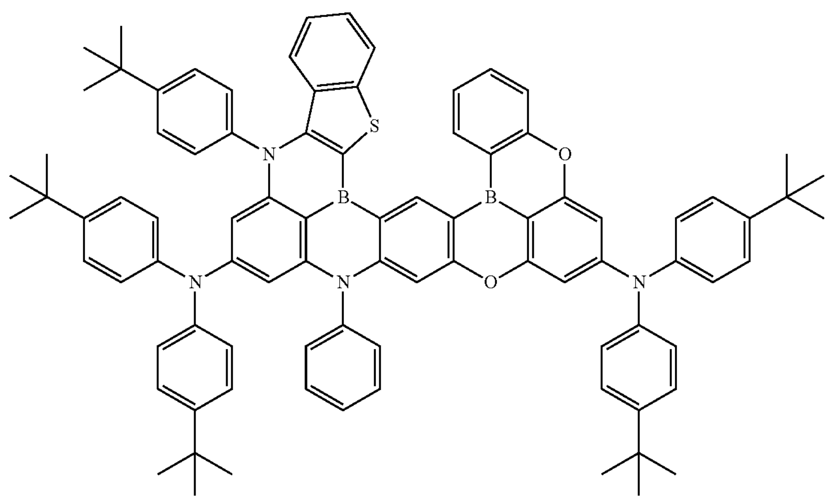

-continued
72
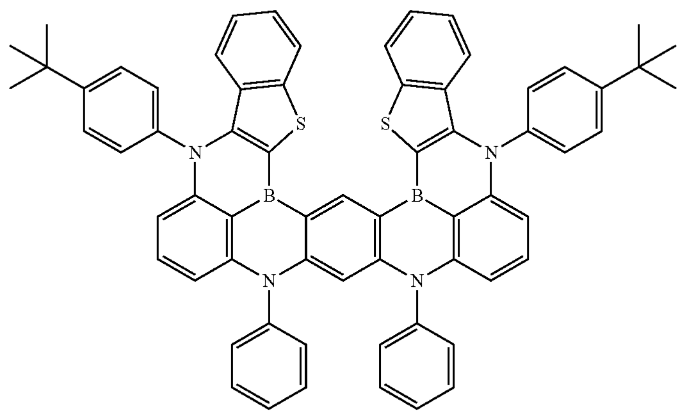
73
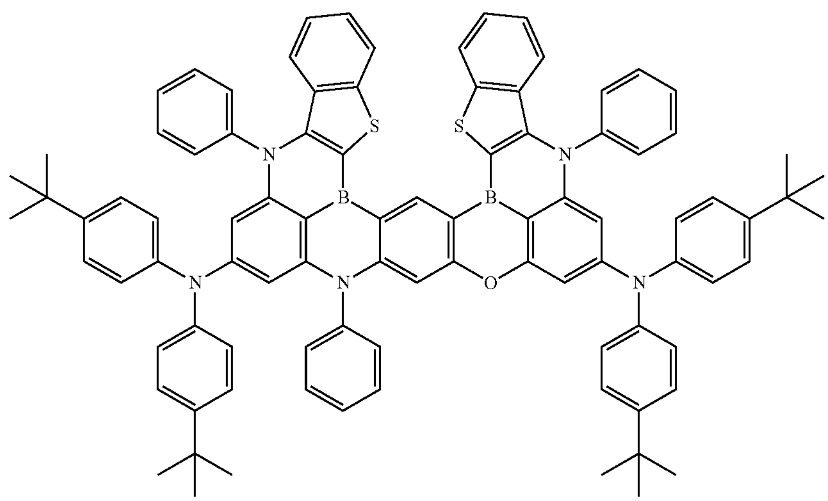
74
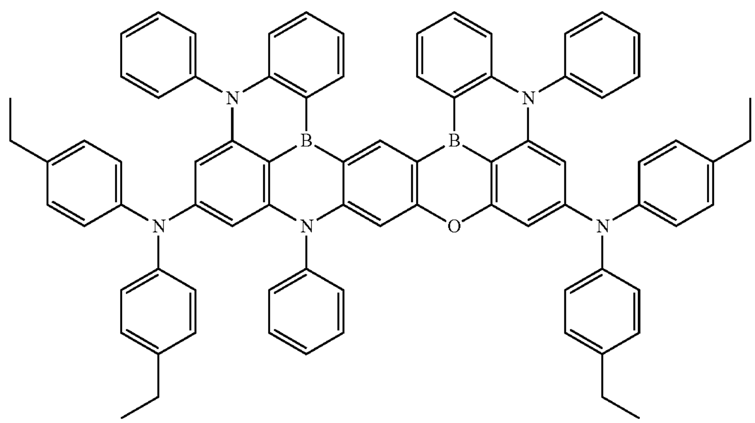

-continued
75
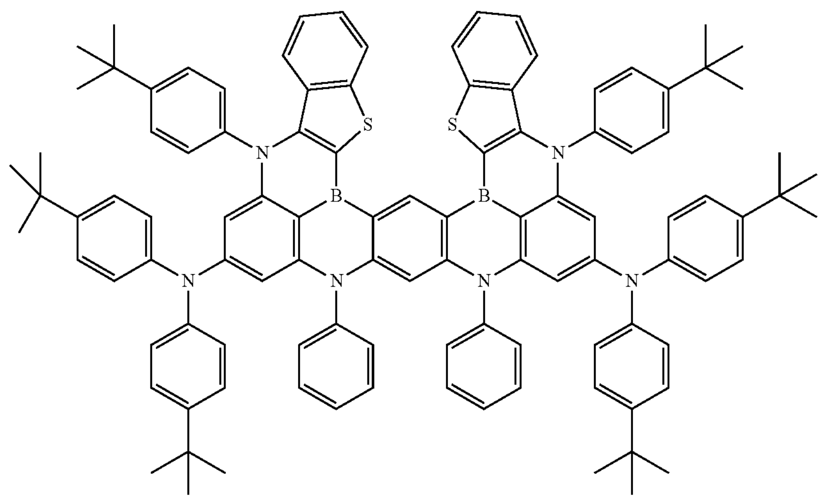
76
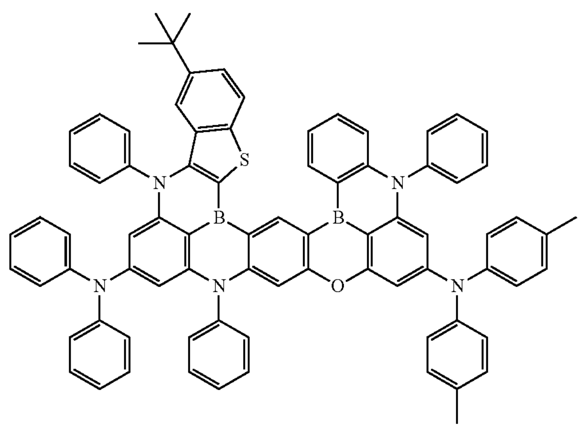
77
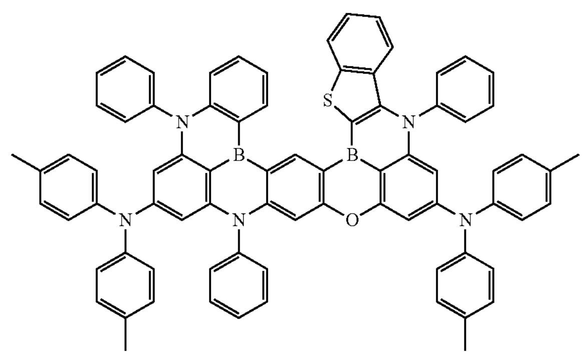
78
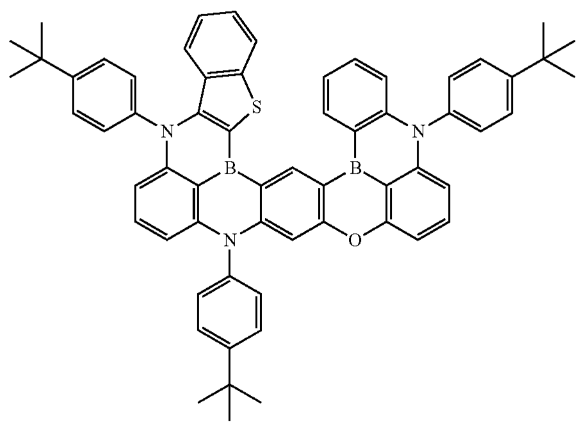
79
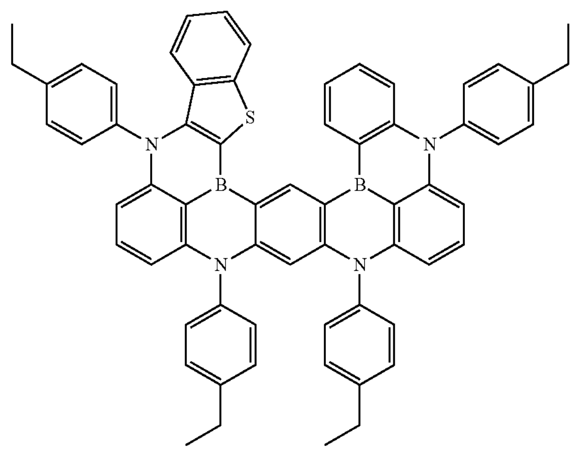

-continued
80
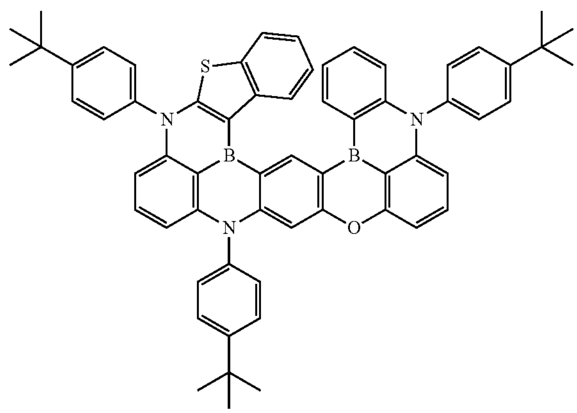
81
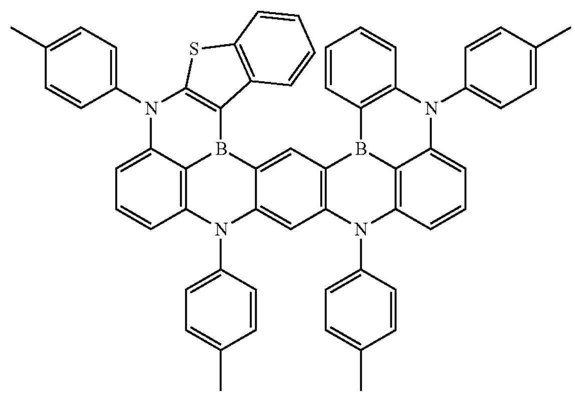
82
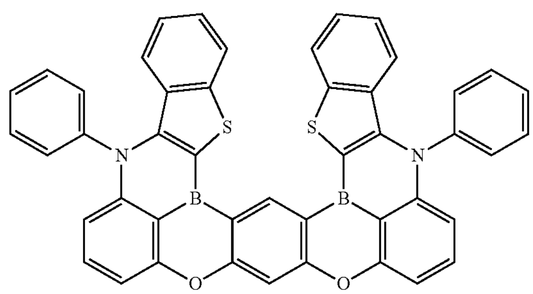
83
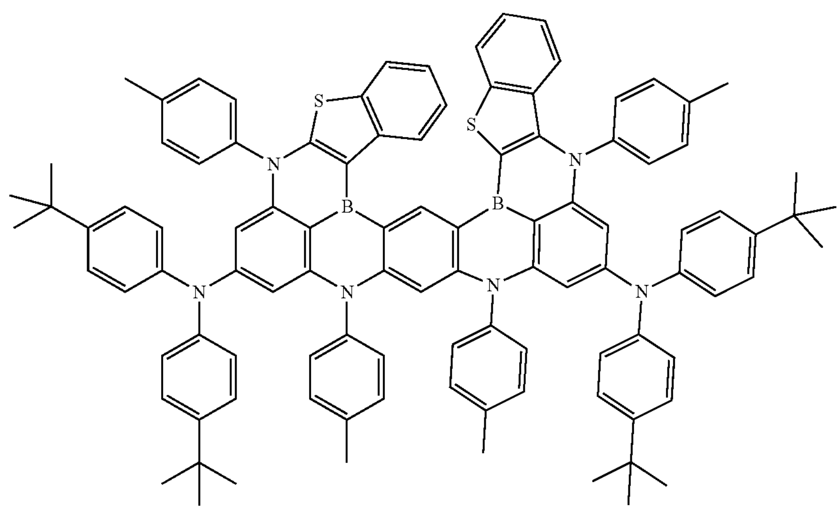

-continued
84
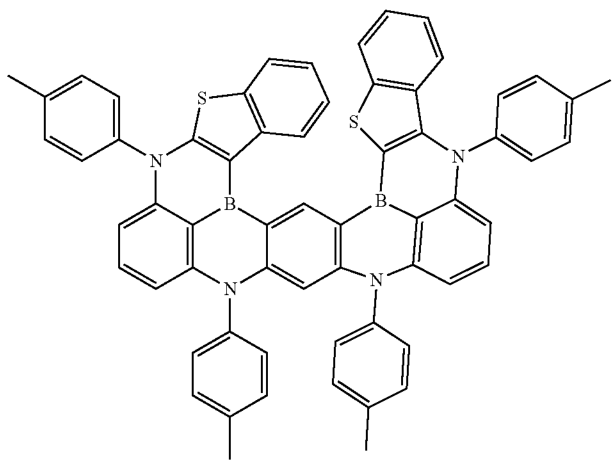
85
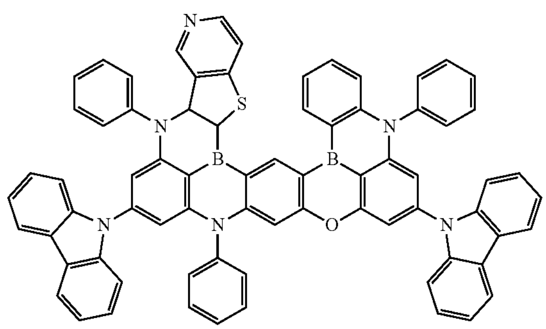
86
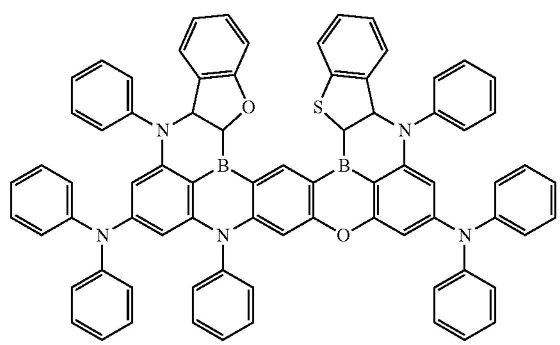
87
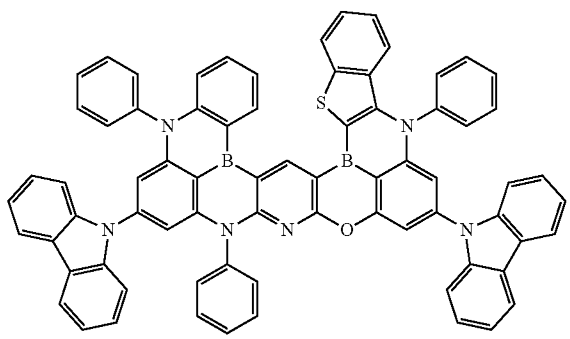
88
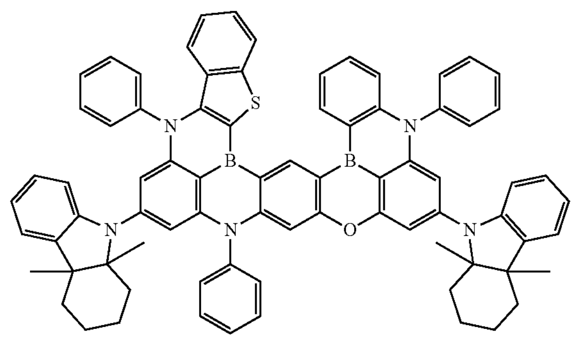
89
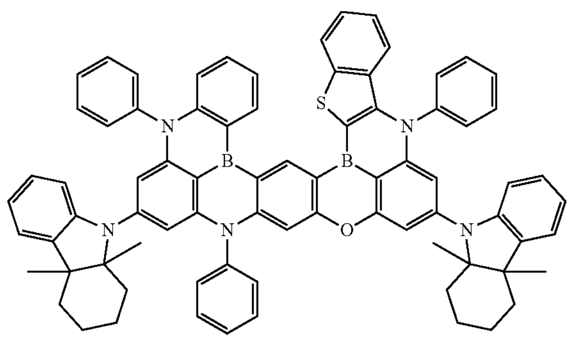
90
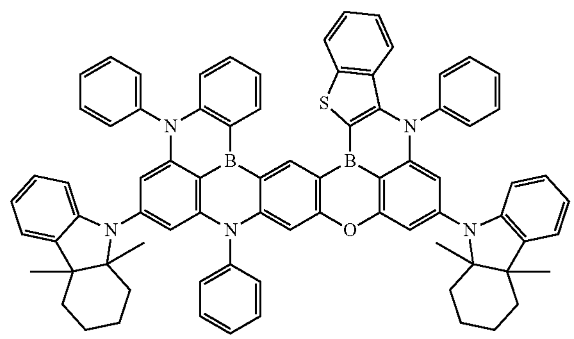

-continued
91
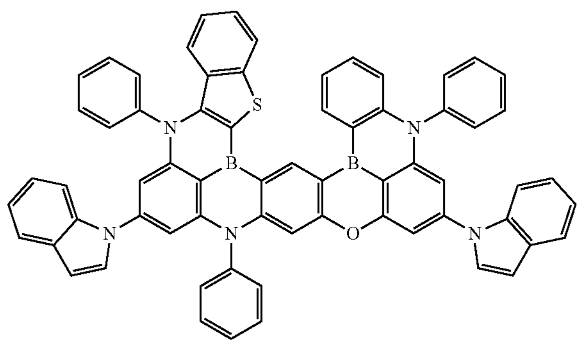
92
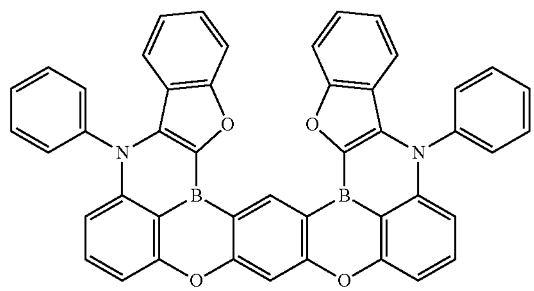
93
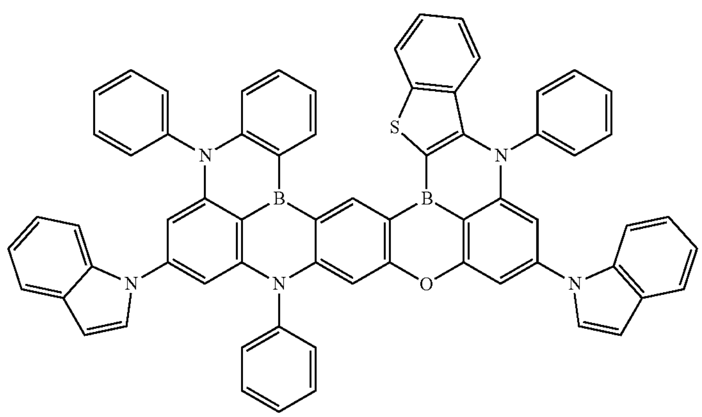
94
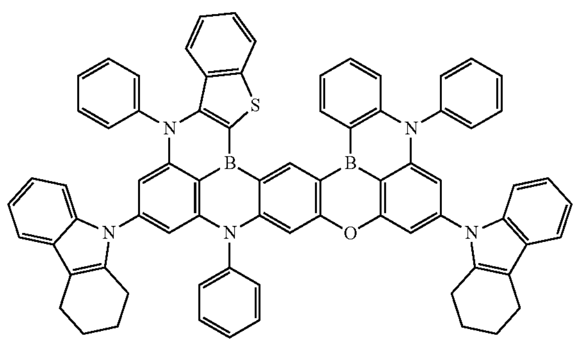
95
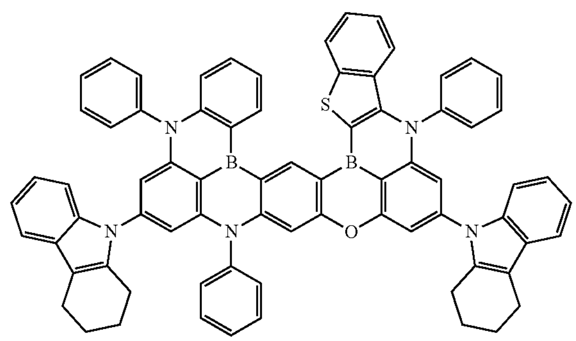
96
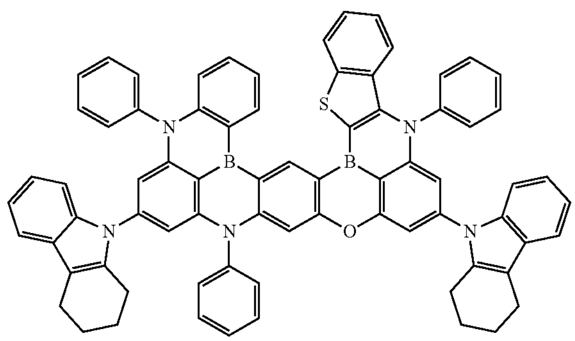
97
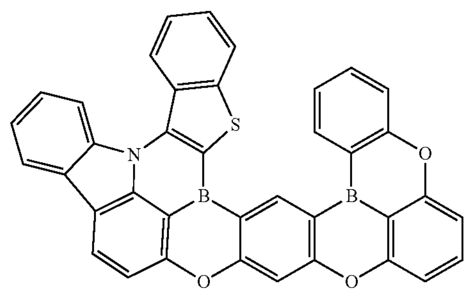

-continued
98
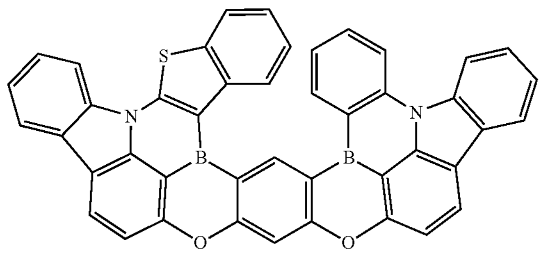
99
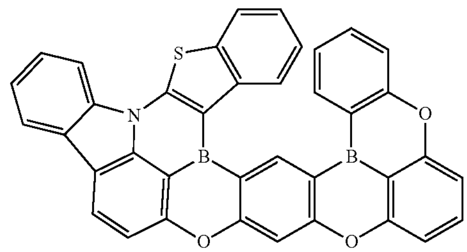
100
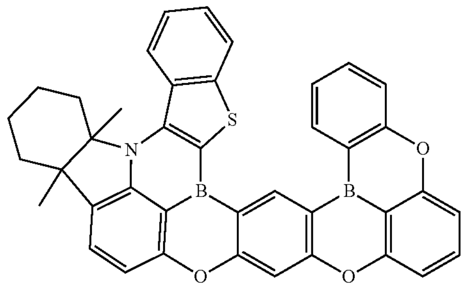
101
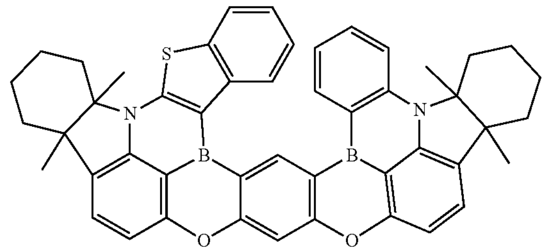
102
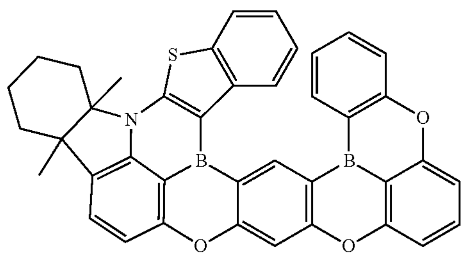
103
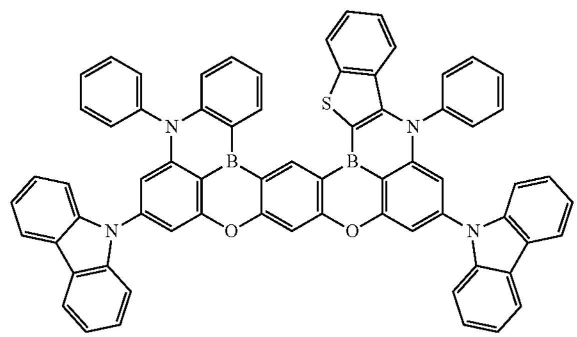
104
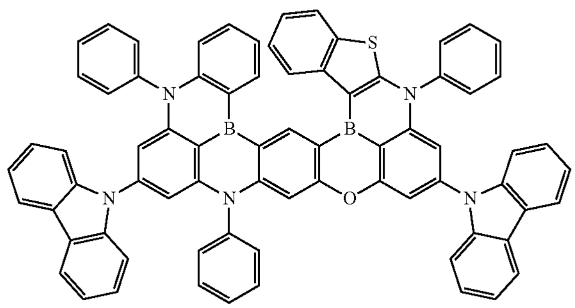
105
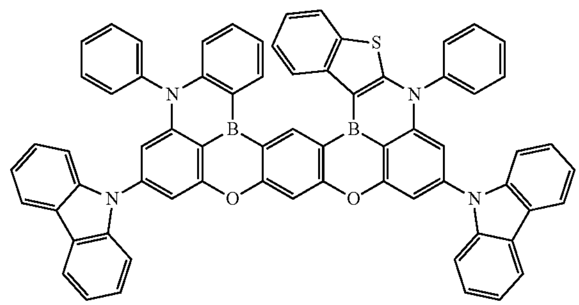
106
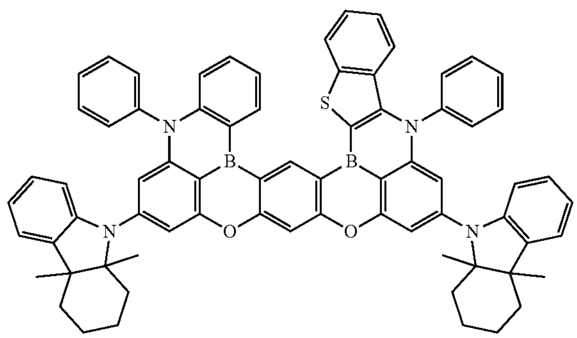
107
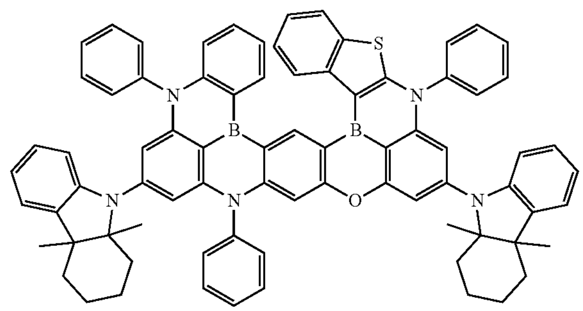

-continued
108
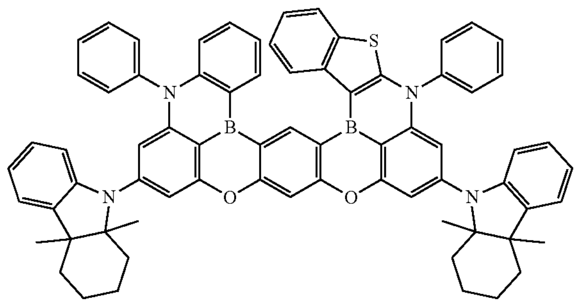
109
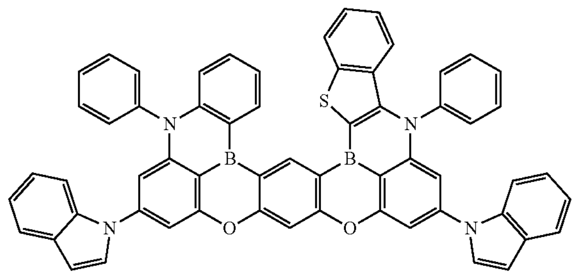
110
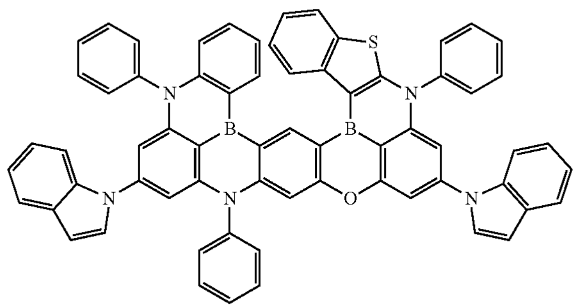
111
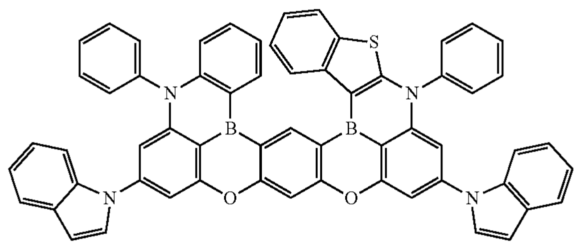
112
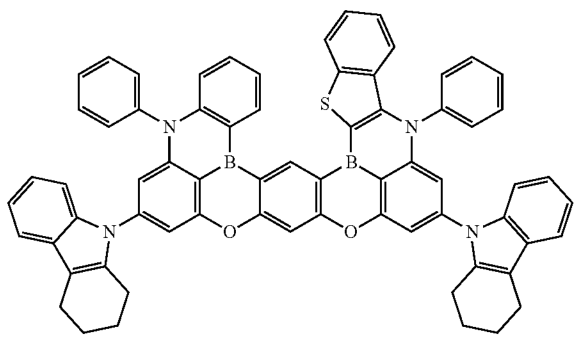
113
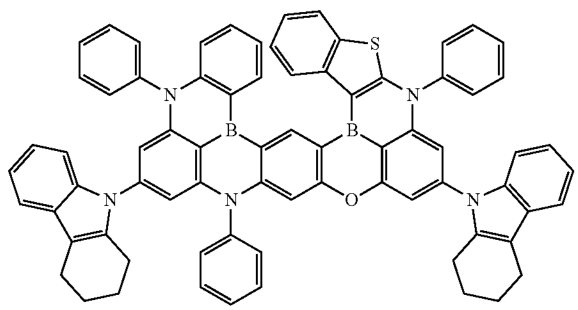
114
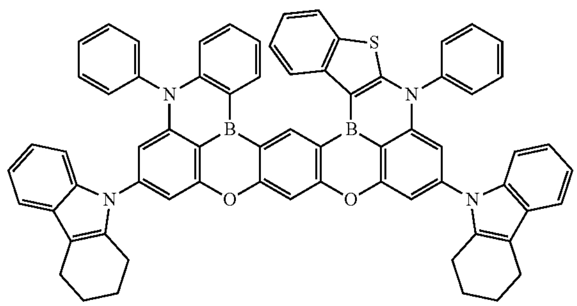
115
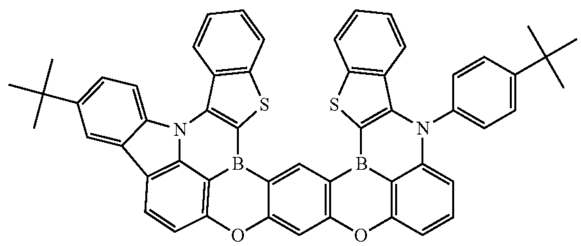

-continued
116
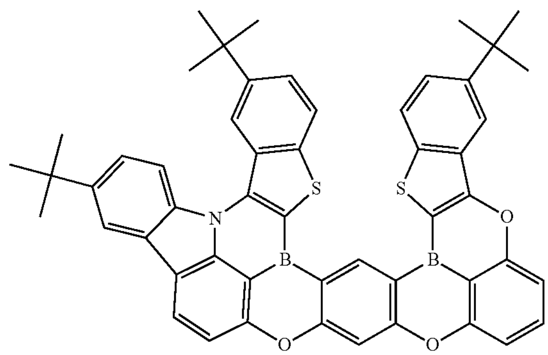
117
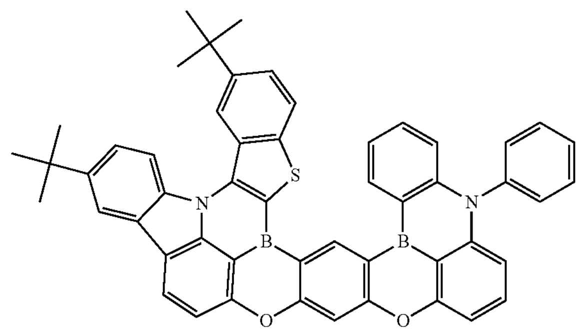
118
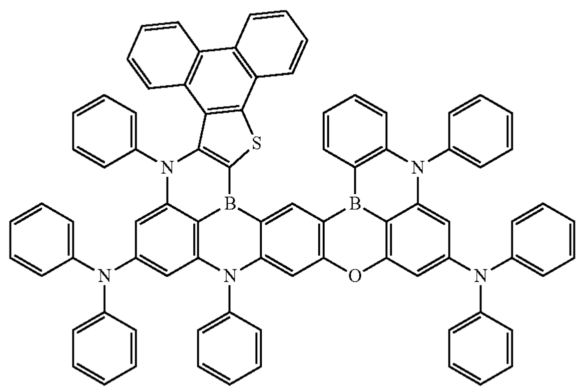
119
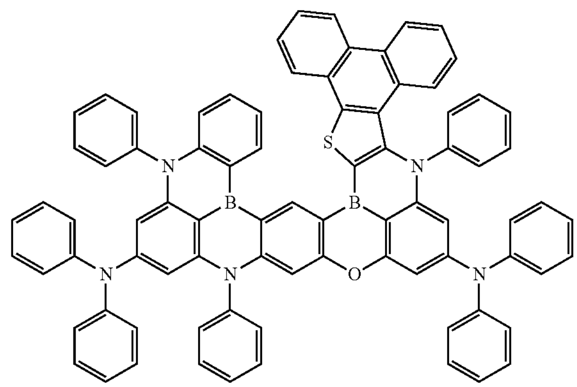
120
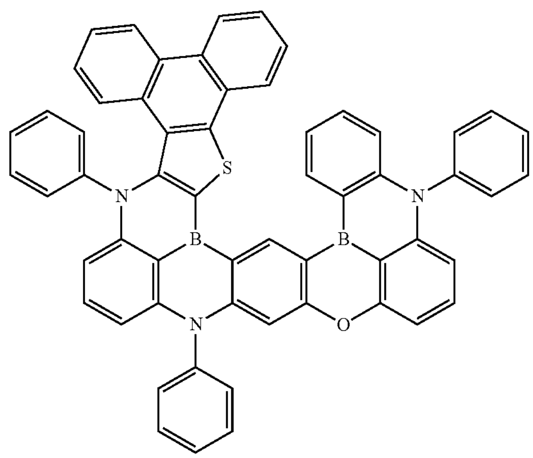
121
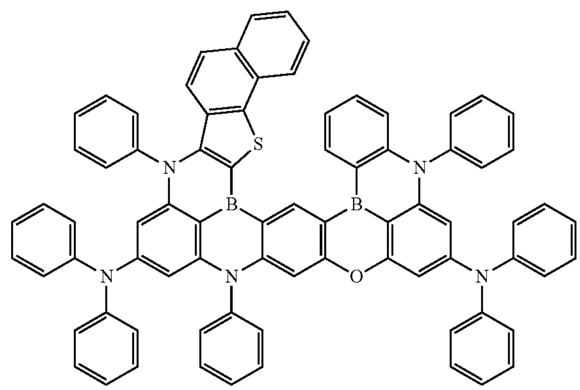

-continued
122
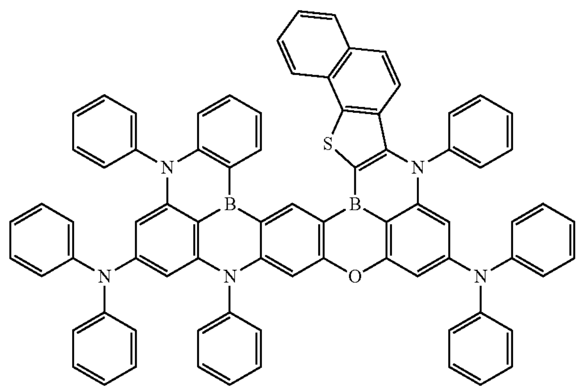
123
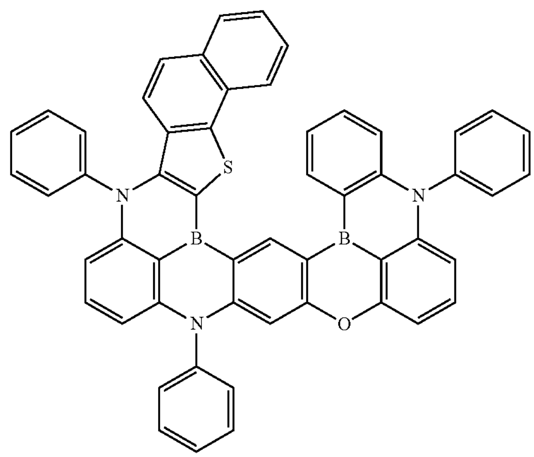
124
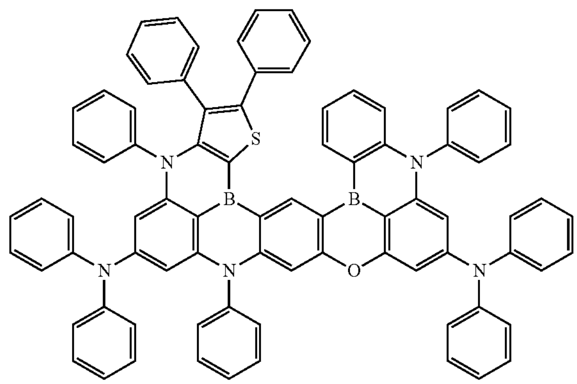
125
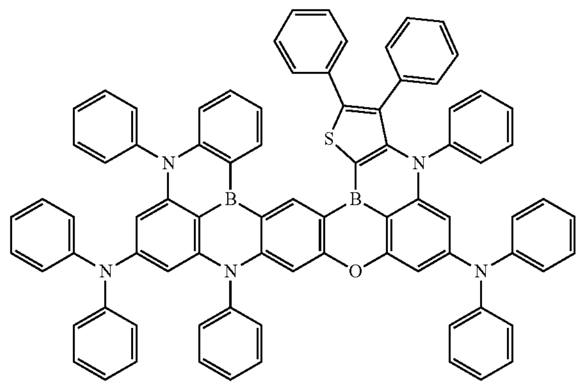
126
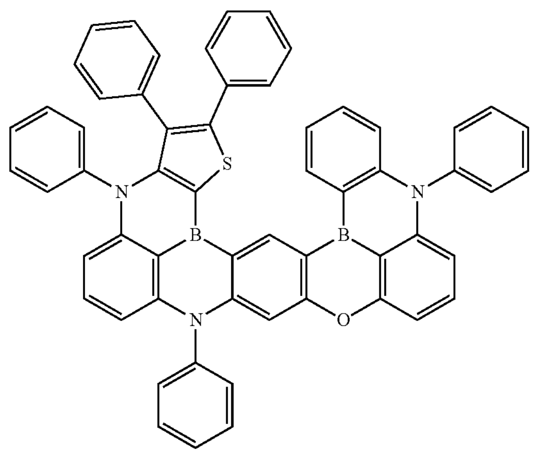
127
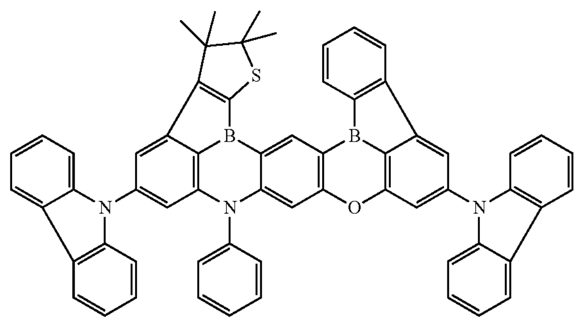

-continued
128
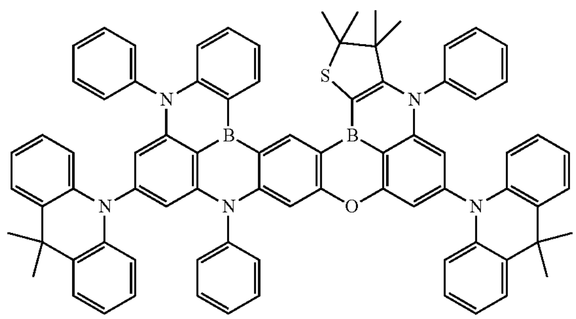
129
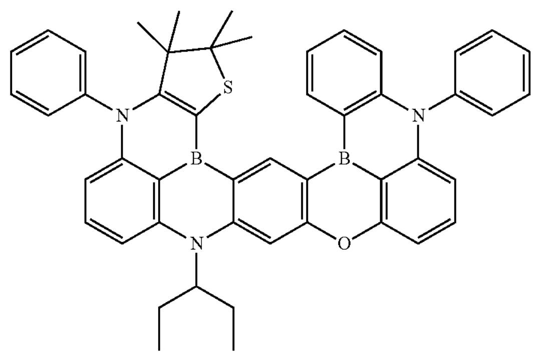
130
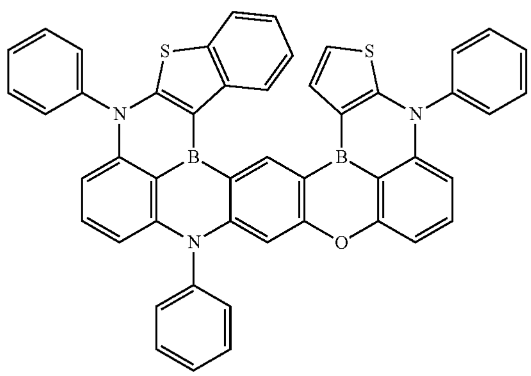
131
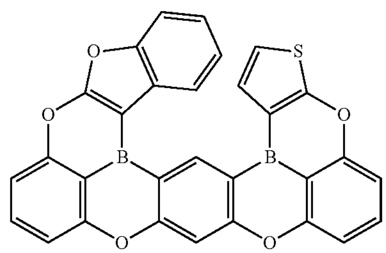
132
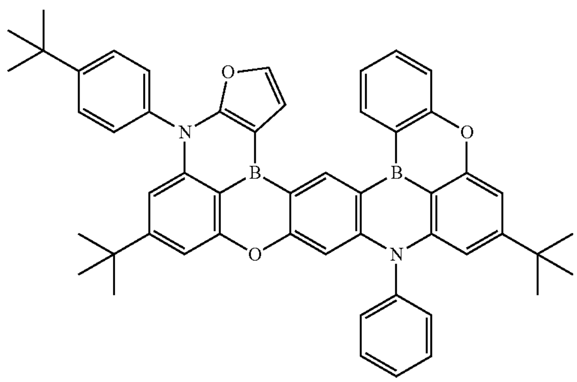
133
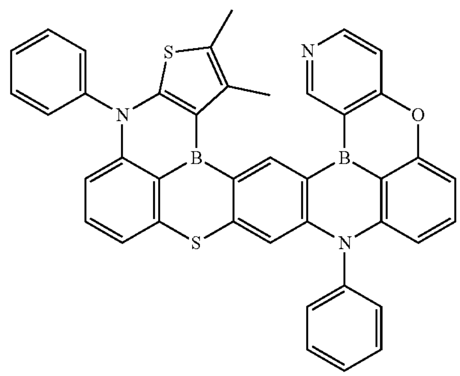
134
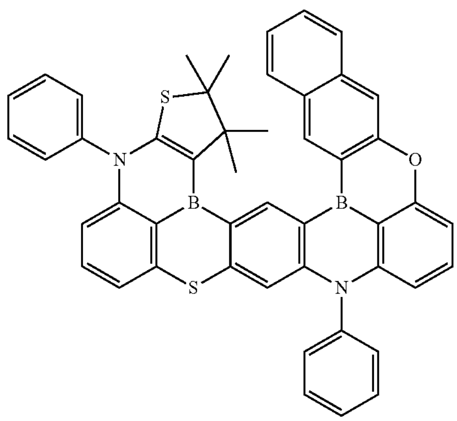
135
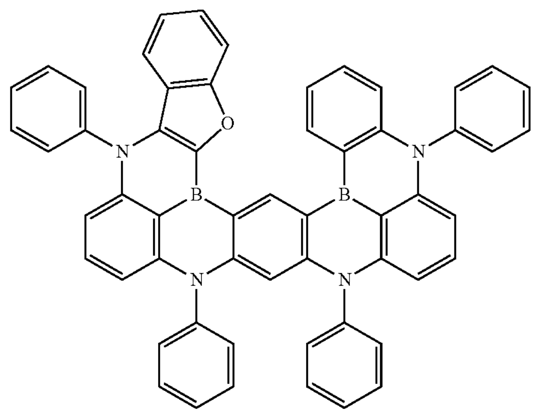

-continued
136
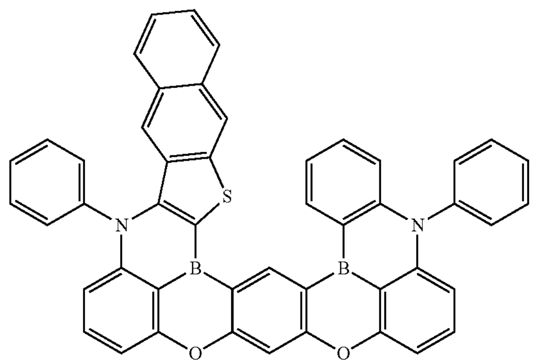
137
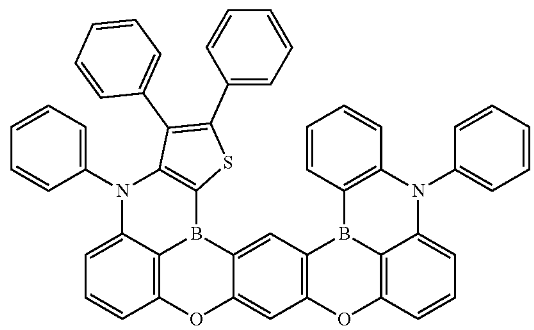
138
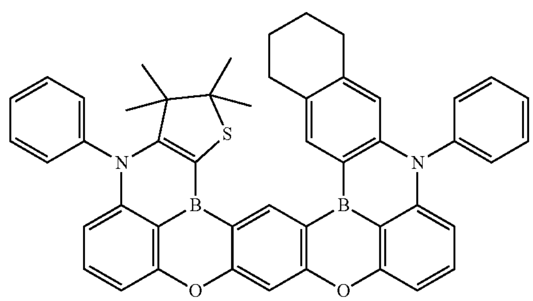
139
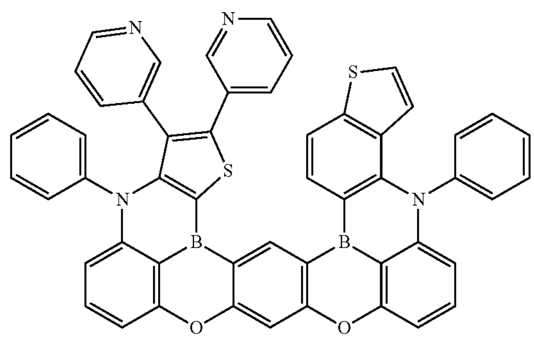
140
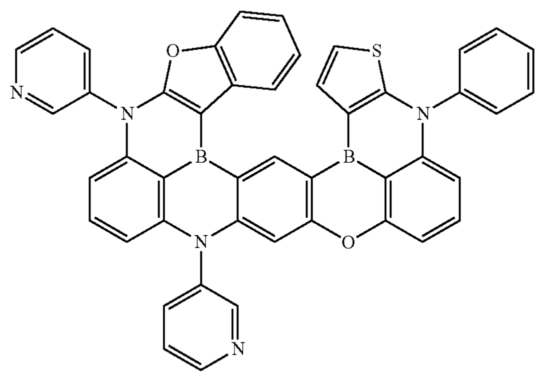
141
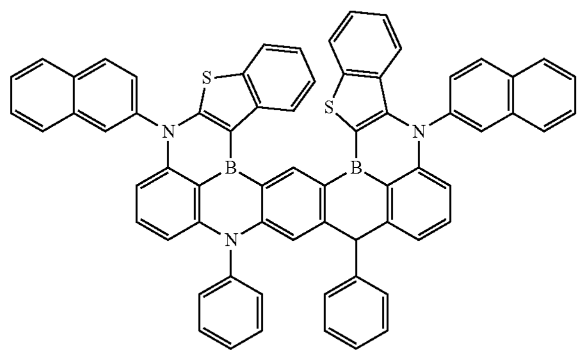
142
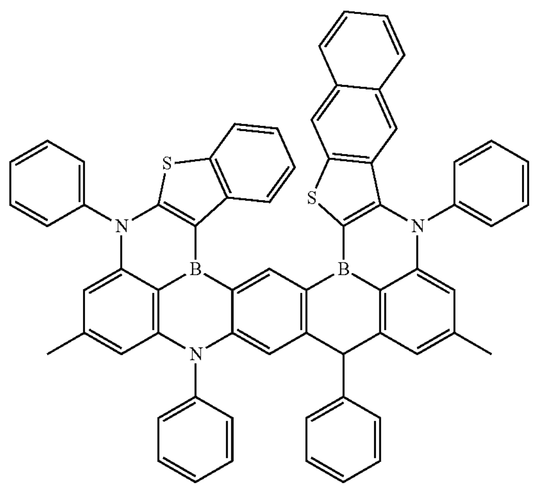
143
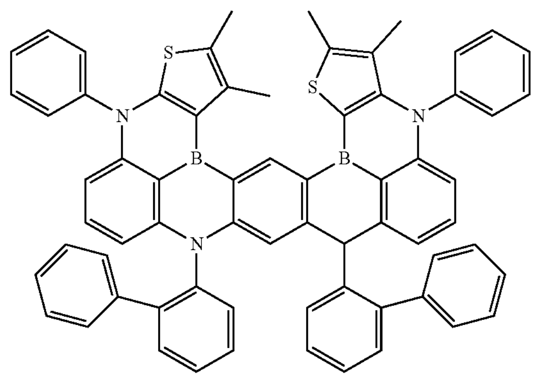

-continued
144
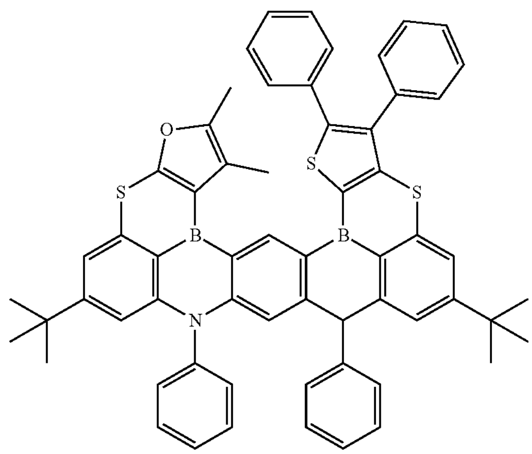
145
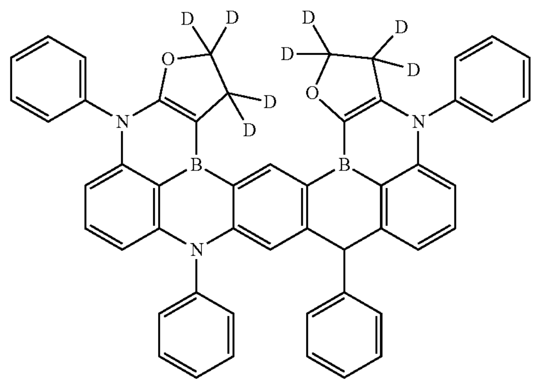
146
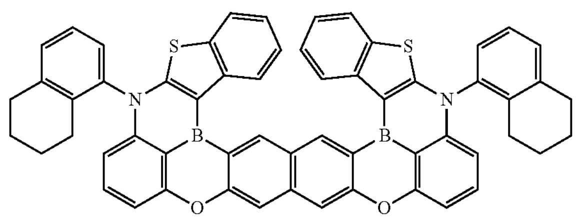
147
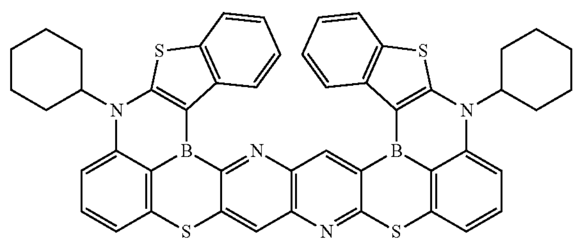
148
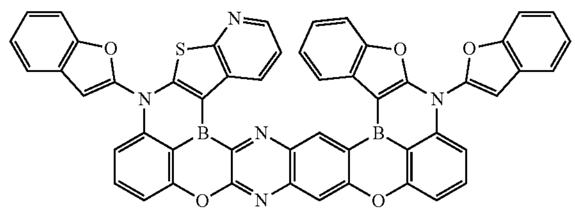
149
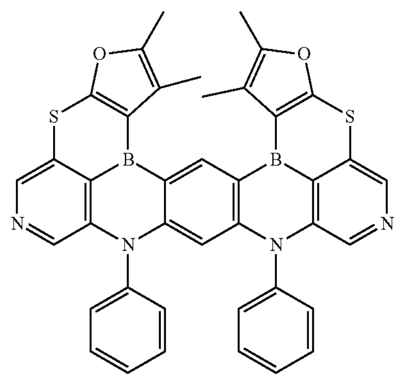
150
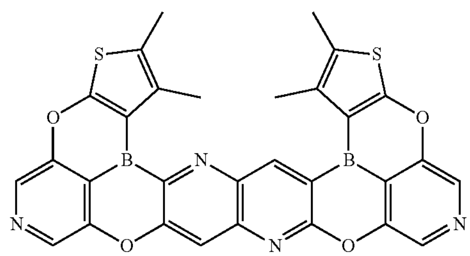
151
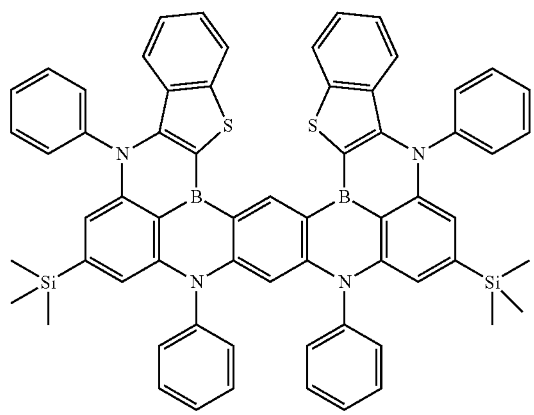

-continued
152
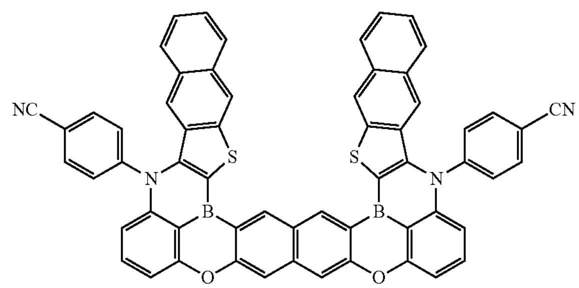
153
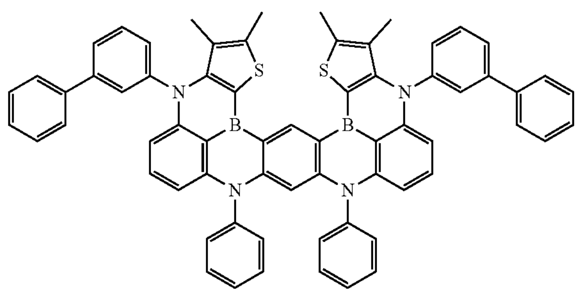
154
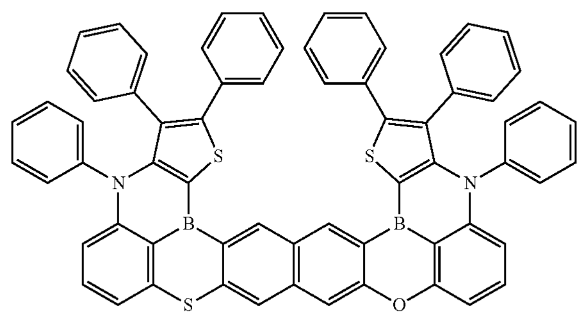
155
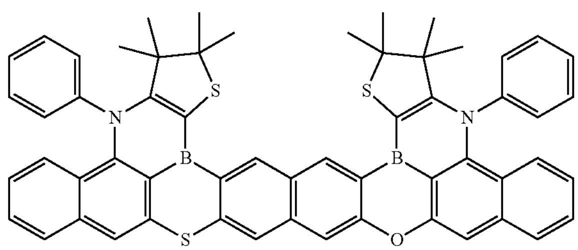
156
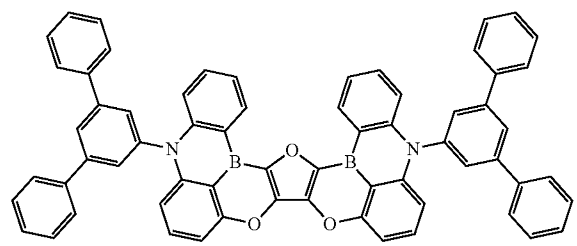
157
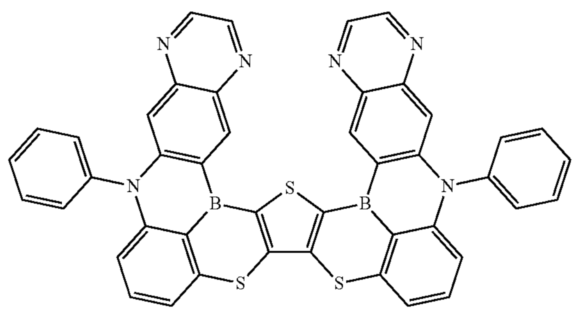
158
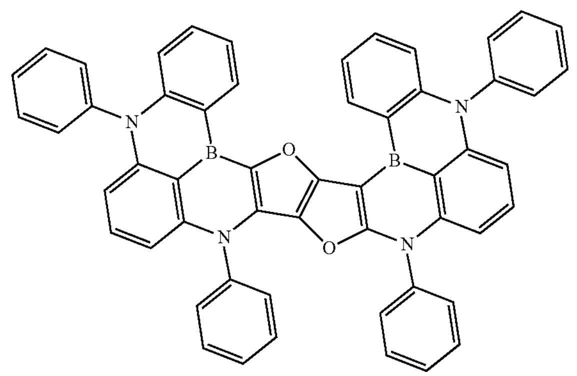
159
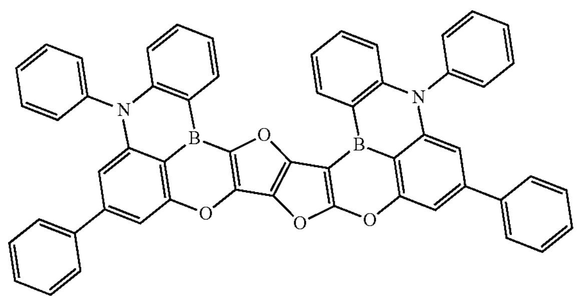

-continued
160
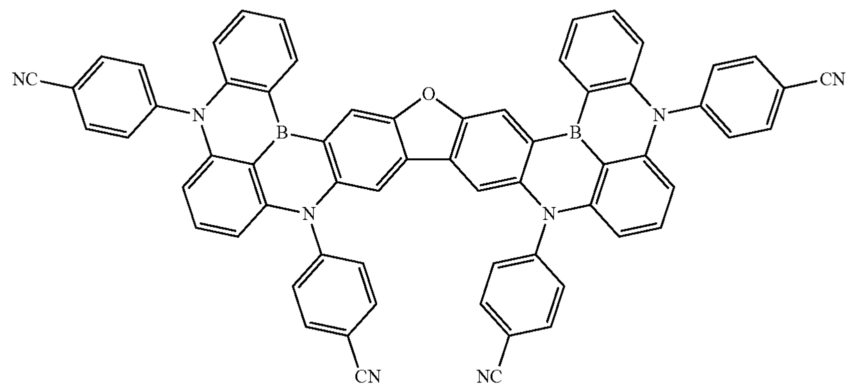
161
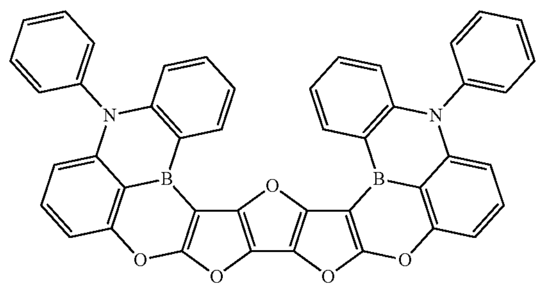
162
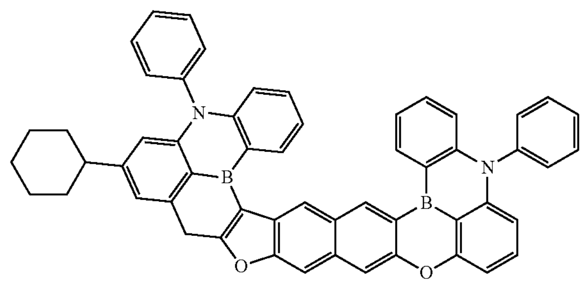
163
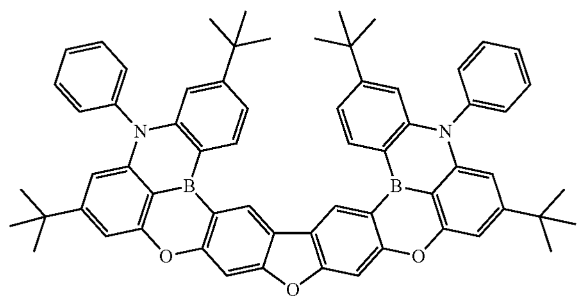
164
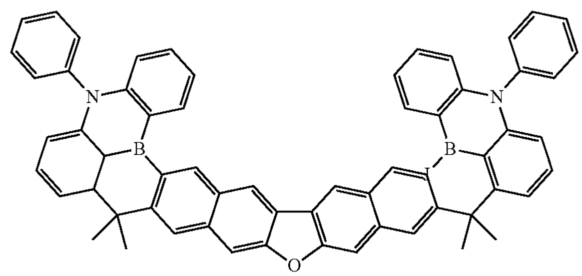
165
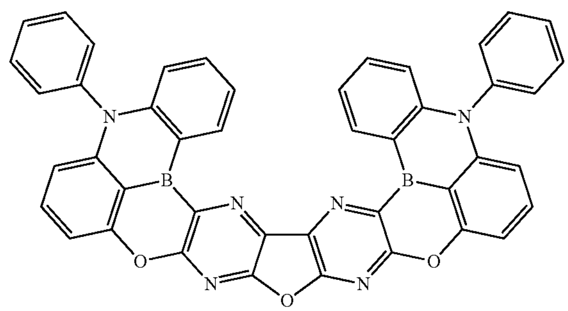
166
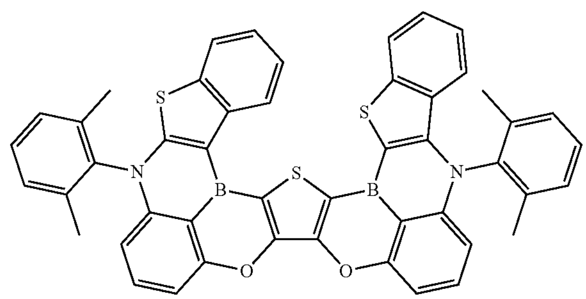

-continued
167
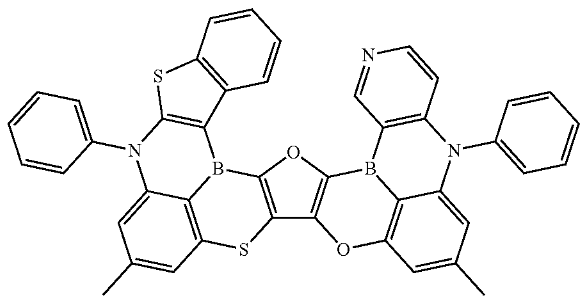
168
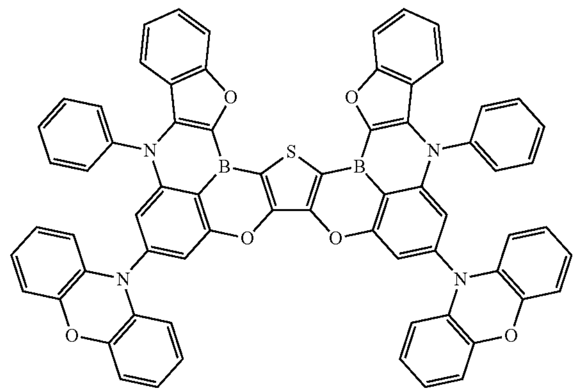
169
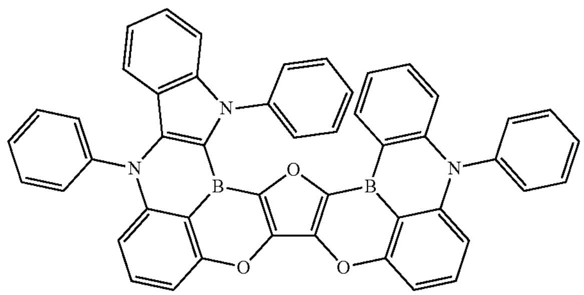
170
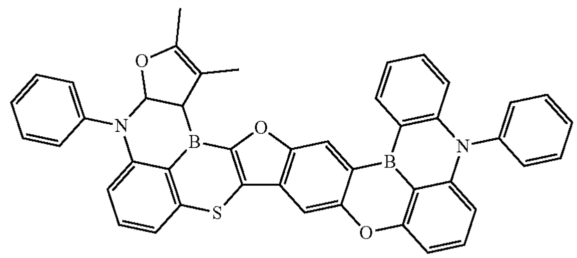
171
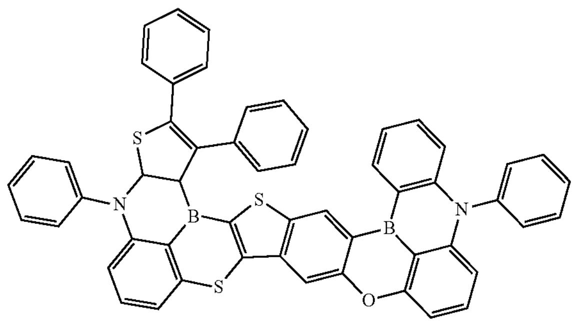
172
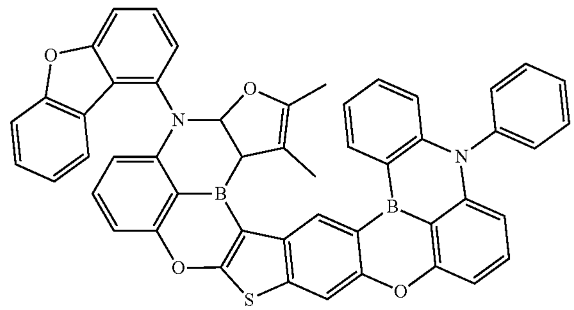
173
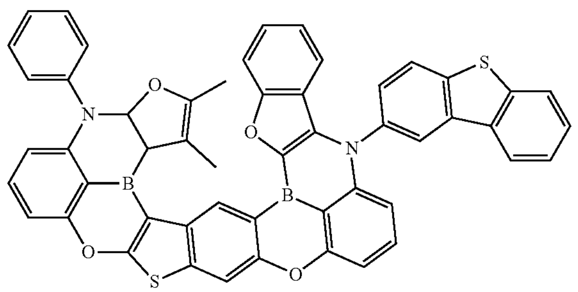
174
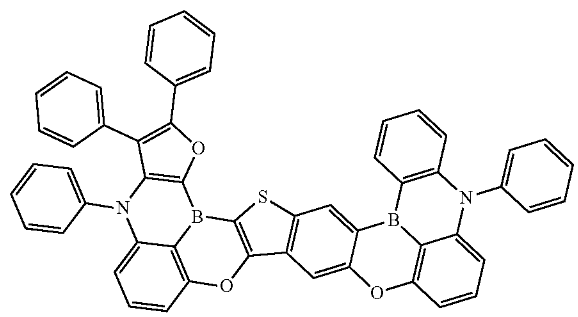

-continued
175
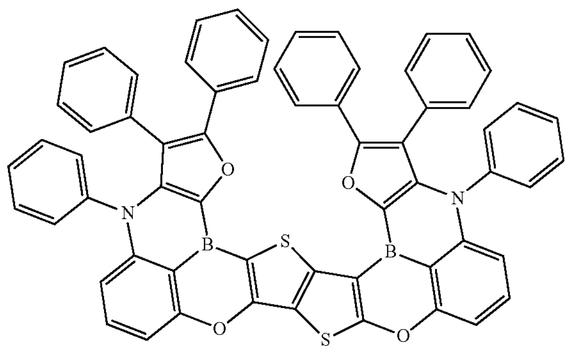
176
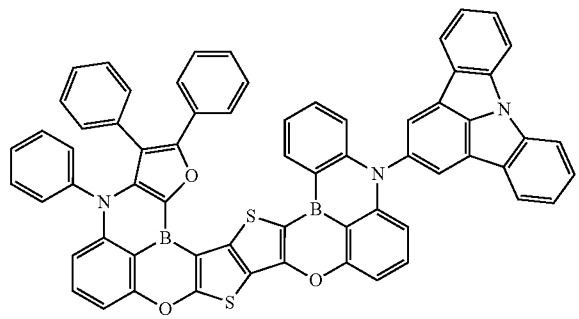
177
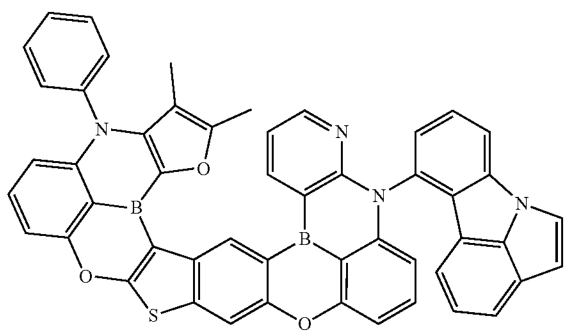
178
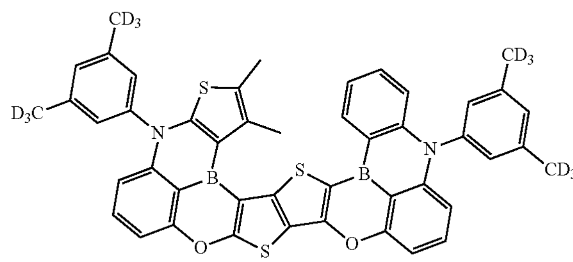
179
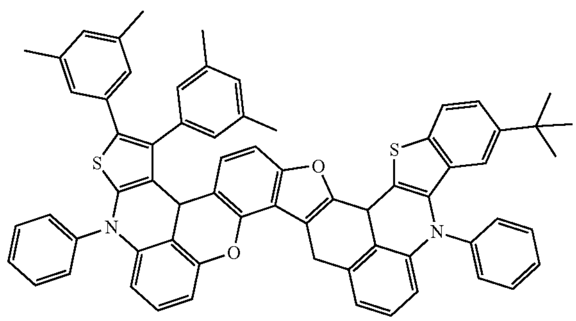
180
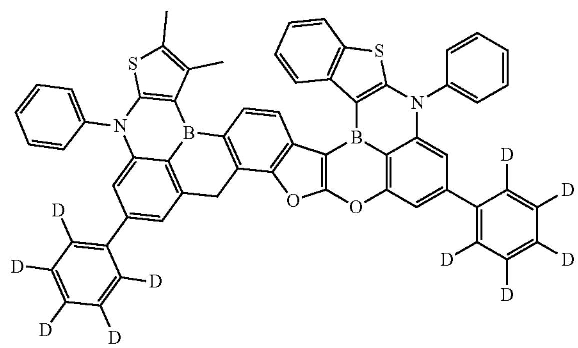
181
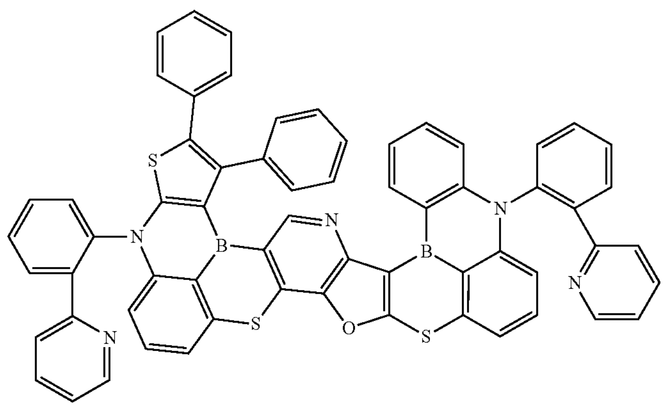

-continued
182
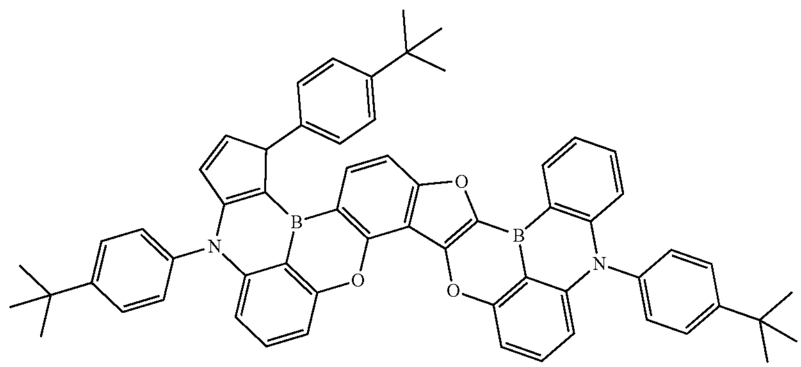
183
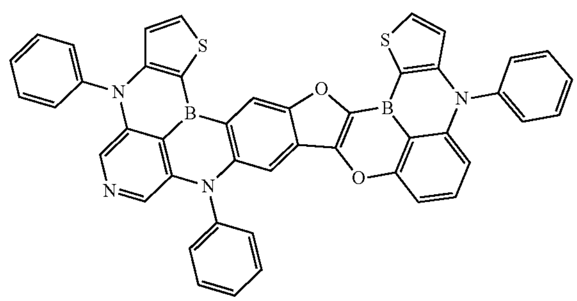
184
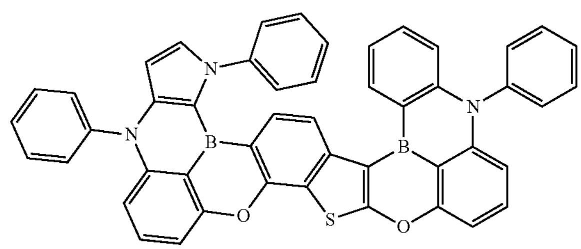
185
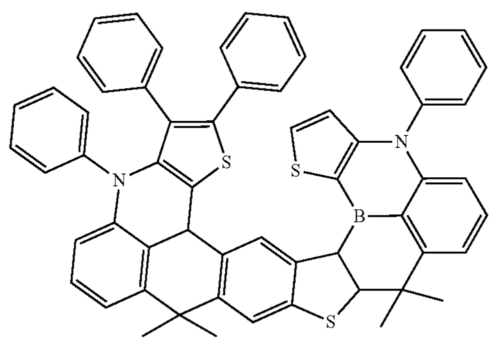
186
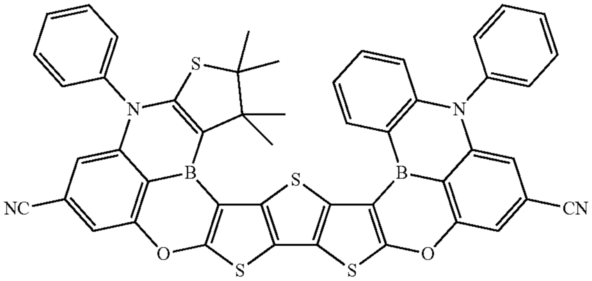
187
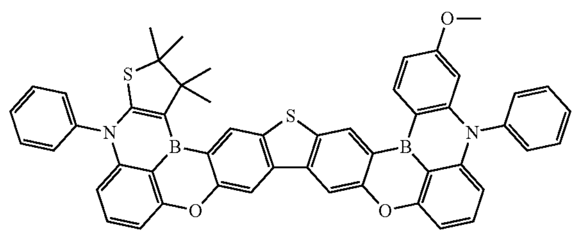
188
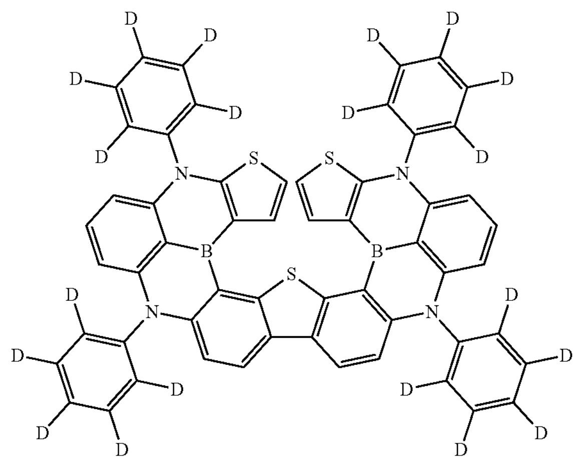

-continued
189
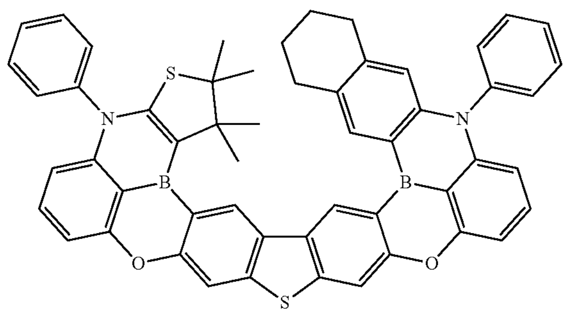
190
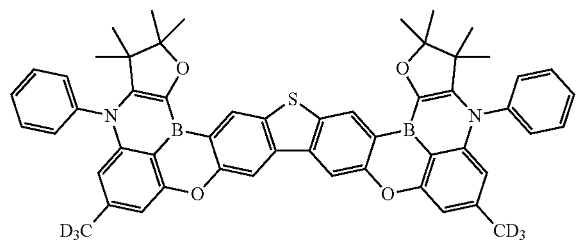
191
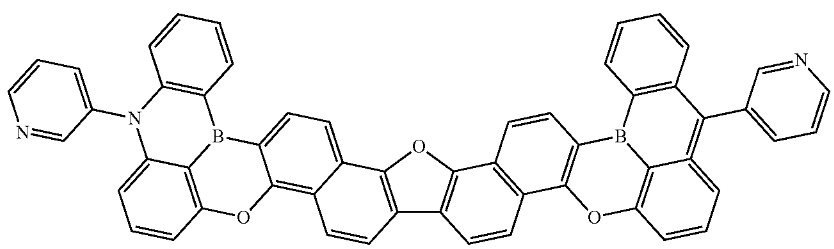
192
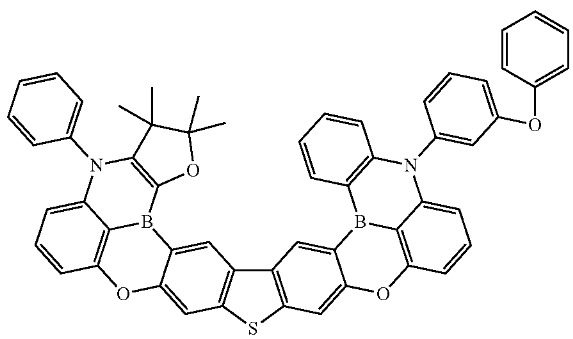
193
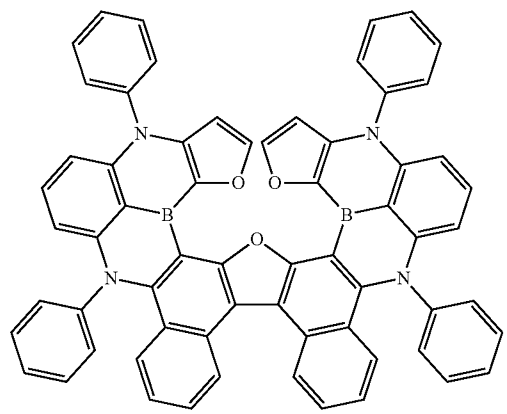
194
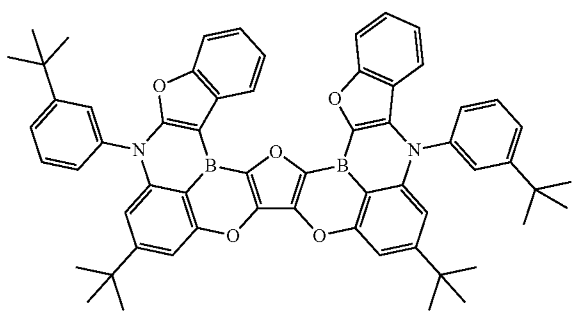
195
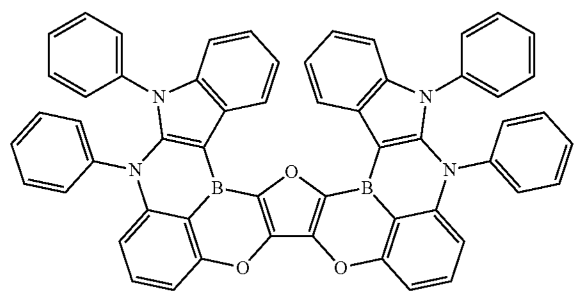

196
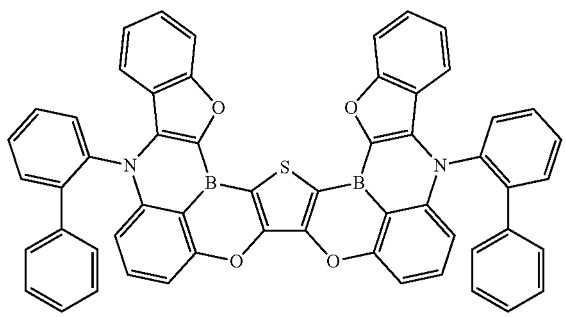
197
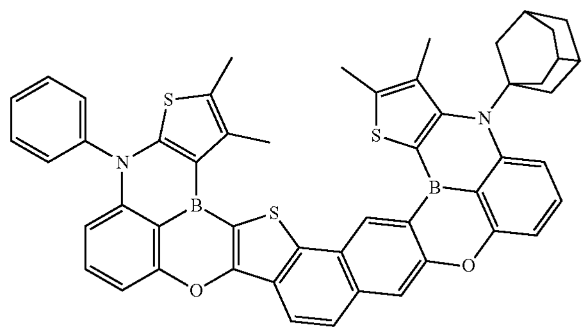
198
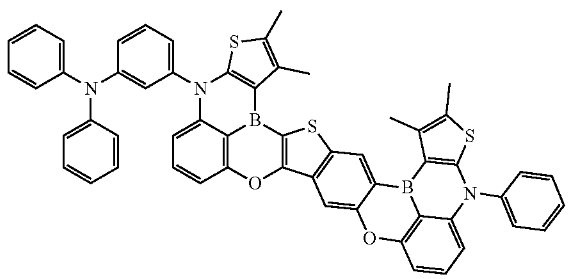
199
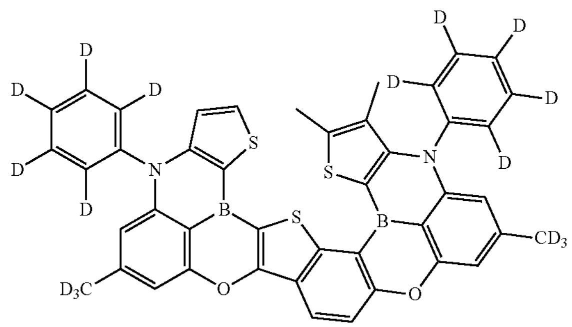
200
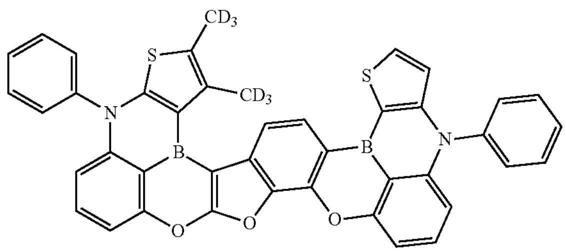
201
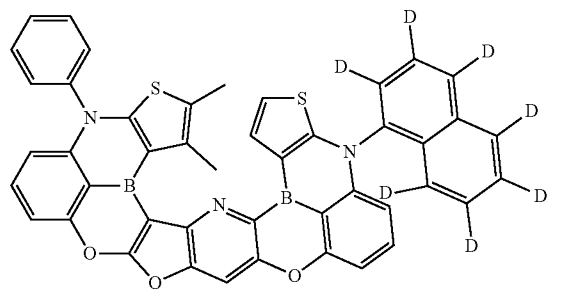
202
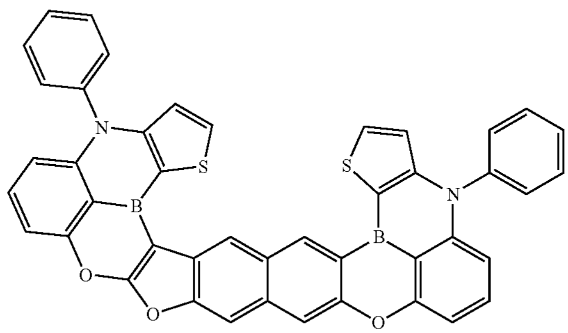
203
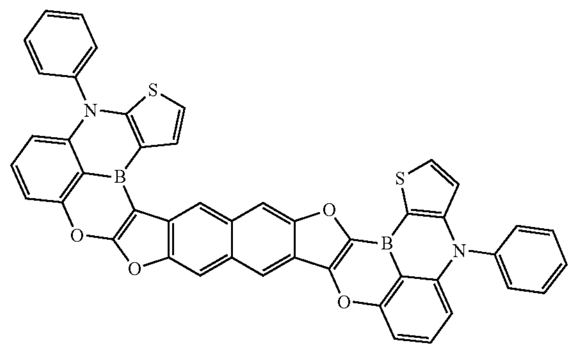

-continued
204
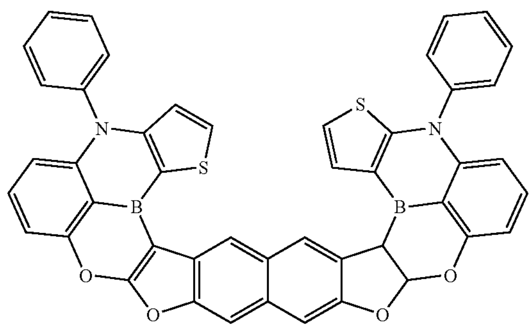
205
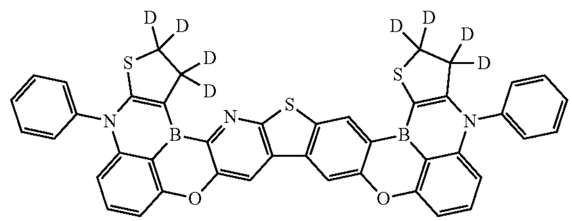
206
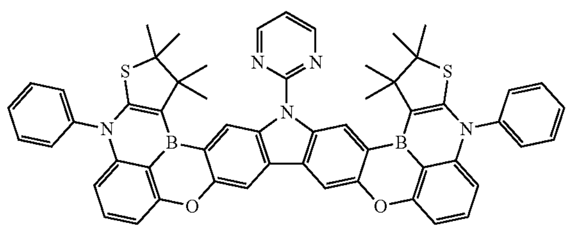
207
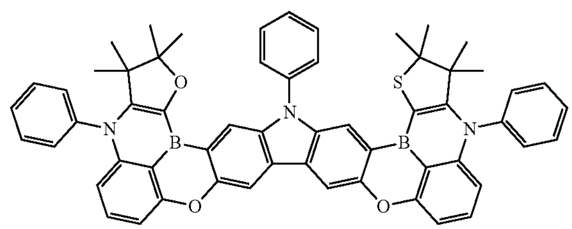
208
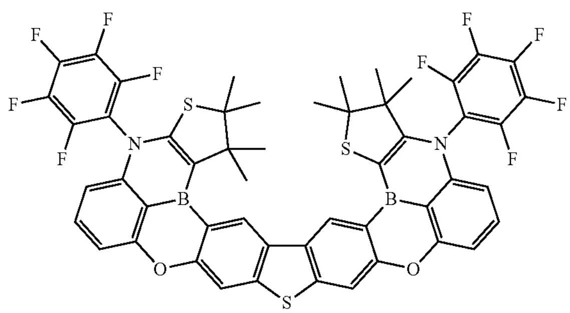
209
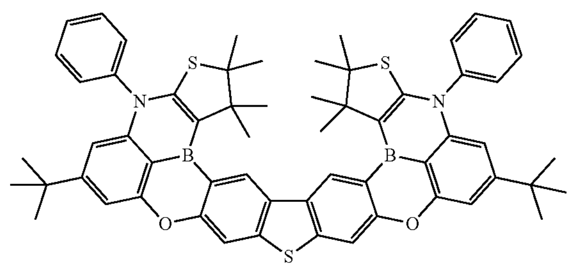
210
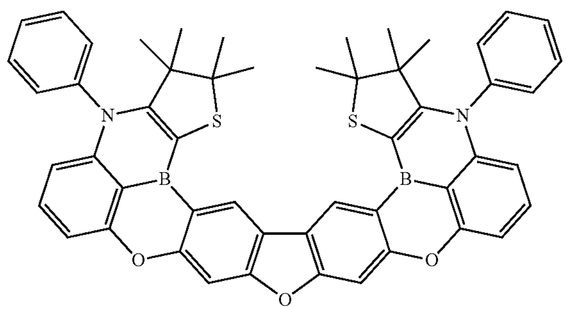

-continued
211
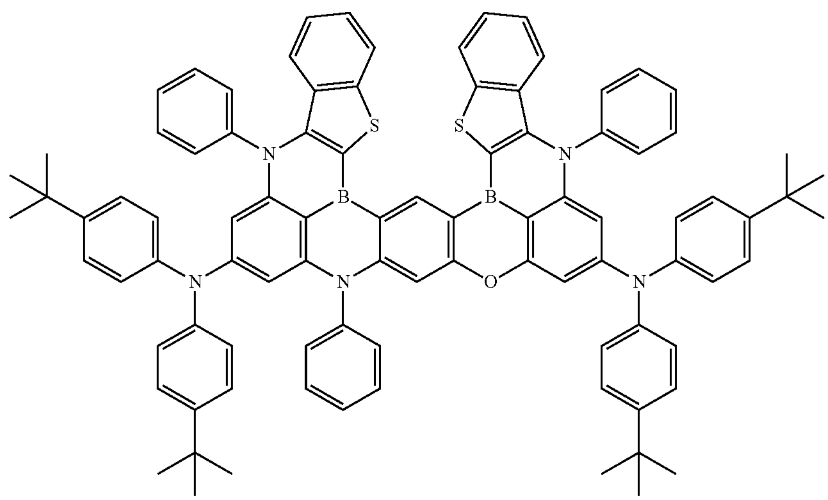
212
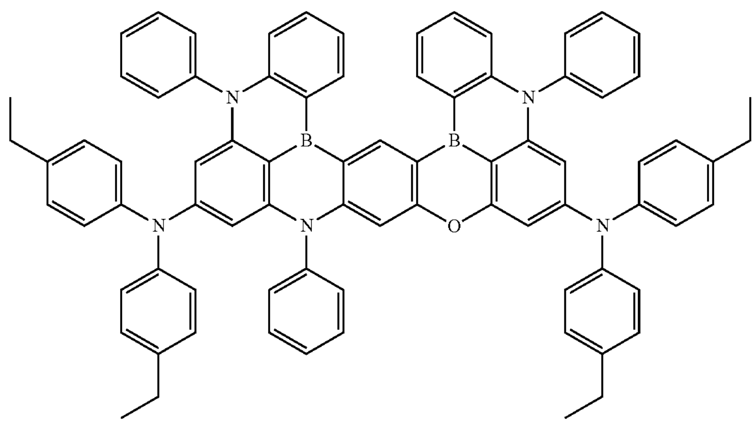
213
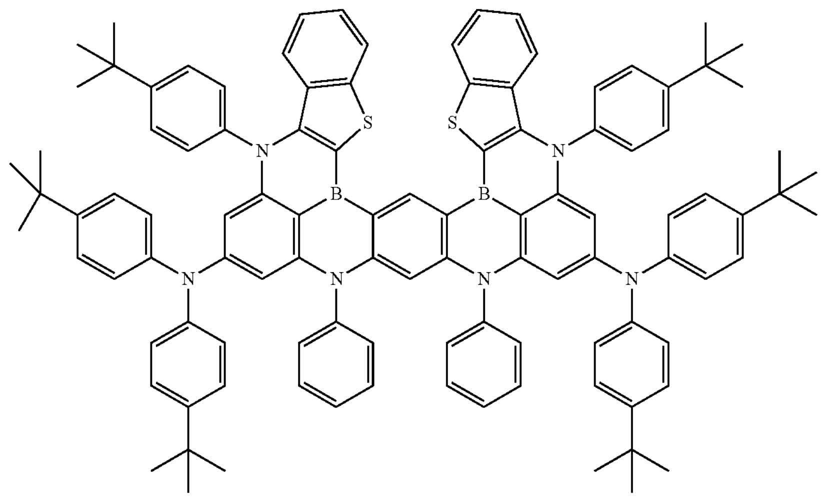

-continued
214
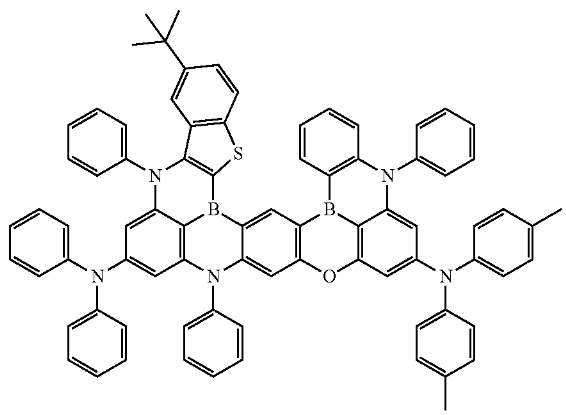
215
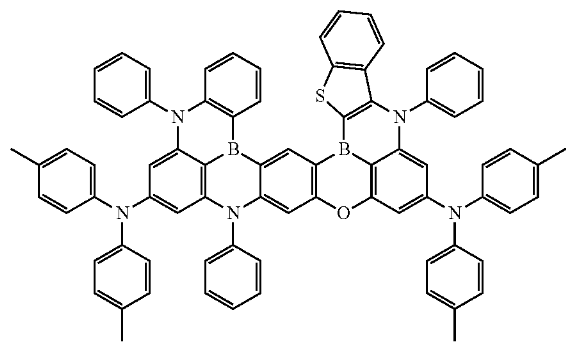
216
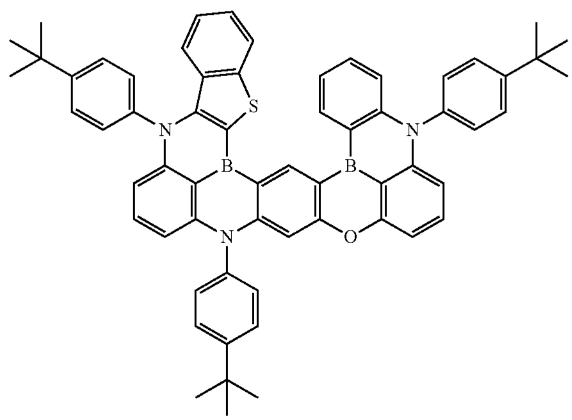
217
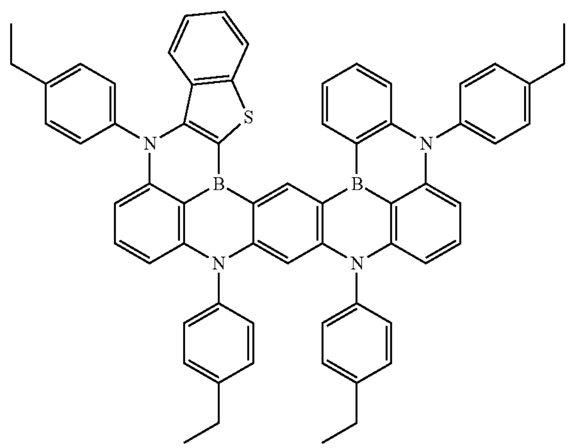
218
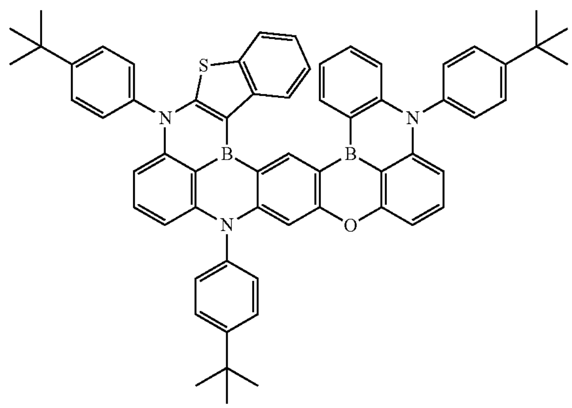
219
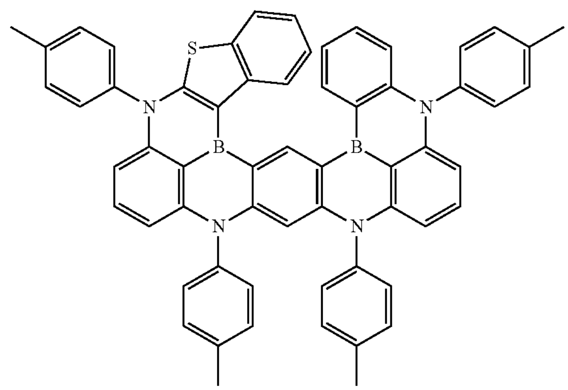
220
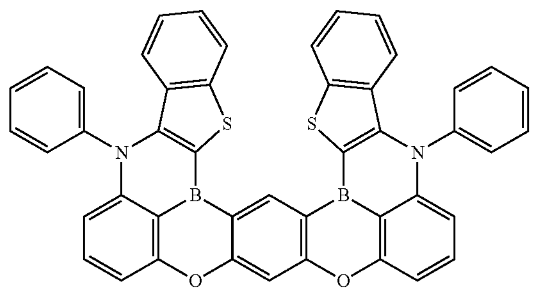

-continued
221
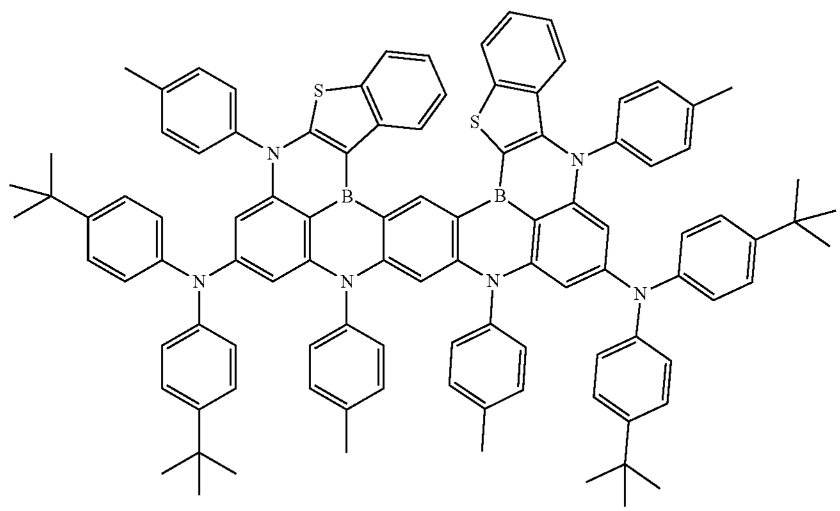
222
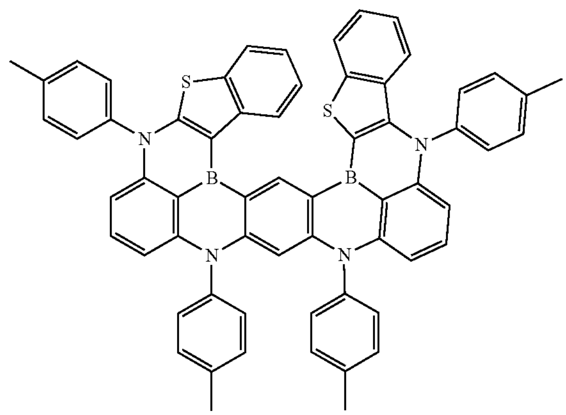
223
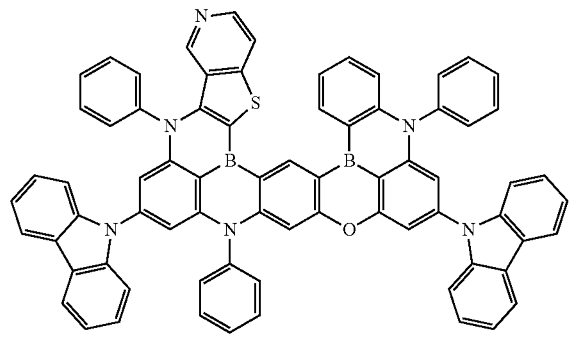
224
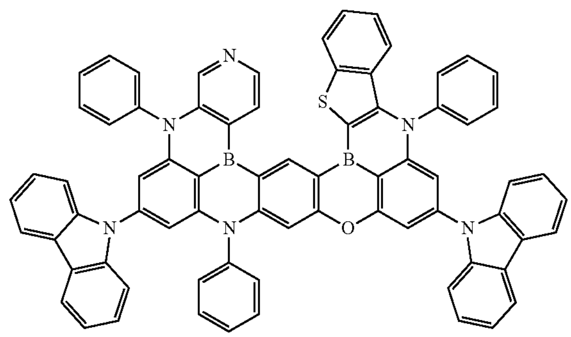
225
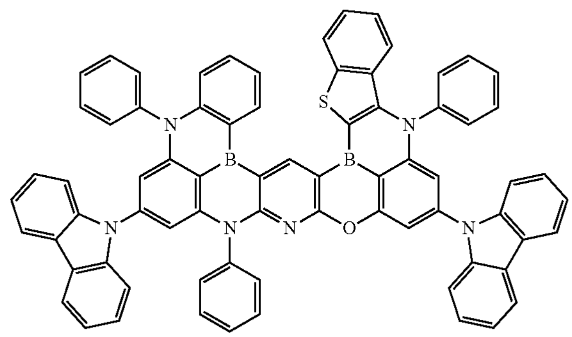
226
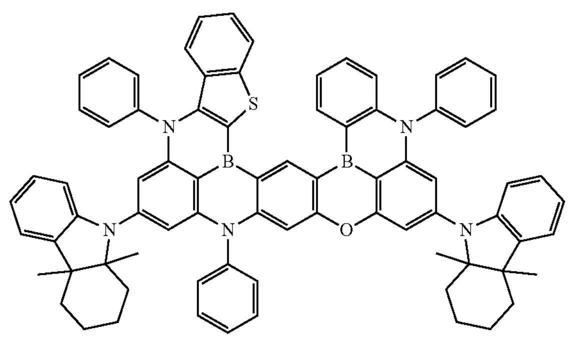
227
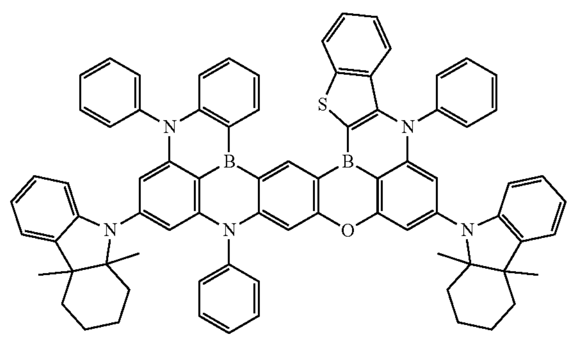

-continued
228
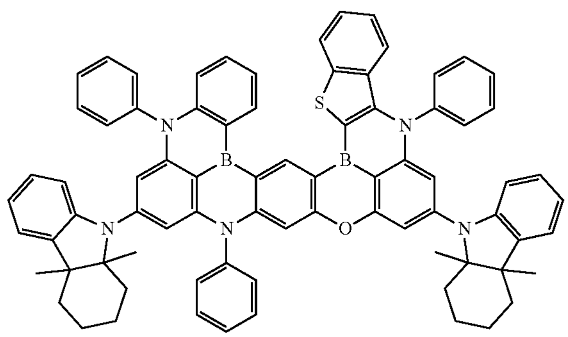
229
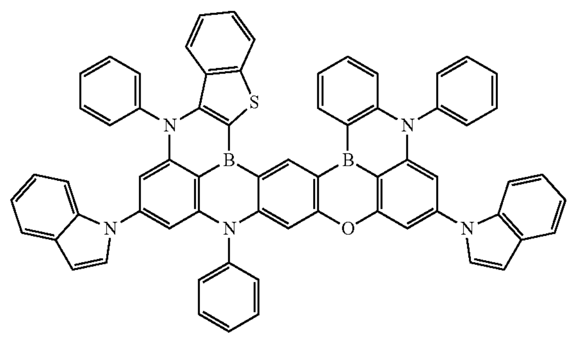
230
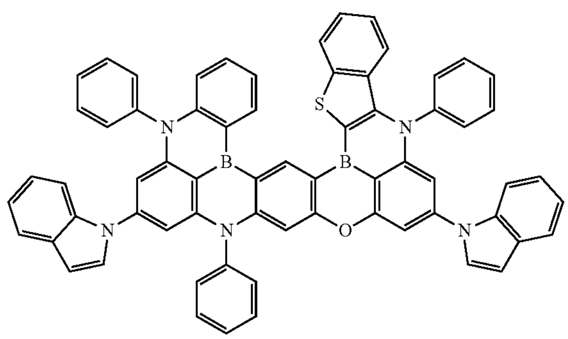
231
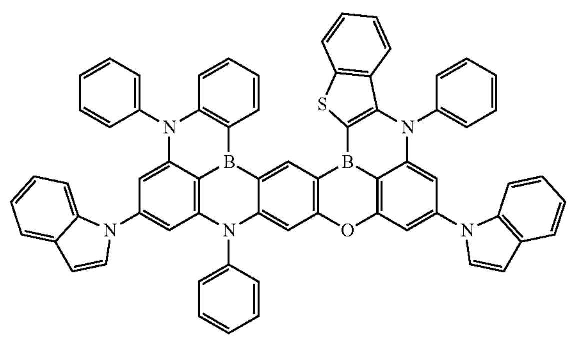
232
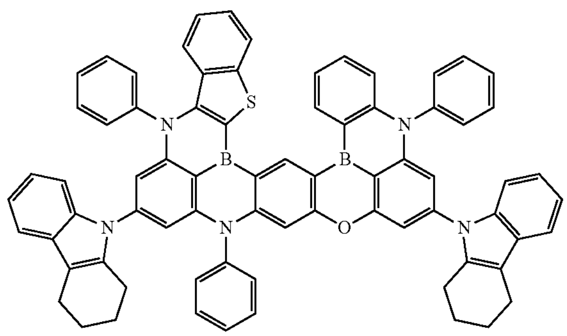
233
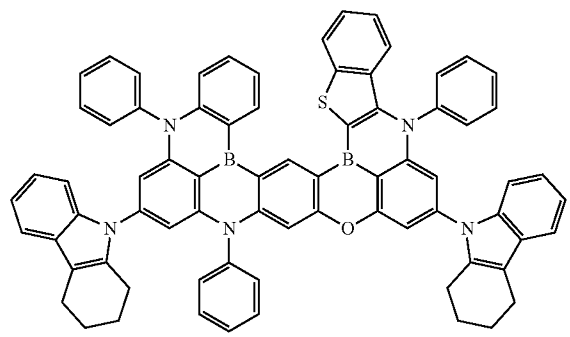
234
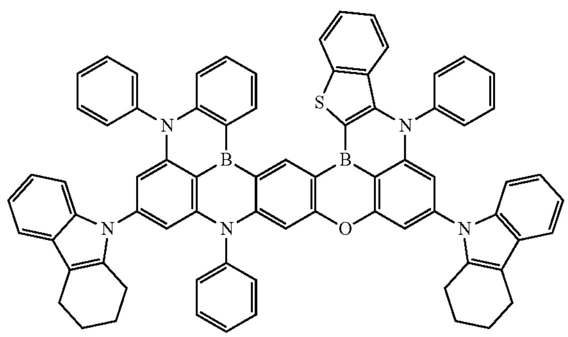
235
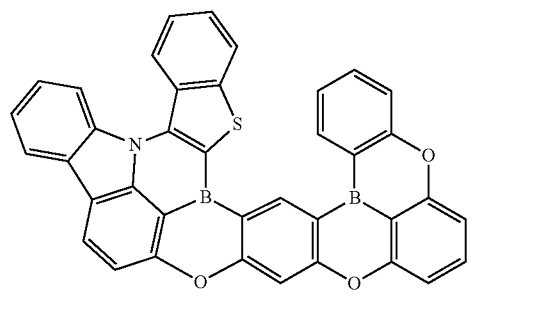

-continued
236
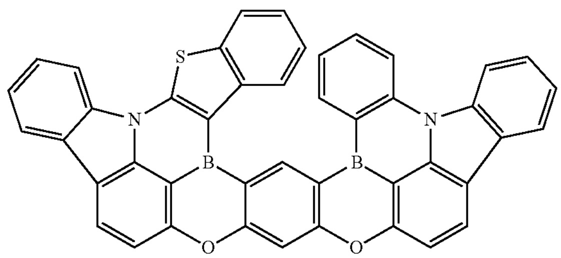
237
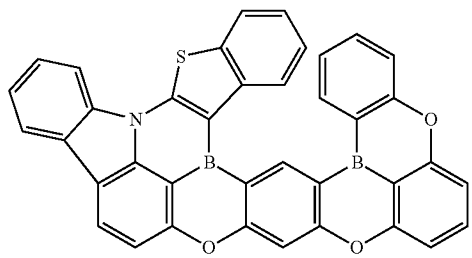
238
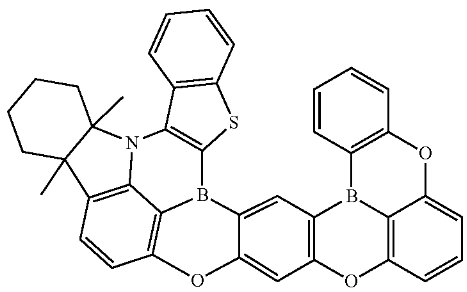
239
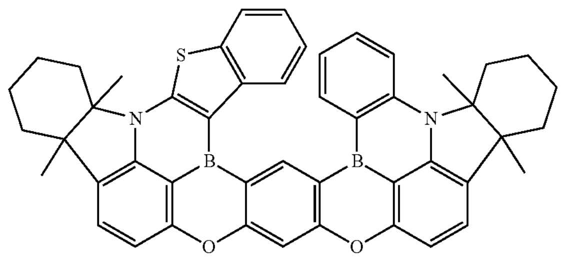
240
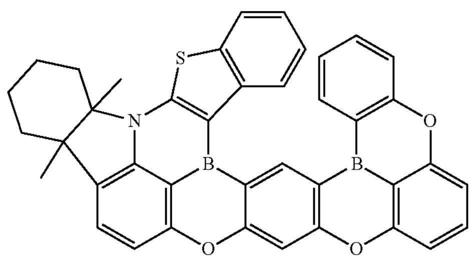
241
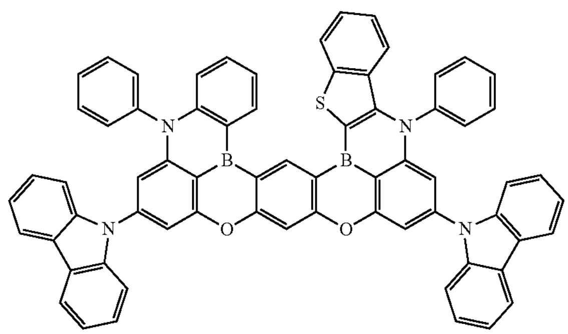
242
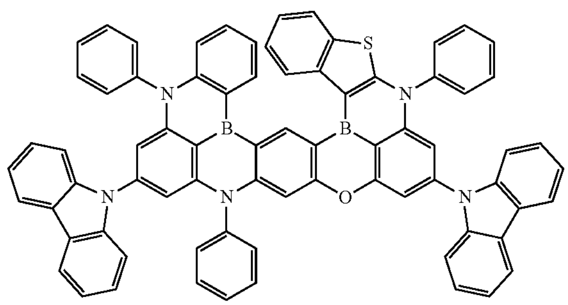
243
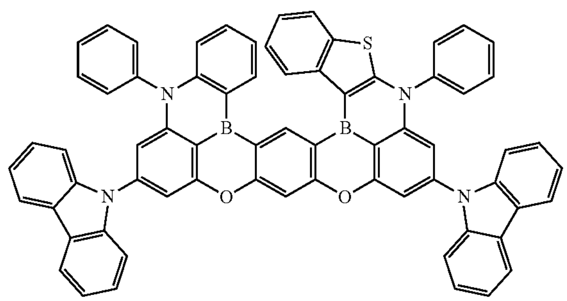
244
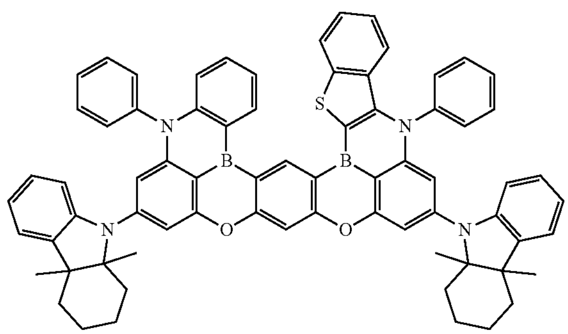
245
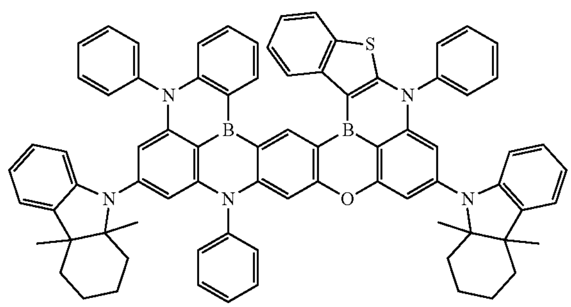

-continued
246
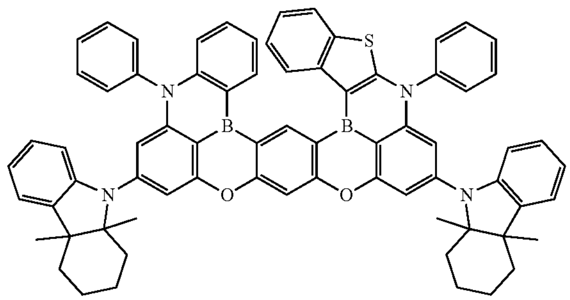
247
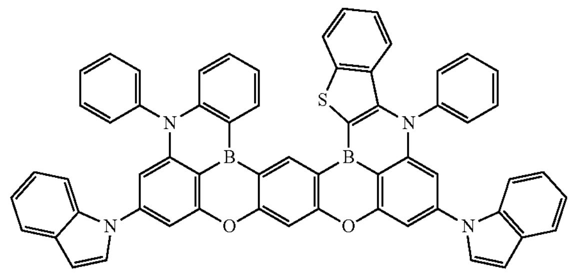
248
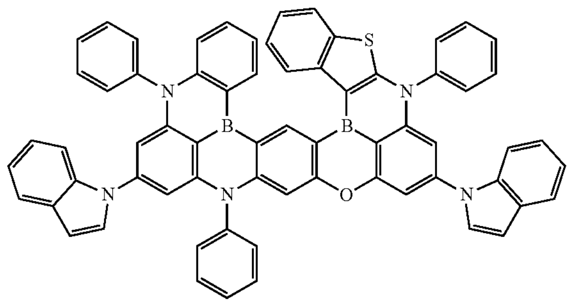
249
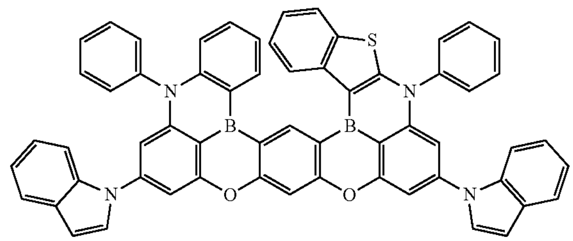
250
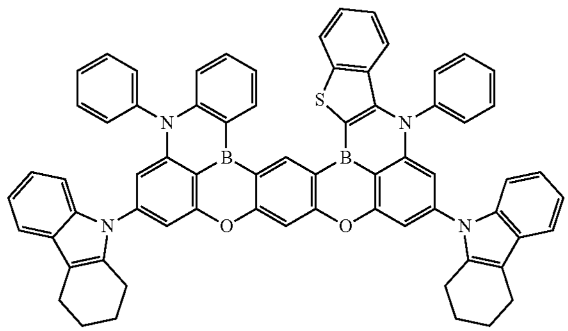
251
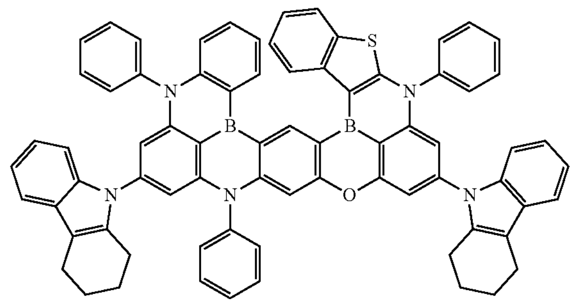
252
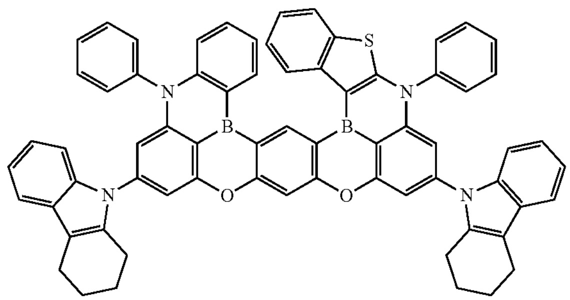
253
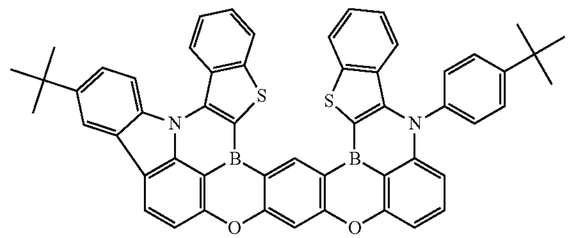

-continued
254
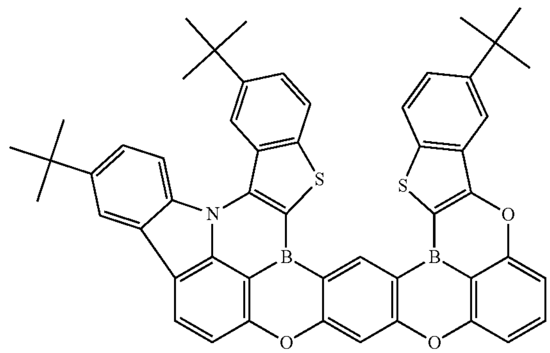
255
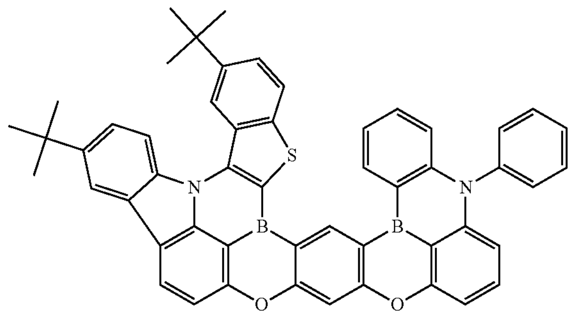
256
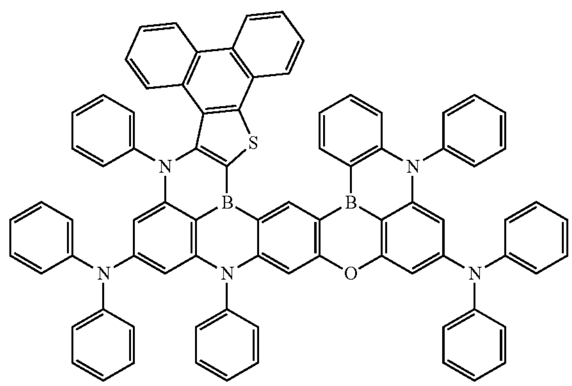
257
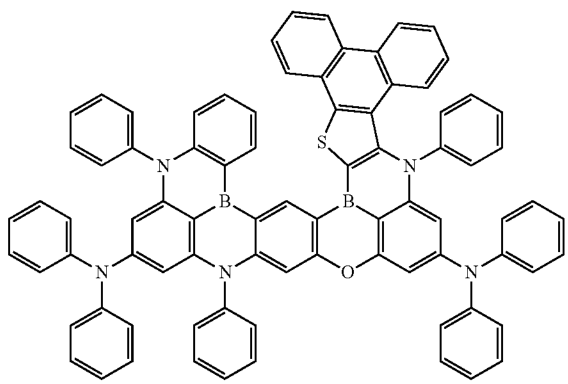
258
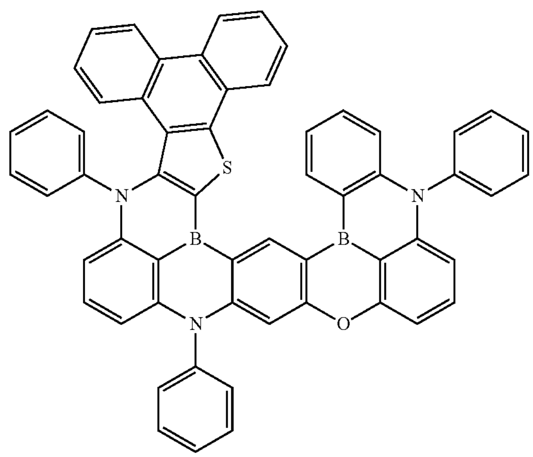
259
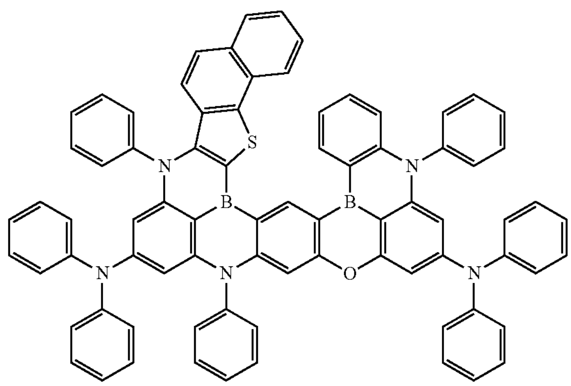

-continued
260
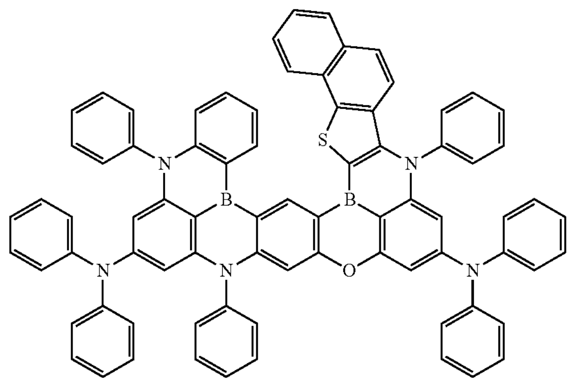
261
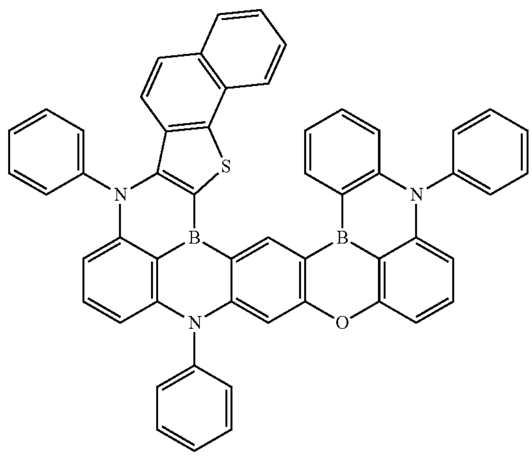
262
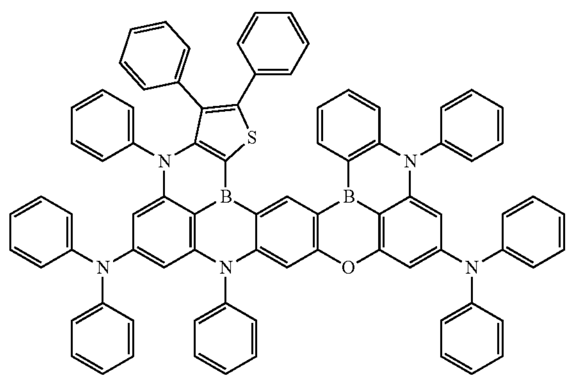
263
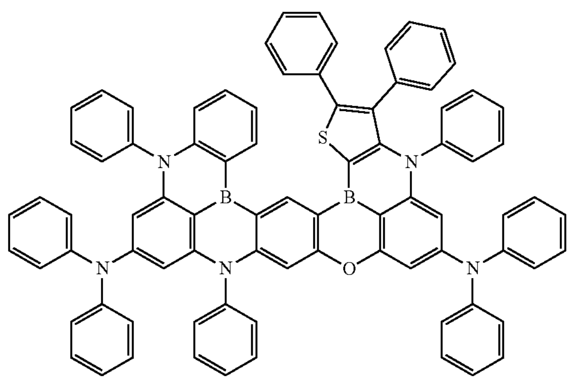
264
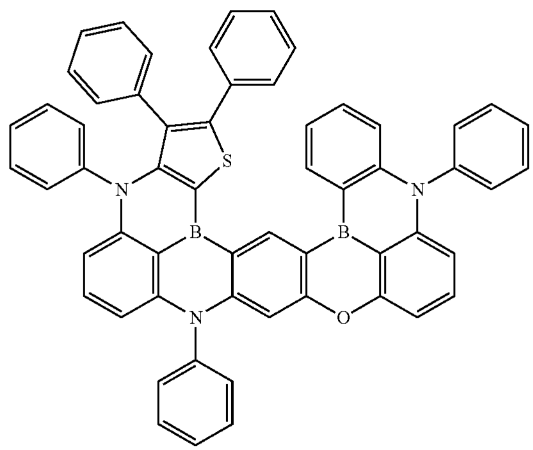
265
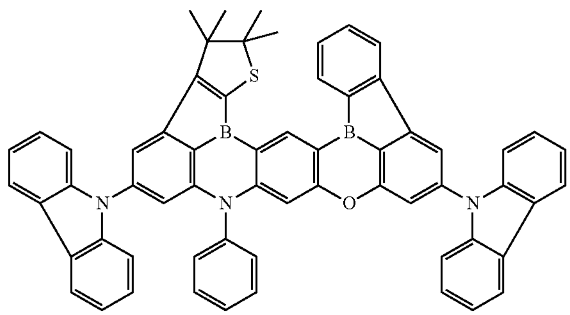

-continued

266

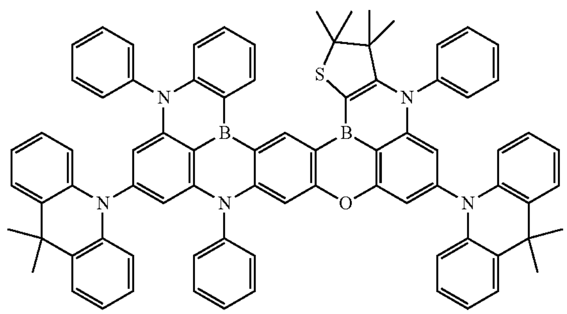

267

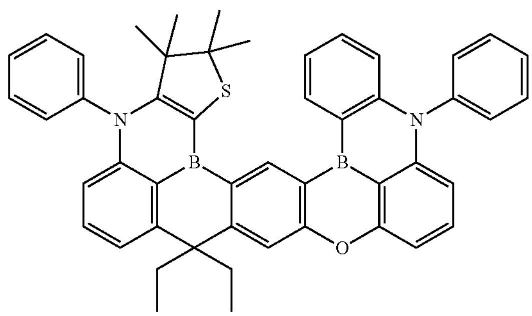

The specific substituents in Formula A can be clearly seen from the structures of the compounds 1 to 267 but are not intended to limit the scope of the compound represented by Formula A.

As can be seen from the above specific compounds, the polycyclic aromatic derivative of the present invention contains B, P or P═O and has a polycyclic aromatic structure. The introduction of substituents into the polycyclic aromatic structure enables the synthesis of organic light emitting materials with inherent characteristics of the substituents. For example, the substituents are designed for use in materials for hole injecting layers, hole transport layers, light emitting layers, electron transport layers, electron injecting layers, electron blocking layers, and hole blocking layers of organic electroluminescent devices. This introduction meets the requirements of materials for the organic layers, making the organic electroluminescent devices highly efficient.

A further aspect of the present invention is directed to an organic electroluminescent device including a first electrode, a second electrode, and one or more organic layers interposed between the first and second electrodes wherein one of the organic layers includes at least one of the organic electroluminescent compounds that can be represented by Formula A.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A is used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but are not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention will be described in more detail with reference to exemplary embodiments.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers that have various functions depending on the desired characteristics of the device.

The light emitting layer of the organic electroluminescent device according to the present invention includes, as a host compound, an anthracene derivative represented by Formula C:

[Formula C]

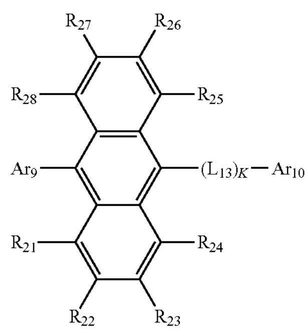

wherein $R_{21}$ to $R_{28}$ are identical to or different from each other and are as defined for $R_1$ to $R_5$ in Formula A, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

[Formula C-1]

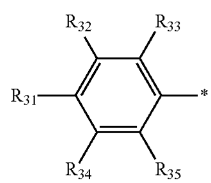

wherein $R_{31}$ to $R_{35}$ are identical to or different from each other and are as defined for $R_1$ to $R_5$ in Formula A and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C48:

C1

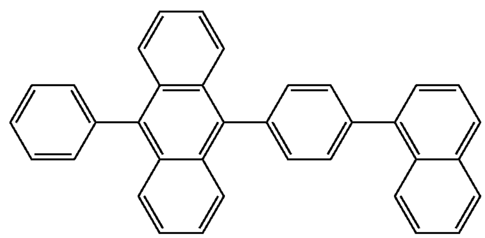

C2

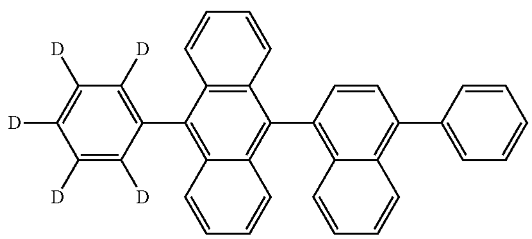

C3

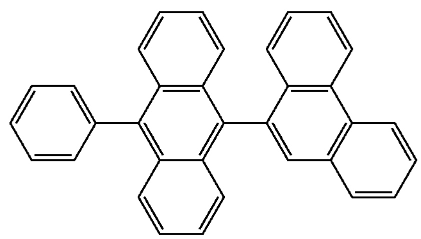

-continued

C4

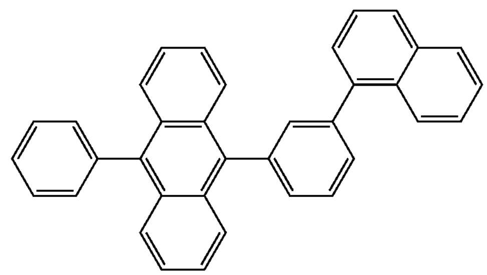

C5

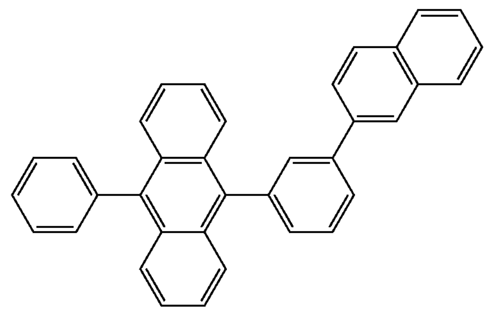

C6

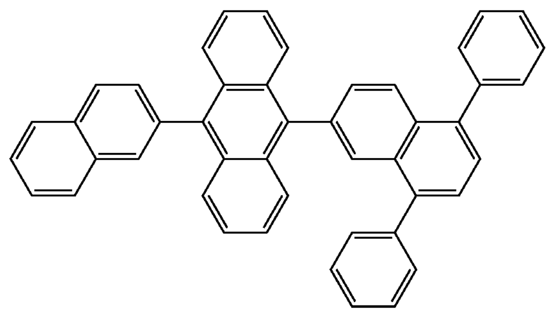

C7

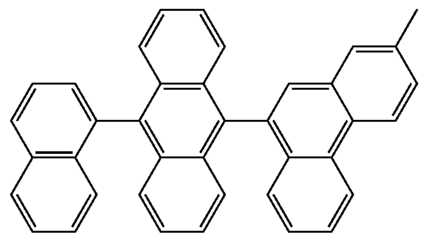

C8

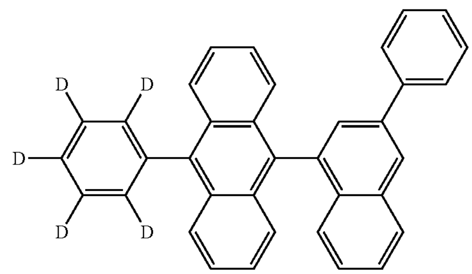

C9
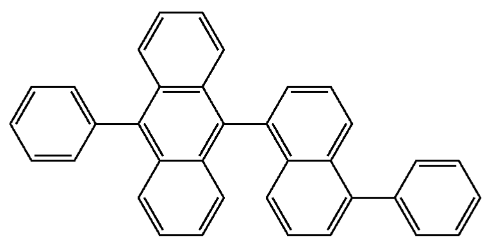
C10
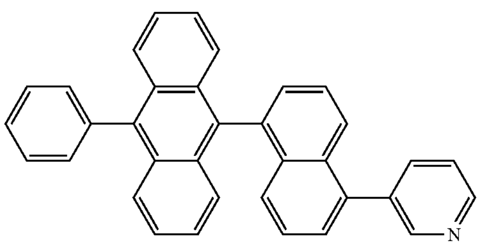
C11
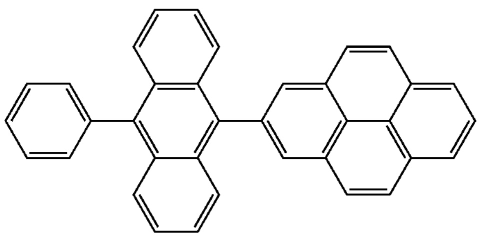
C12
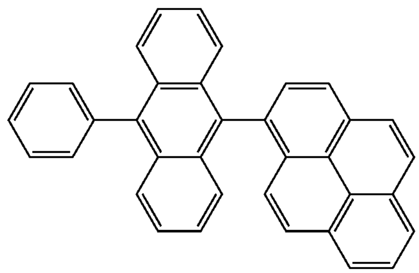
C13
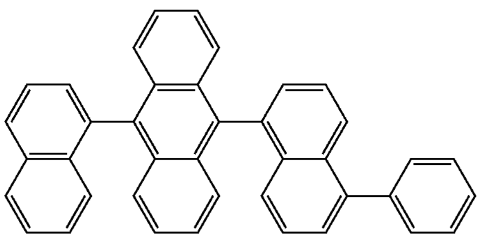
C14
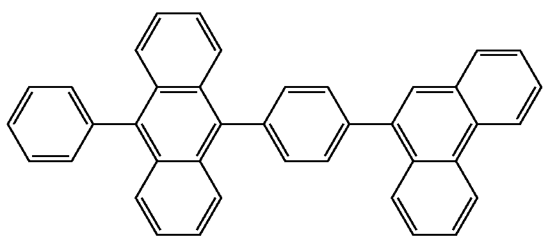
C15
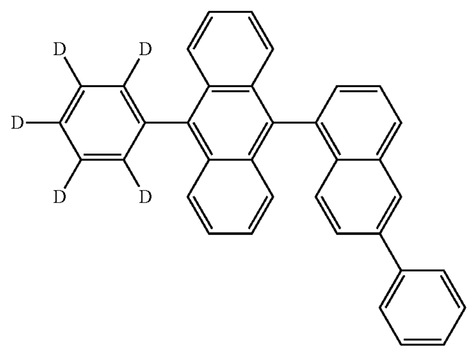
C16
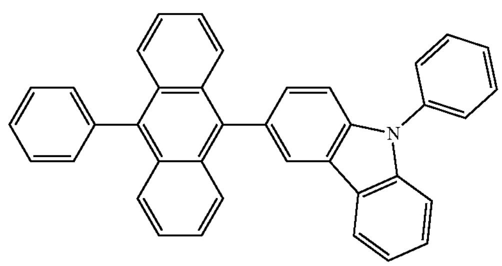
C17
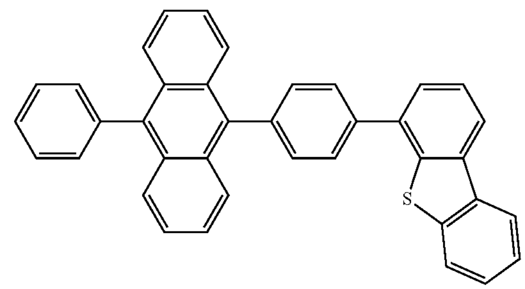
C18
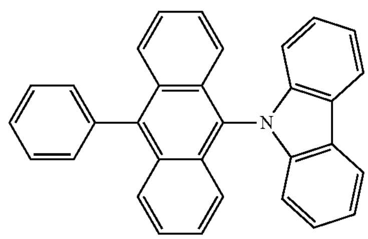
C19
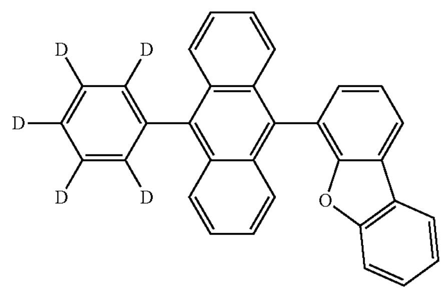

C20
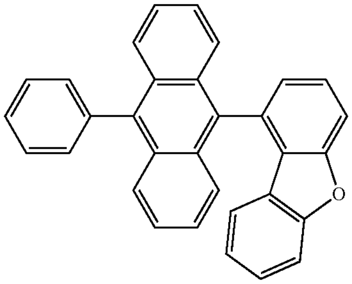
C21
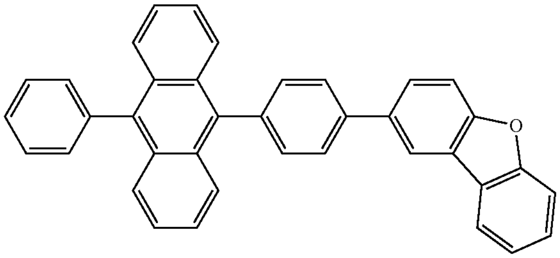
C22
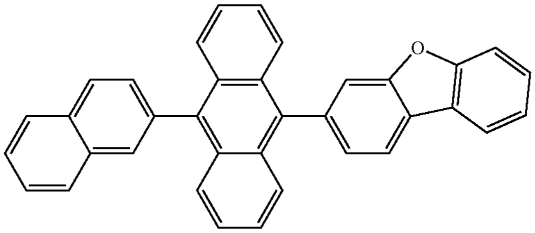
C23
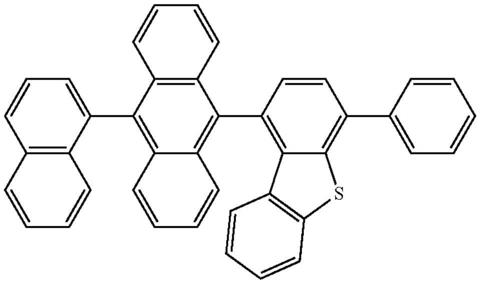
C24
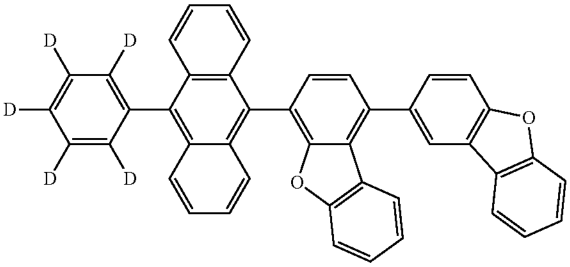
C25
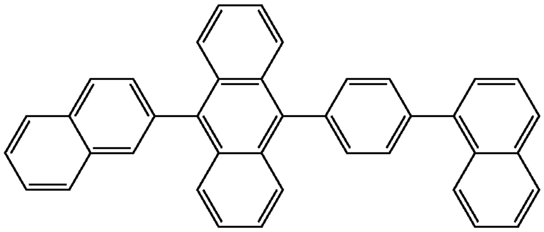
C26
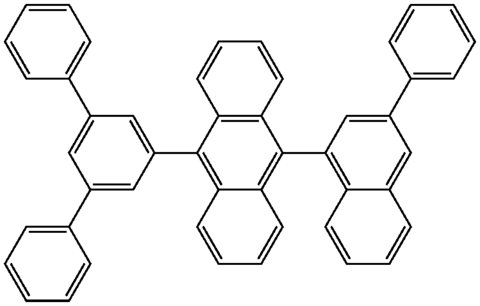
C27
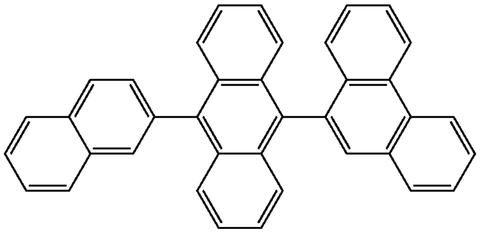
C28
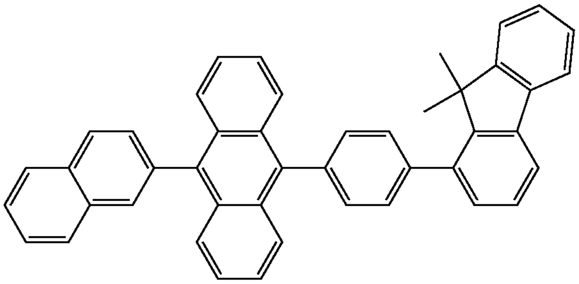
C29
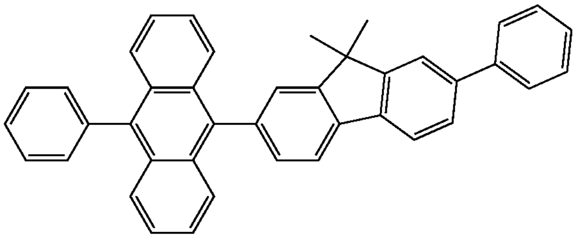

-continued
C30
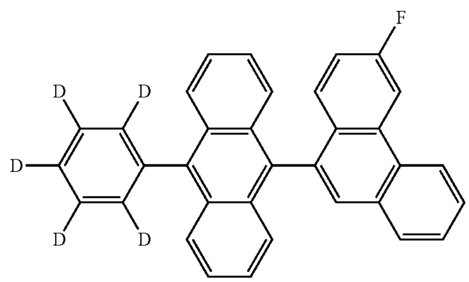
C31
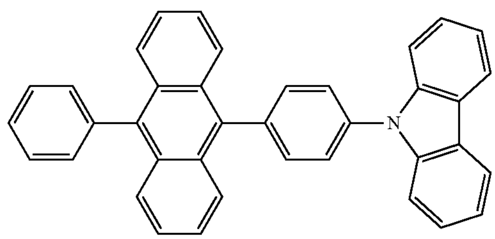
C32
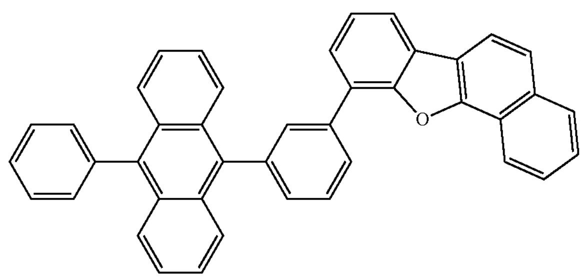
C33
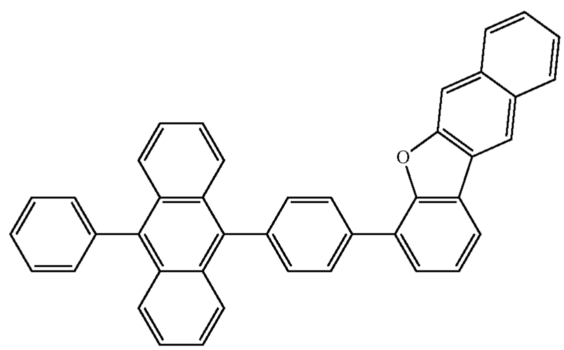
C34
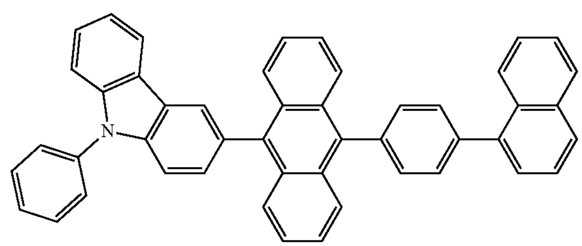
-continued
C35
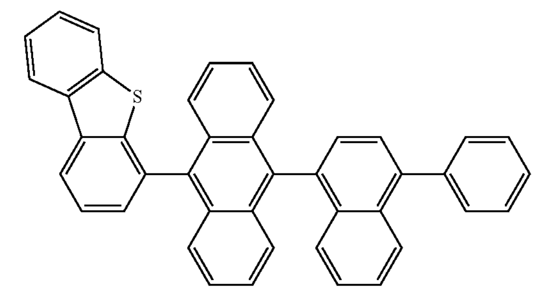
C36
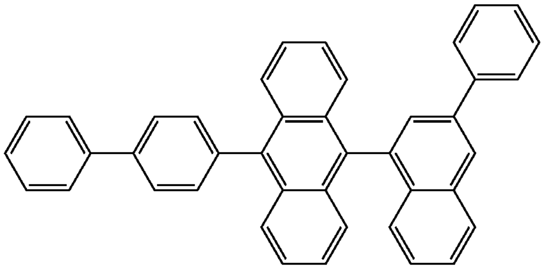
C37
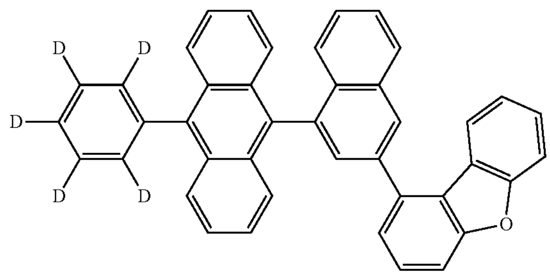
C38
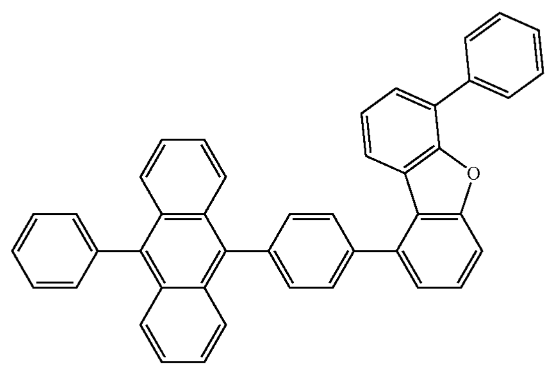
C39
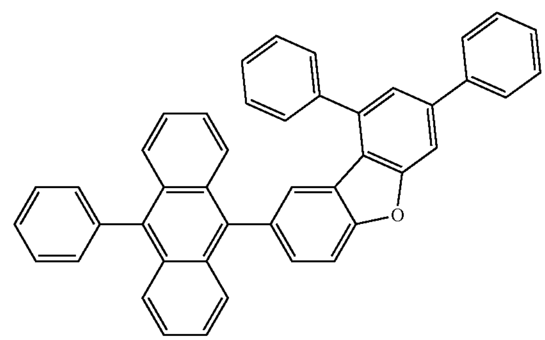

-continued
C40
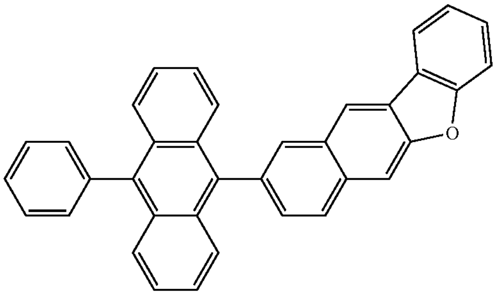
C41
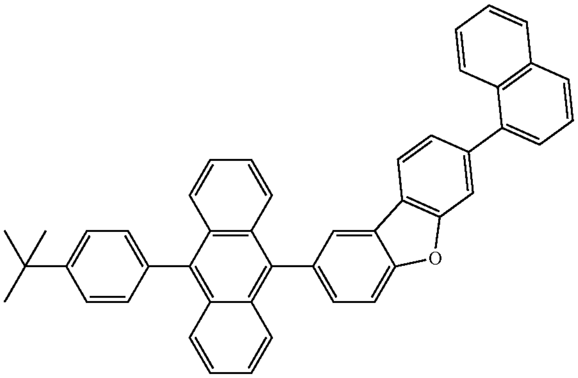
C42
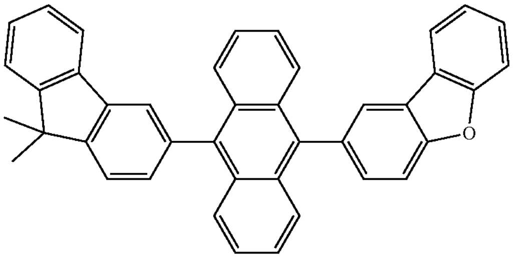
C43
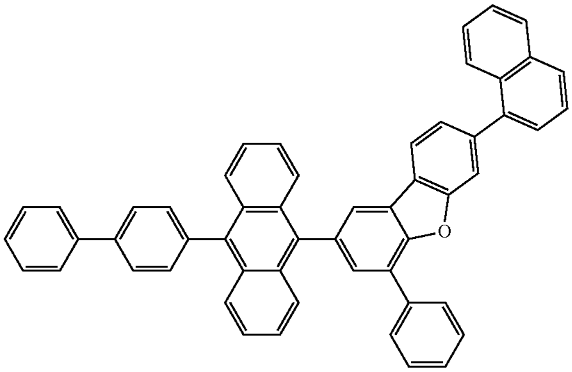
-continued
C44
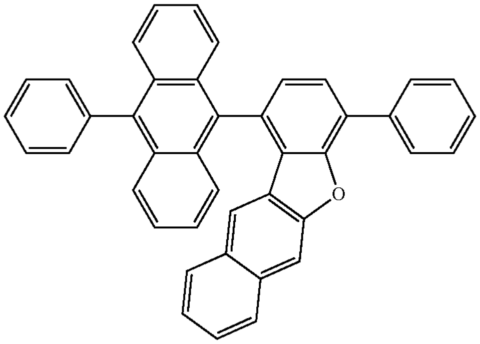
C45
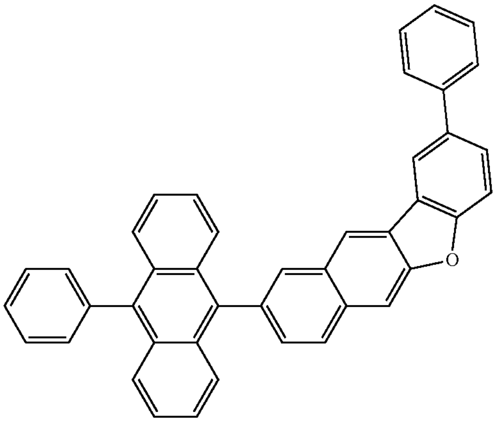
C46
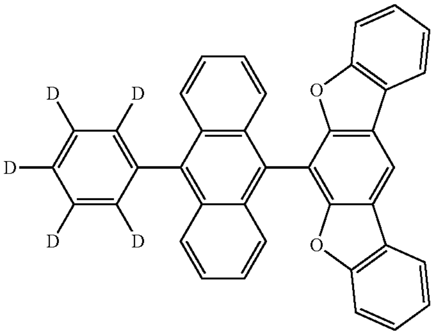
C47
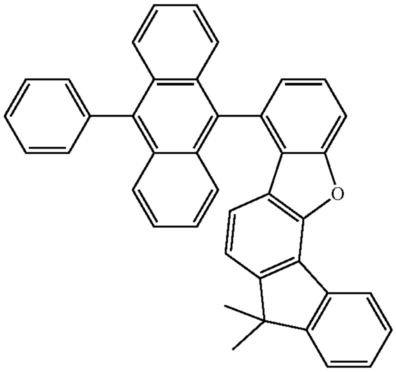

-continued

C48

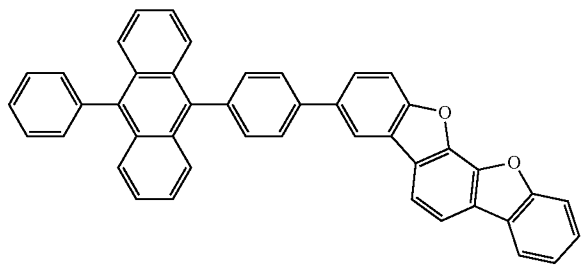

A specific structure of the organic electroluminescent device according to the present invention, a method for fabricating the device, and materials for the organic layers will be described below.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited as long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis(4-(phenyl-m-tolylamino)phenyl) biphenyl-4,4'-diamine (DNTPD).

The hole transport material is not specially limited as long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially formed on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited as long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate (Bebq2), ADN, and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR INVENTION

The present invention will be explained more specifically with reference to the following examples. However, it will be obvious to those skilled in the art that these examples are in no way intended to limit the scope of the invention.

Synthesis Example 1. Synthesis of Compound 25

(1) Synthesis Example 1-1. Synthesis of 1-a 1-a was synthesized by Reaction 1.

[Reaction 1]

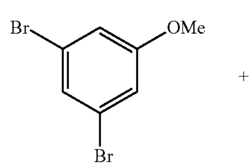

+

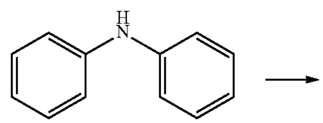

-continued

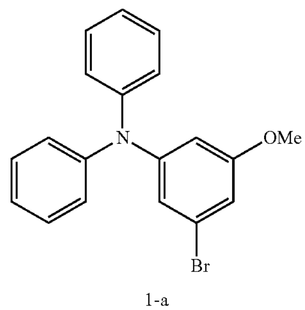

1-a 50 g (188 mmol) of 1,3-dibromo-5-methoxybenzene, 31.8 g (188 mmol) of diphenylamine, 36.1 g (376 mmol) of sodium tert-butoxide, 1.9 g (4 mmol) of bis(tri-tert-butylphosphine)Pd(0), and 500 mL of toluene were placed in a 1000 mL reactor. The mixture was stirred under reflux for 12 h. After completion of the reaction, the reaction solution was left standing for layer separation. The organic layer was concentrated under reduced pressure and separated by column chromatography to afford 33.3 g (yield 50%) of 1-a.

(2) Synthesis Example 1-2. Synthesis of 1-b 1-b was synthesized by Reaction 2.

[Reaction 2]

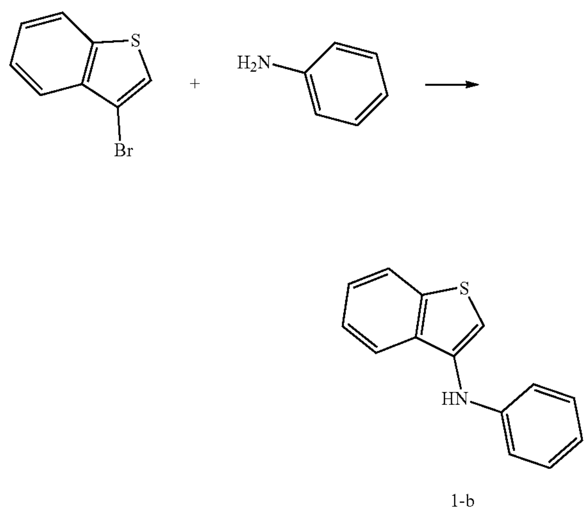

1-b 50 g (235 mmol) of 3-bromobenzothiophene, 21.9 g (235 mmol) of aniline, 1.1 g (5 mmol) of palladium acetate, 45.1 g (469 mmol) of sodium tert-butoxide, 2 g (5 mmol) of bis(diphenylphosphino)-1,1'-binaphthyl, and 500 mL of toluene were placed in a 1000 mL reactor. The mixture was stirred under reflux for 12 h. After completion of the reaction, the reaction solution was filtered. The filtrate was concentrated and separated by column chromatography to afford 50 g (yield 92%) of 1-b.

(3) Synthesis Example 1-3. Synthesis of 1-c 1-c was synthesized by Reaction 3.

[Reaction 3]

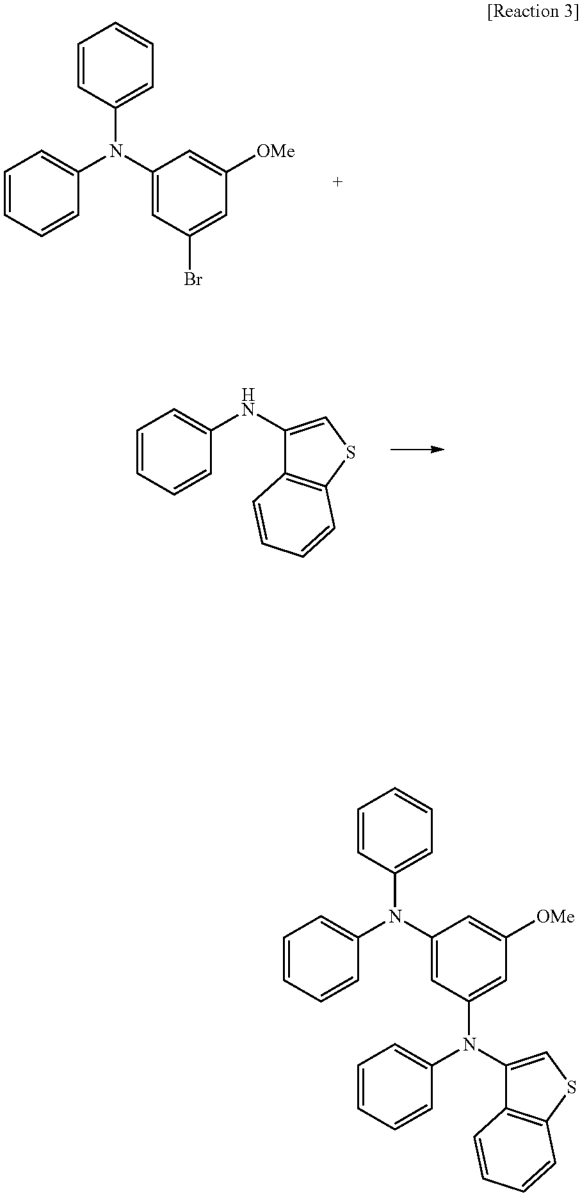

1-c 33.3 g (94 mmol) of 1-a, 21.2 g (94 mmol) of 1-b, 18.1 g (188 mmol) of sodium tert-butoxide, 1 g (2 mmol) of bis(tri-tert-butylphosphine)Pd(0), and 400 mL of toluene were placed in a 1000 mL reactor. The mixture was stirred under reflux for 12 h. After completion of the reaction, the reaction solution was left standing for layer separation. The organic layer was concentrated under reduced pressure and separated by column chromatography to afford 39.5 g (yield 80%) of 1-c.

(4) Synthesis Example 1-4. Synthesis of 1-d 1-d was synthesized by Reaction 4.

[Reaction 4]

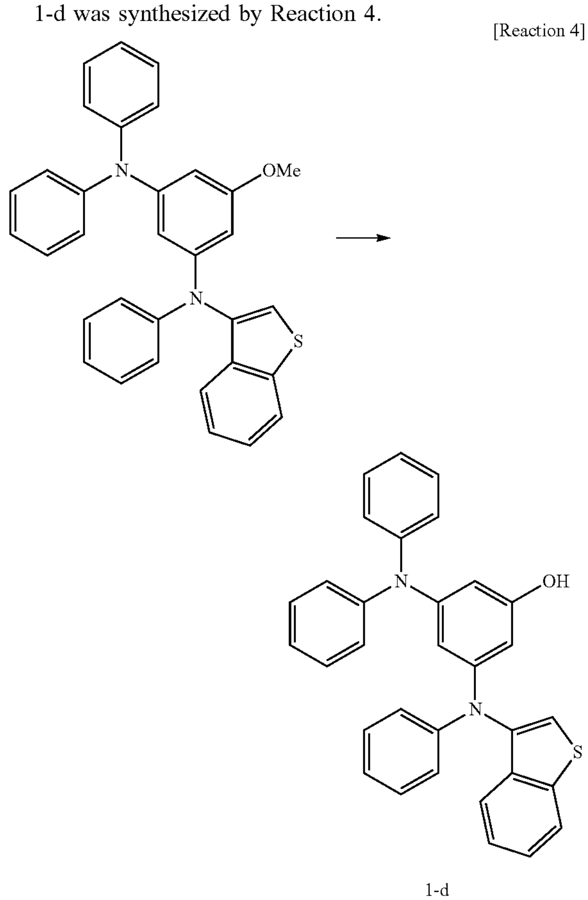

1-d 39.5 g (1.1 mmol) of 1-c, 200 mL of acetic acid, and 200 mL of hydrogen bromide were placed in a dry 500 mL reactor. The mixture was stirred under reflux for 24 h. After completion of the reaction, the reaction solution was precipitated in excess water. The solid was collected by filtration and separated by column chromatography to afford 35 g (yield 81.5%) of 1-d.

(5) Synthesis Example 1-5. Synthesis of 1-e 1-e was synthesized by Reaction 5.

[Reaction 5]

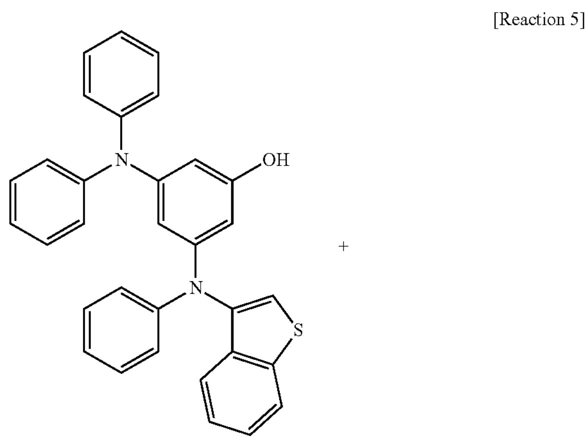

-continued

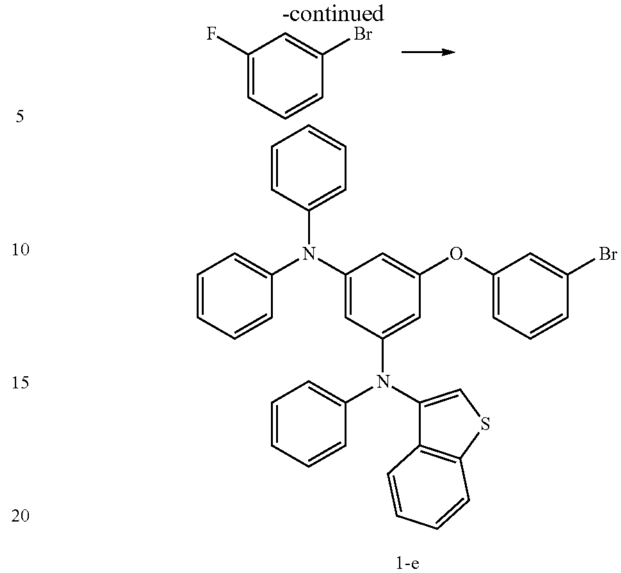

1-e 35 g (95 mmol) of 1-d, 25 g (120 mmol) of potassium carbonate, 25 g (142.5 mmol) of 1-bromo-3-fluorobenzene, and 400 mL of 1-methyl-2-pyrrolidone were placed in a 250 mL reactor. The mixture was stirred under reflux for 24 h. After completion of the reaction, the reaction solution was precipitated in excess water. The solid was collected by filtration and separated by column chromatography to afford 31 g (yield 85.4%) of 1-e.

(6) Synthesis Example 1-6. Synthesis of 1-f 1-f was synthesized by Reaction 6.

[Reaction 6]

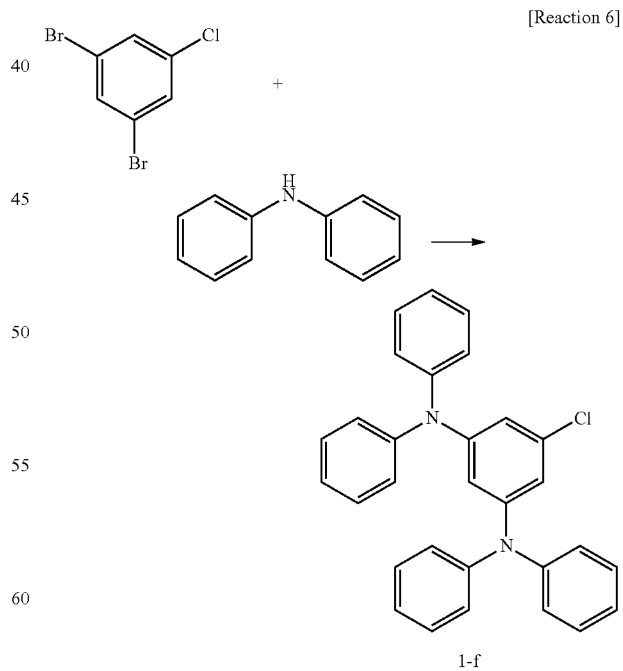

1-f 30 g (111 mmol) of 1,3-dibromo-5-chlorobenzene, 39.4 g (233 mmol) of diphenylamine, 32 g (333 mmol) of sodium tert-butoxide, 1.7 g (3 mmol) of bis(tri-tert-butylphosphine)

Pd(0), and 400 mL of toluene were placed in a 1000 mL reactor. The mixture was stirred under reflux for 12 h. After completion of the reaction, the reaction solution was left standing for layer separation. The organic layer was concentrated under reduced pressure and separated by column chromatography to afford 38.5 g (yield 82.3%) of 1-f.

(7) Synthesis Example 1-7. Synthesis of 1-g 1-g was synthesized by Reaction 7.

[Reaction 7]

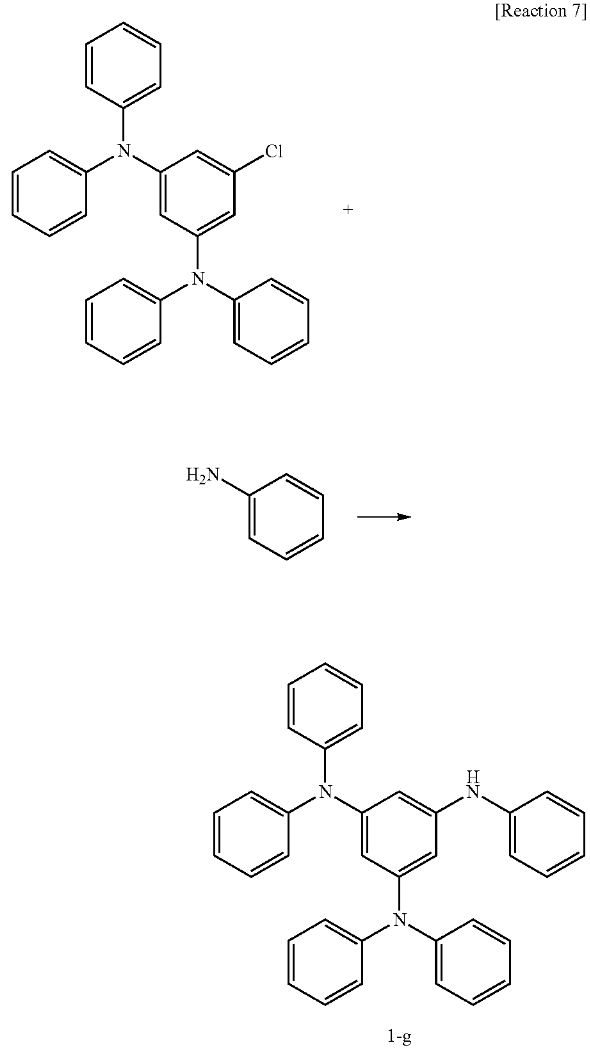

1-g 38.5 g (83 mmol) of 1-f, 8 g (83 mmol) of aniline, 16.6 g (172 mmol) of sodium tert-butoxide, 0.9 g (2 mmol) of bis(tri-tert-butylphosphine)Pd(0), and 400 mL of toluene were placed in a 1000 mL reactor. The mixture was stirred under reflux for 12 h. After completion of the reaction, the reaction solution was left standing for layer separation. The organic layer was concentrated under reduced pressure and separated by column chromatography to afford 40.2 g (yield 92.3%) of 1-g.

(8) Synthesis Example 1-8. Synthesis of 1-h 1-h was synthesized by Reaction 8.

[Reaction 8]

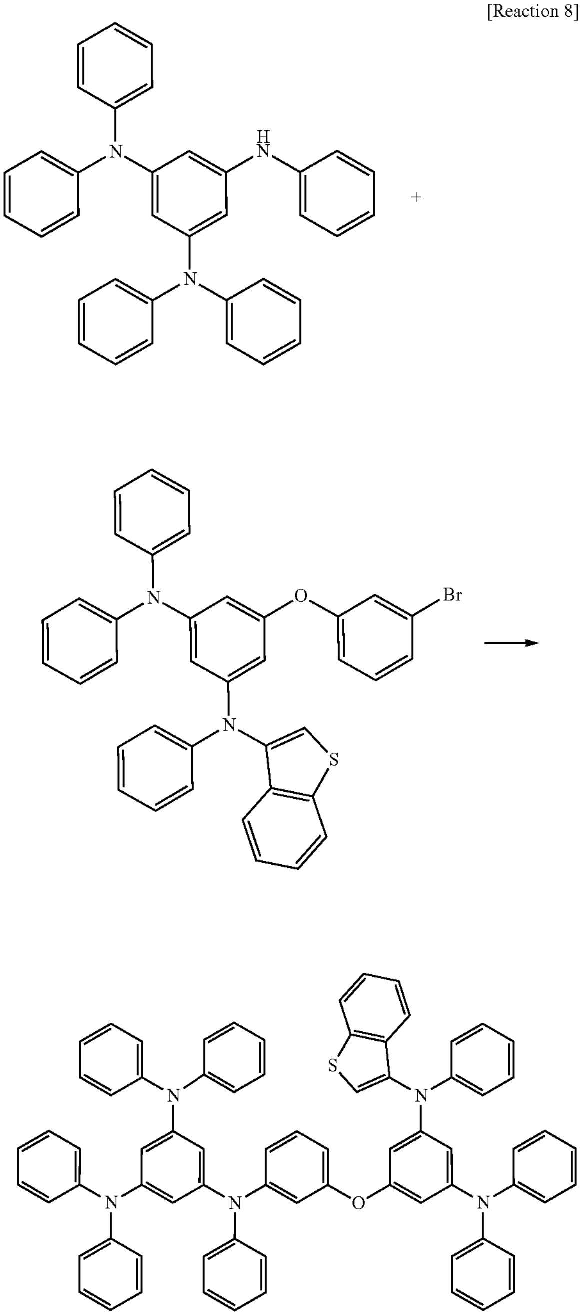

1-h 31 g (48 mmol) of 1-e, 24.4 g (48 mmol) of 1-g, 16.6 g (172 mmol) of sodium tert-butoxide, 0.9 g (2 mmol) of bis(tri-tert-butylphosphine)Pd(0), and 400 mL of toluene were placed in a 1000 mL reactor. The mixture was stirred under reflux for 12 h. After completion of the reaction, the reaction solution was left standing for layer separation. The organic layer was concentrated under reduced pressure and separated by column chromatography to afford 43.4 g (yield 89.3%) of 1-h.

(9) Synthesis Examples 1-9. Synthesis of Compound 25

Compound 25 was synthesized by Reaction 9.

[Reaction 9]

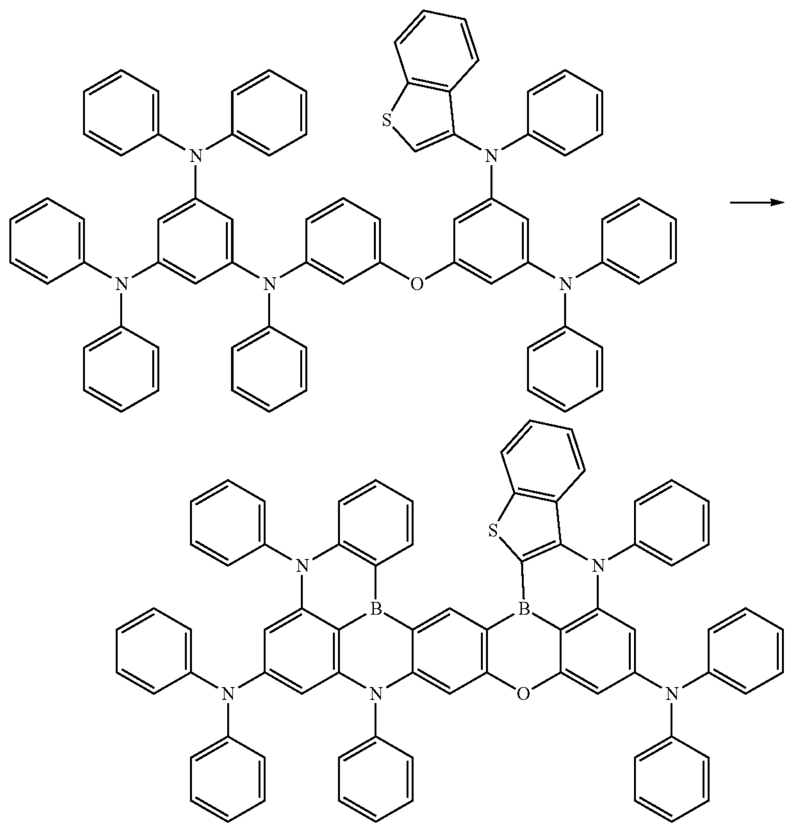

Compound 25

43.4 g (41 mmol) of 1-h and 450 mL of dichlorobenzene were placed in a 1000 mL reactor, and 20.5 g (82 mmol) of boron tribromide was added dropwise thereto at 0° C. The mixture was stirred at room temperature for 2 h and at 180° C. for 18 h. After completion of the reaction, an aqueous sodium acetate solution was added to the reaction mixture at room temperature. The resulting mixture was stirred and extracted with ethyl acetate. The organic layer was concentrated and separated by column chromatography to afford 5.3 g (yield 15.7%) of Compound 25.

Synthesis Example 2: Synthesis of Compound 42

(1) Synthesis Example 2-1. Synthesis of 2-a 2-a was synthesized by Reaction 10.

[Reaction 10]

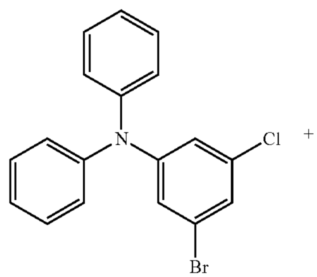

+

-continued

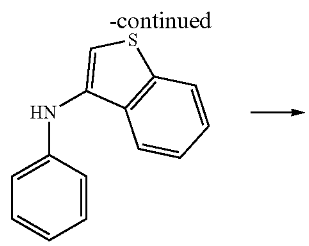

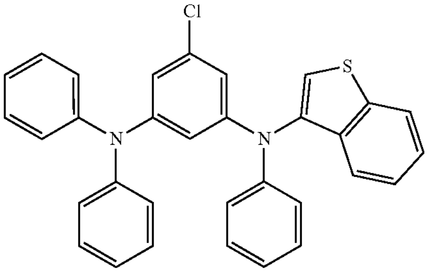

2-a 18.5 g (yield 74.1%) of 2-a was synthesized in the same manner as in Synthesis Example 1-3, except that 3-bromo-5-chloro-N,N-diphenylaniline was used instead of 1-a.

(2) Synthesis Example 2-2. Synthesis of 2-b 2-b was synthesized by Reaction 11.

[Reaction 11]

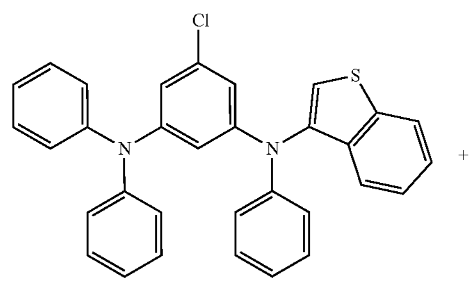

+

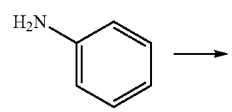

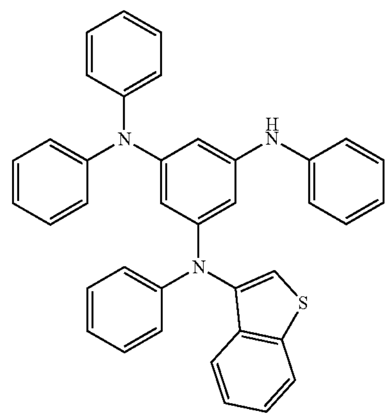

2-b 24.1 g (yield 84%) of 2-b was synthesized in the same manner as in Synthesis Example 1-7, except that 2-a was used instead of 1-f.

(3) Synthesis Example 2-3. Synthesis of 2-c 2-c was synthesized by Reaction 12.

[Reaction 12]

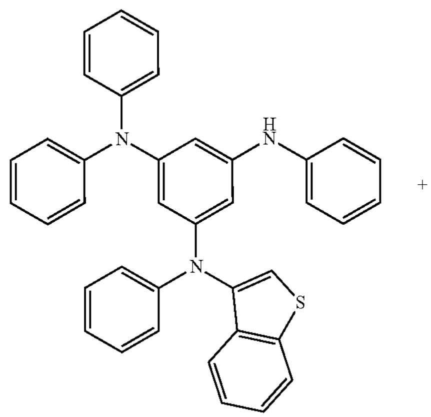

+

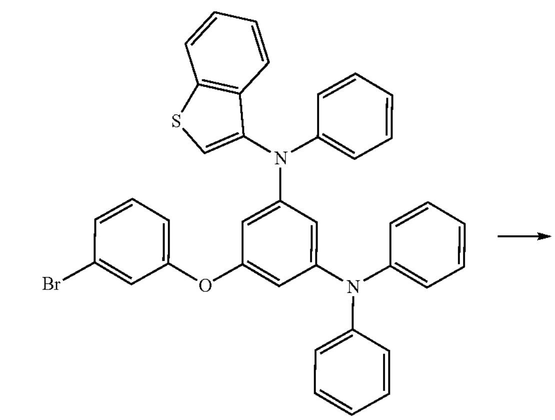

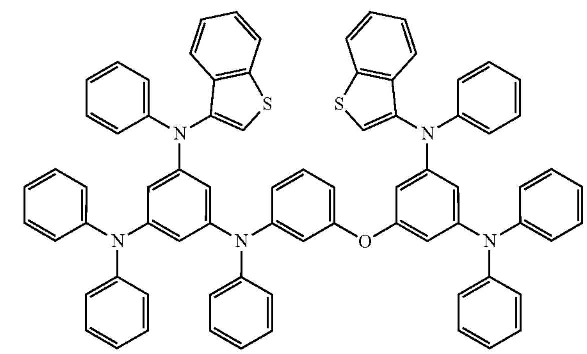

2-c 30.5 g (yield 78.4%) of 2-c was synthesized in the same manner as in Synthesis Example 1-8, except that 2-b was used instead of 1-g.

(4) Synthesis Example 2-4. Synthesis of Compound 42

Compound 42 was synthesized by Reaction 13.

[Reaction 13]

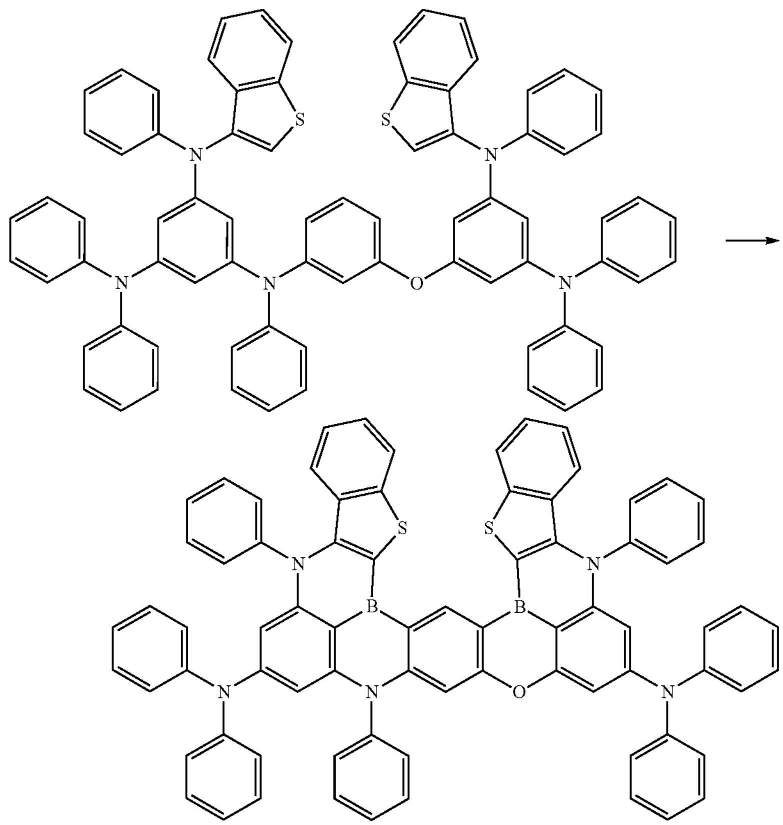

Compound 42

3.4 g (yield 12.5%) of Compound 42 was synthesized in the same manner as in Synthesis Example 1-9, except that 2-c was used instead of 1-h.

Synthesis Example 3: Synthesis of Compound 55

(1) Synthesis Example 3-1. Synthesis of 3-a 3-a was synthesized by Reaction 14.

[Reaction 14]

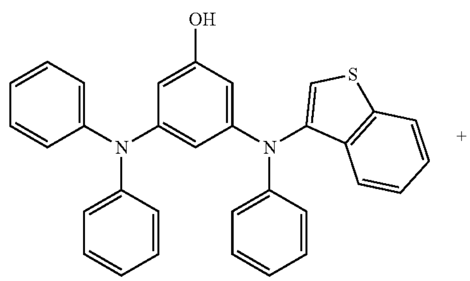

+

-continued

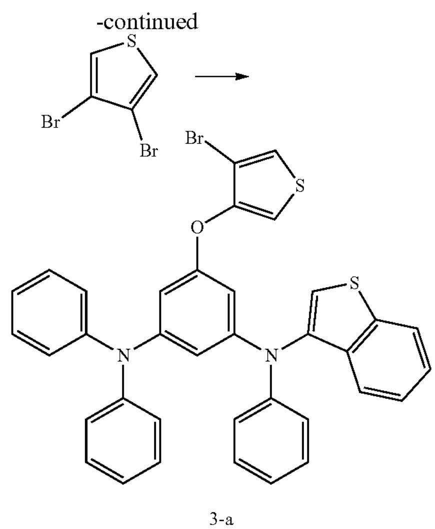

3-a 23.4 g (yield 69.5%) of 3-a was synthesized in the same manner as in Synthesis Example 1-5, except that 3,4-dibromothiophene was used instead of 1-bromo-3-fluorobenzene.

(2) Synthesis Example 3-2. Synthesis of 3-b 3-b was synthesized by Reaction 15.

[Reaction 15]

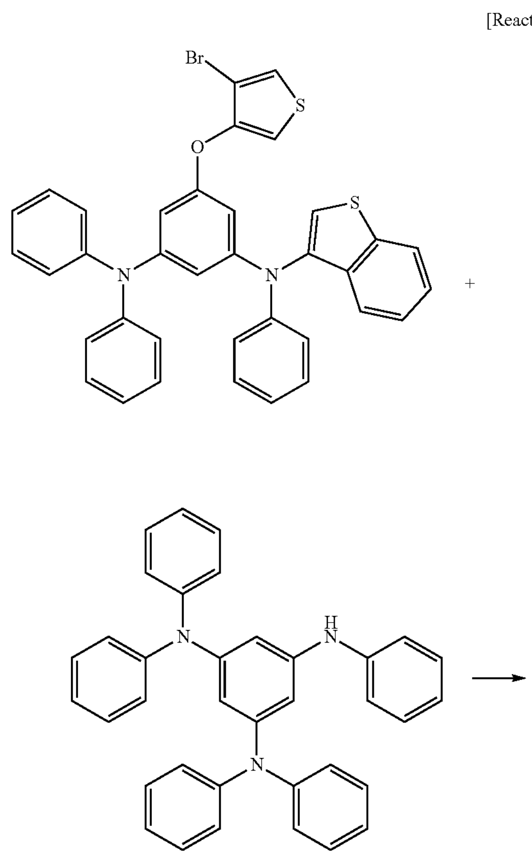

3-b 28.6 g (yield 77.4%) of 3-b was synthesized in the same manner as in Synthesis Example 1-8, except that 3-a was used instead of 1-e.

(3) Synthesis Example 3-3. Synthesis of Compound 55

Compound 55 was synthesized by Reaction 16.

[Reaction 16]

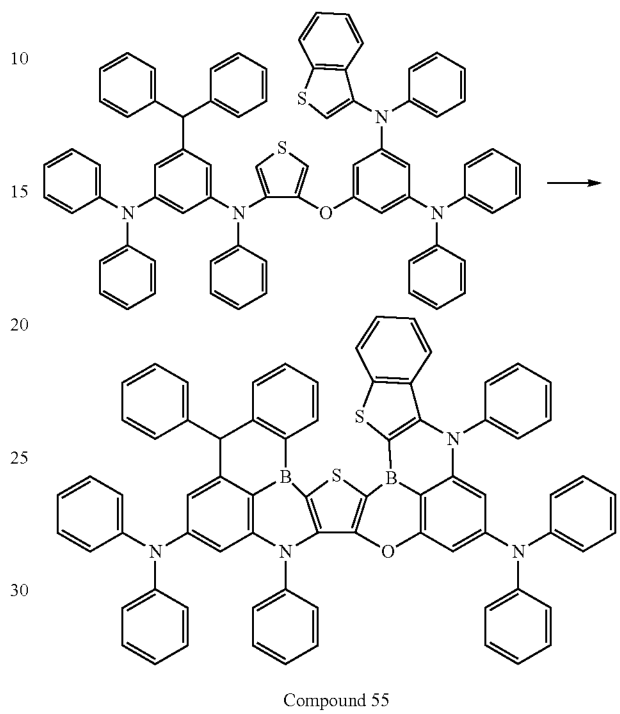

Compound 55

4.1 g (yield 14.5%) of Compound 55 was synthesized in the same manner as in Synthesis Example 1-9, except that 3-b was used instead of 1-h.

Synthesis Example 4: Synthesis of Compound 86

(1) Synthesis Example 4-1. Synthesis of 4-a 4-a was synthesized by Reaction 17.

[Reaction 17]

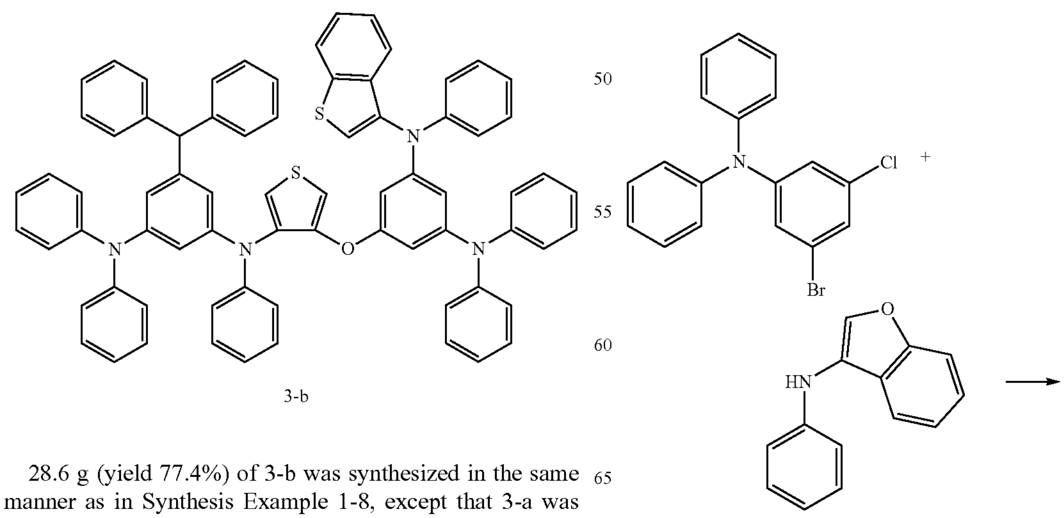

-continued

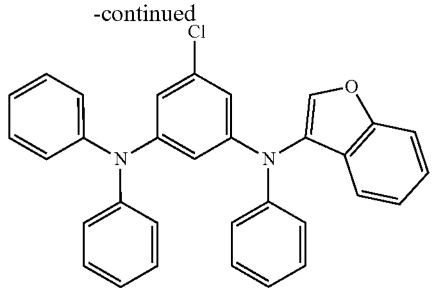

4-a 35.6 g (yield 67.1%) of 4-a was synthesized in the same manner as in Synthesis Example 1-3, except that 3-bromo-5-chloro-N,N-diphenylaniline and N-phenylbenzofuran-3-amine were used instead of 1-a and 1-b.

(2) Synthesis Example 4-2. Synthesis of 4-b 4-b was synthesized by Reaction 18.

[Reaction 18]

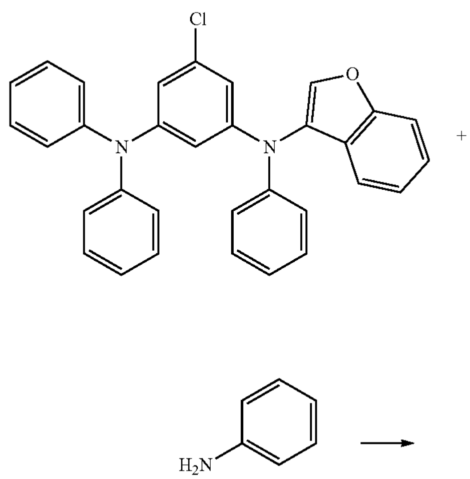

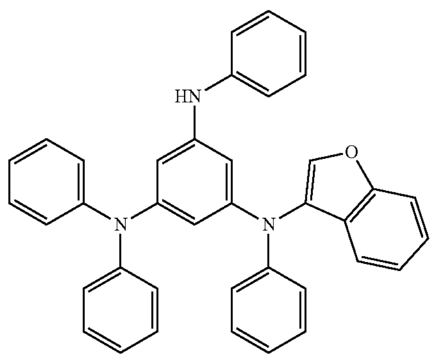

4-b 28.6 g (yield 74.8%) of 4-b was synthesized in the same manner as in Synthesis Example 1-7, except that 4-a was used instead of 1-f.

(3) Synthesis Example 4-3. Synthesis of 4-c 4-c was synthesized by Reaction 19.

[Reaction 19]

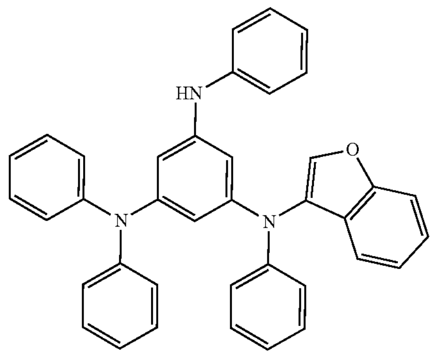

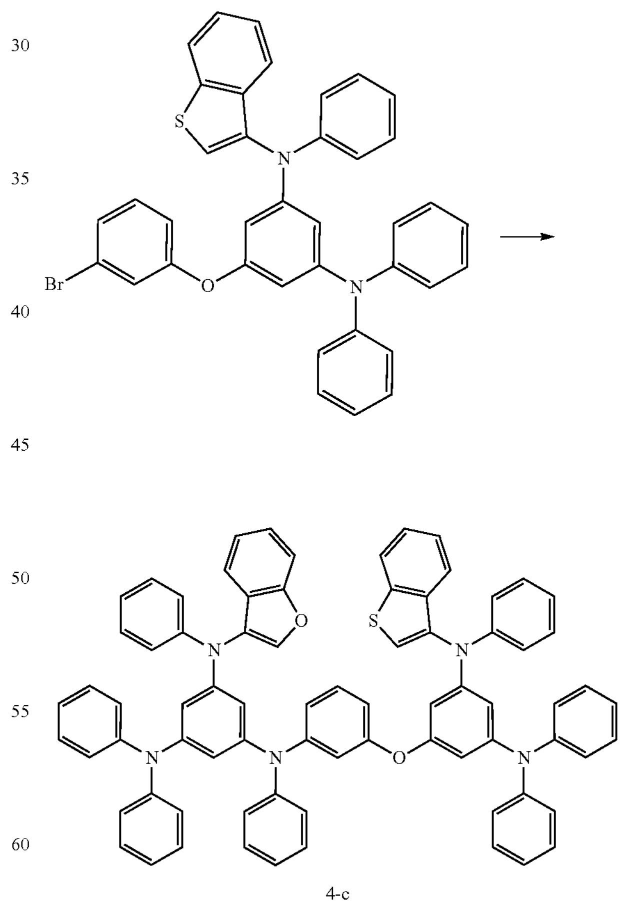

4-c 21.4 g (yield 72.7%) of 4-c was synthesized in the same manner as in Synthesis Example 1-8, except that 4-b was used instead of 1-g.

(4) Synthesis Example 4-4. Synthesis of Compound 86

Compound 86 was synthesized by Reaction 20.

[Reaction 20]

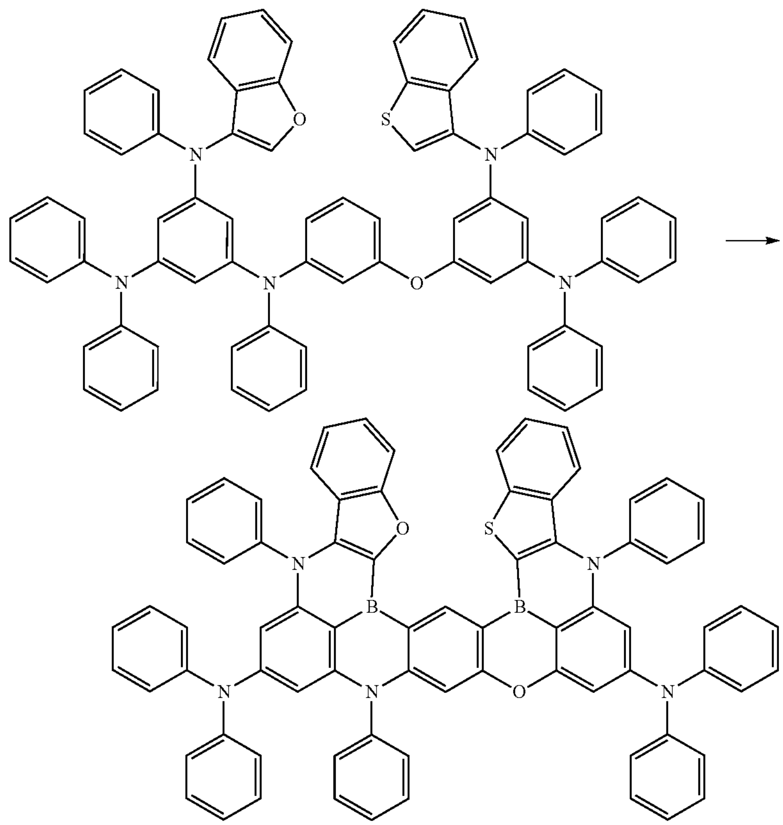

Compound 86

2.7 g (yield 12.5%) of Compound 86 was synthesized in the same manner as in Synthesis Example 1-9, except that 4-c was used instead of 1-h.

Synthesis Example 5: Synthesis of Compound 92

(1) Synthesis Example 5-1. Synthesis of 5-a 1-a was synthesized by Reaction 21.

[Reaction 21]

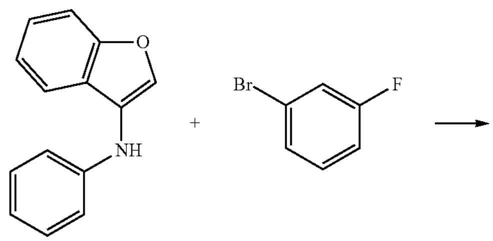

-continued

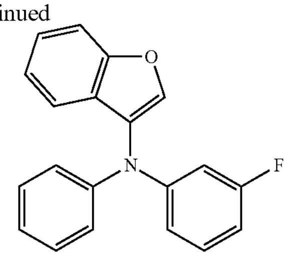

5-a 35.7 g (yield 78.1%) of 5-a was synthesized in the same manner as in Synthesis Example 1-3, except that N-phenylbenzofuran-3-amine and 1-bromo-3-fluorobenzene were used instead of 1-a and 1-b.

(2) Synthesis Example 5-2. Synthesis of 5-b 5-b was synthesized by Reaction 22.

[Reaction 22]

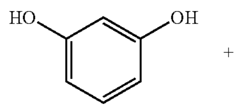

+

-continued

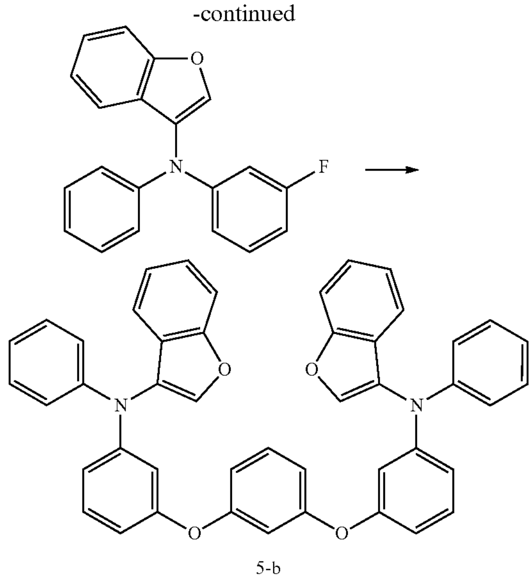

5-b 29.4 g (yield 67.8%) of 5-b was synthesized in the same manner as in Synthesis Example 1-5, except that 1,3-dihydroxybenzene and 5-a were used instead of 1-bromo-3-fluorobenzene and 1-d.

Synthesis Example 5-3. Synthesis of Compound 92

Compound 92 was synthesized by Reaction 23.

[Reaction 23]

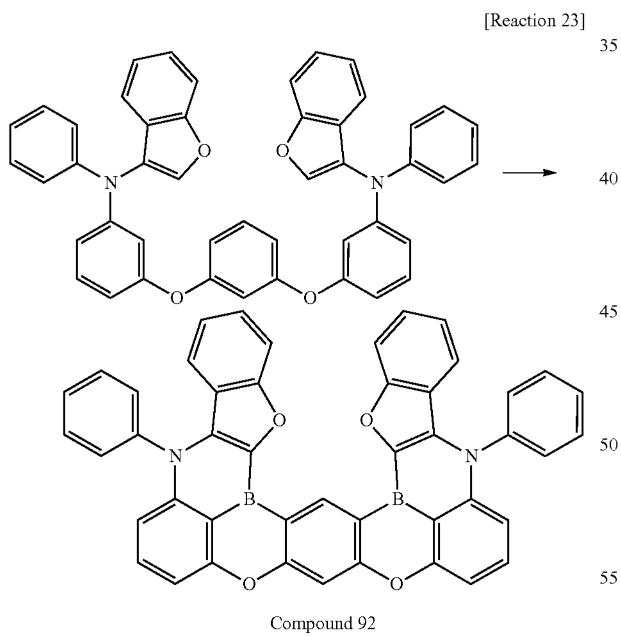

Compound 92

3.3 g (yield 22.5%) of Compound 92 was synthesized in the same manner as in Synthesis Example 1-9, except that 5-b was used instead of 1-h.

Examples 1-5: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound represented by Formula H (250 Å) were deposited in this order on the ITO. A mixture of the compound represented by BH1 as a host and the inventive compound (3 wt %) shown in Table 1 was used to form a 250 Å thick light emitting layer. Thereafter, a mixture of the compound represented by Formula E-1 and the compound represented by Formula E-2 in a ratio of 1:1 was used to form a 300 Å thick electron transport layer on the light emitting layer. The compound represented by Formula E-1 was used to form a 5 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

[DNTPD]

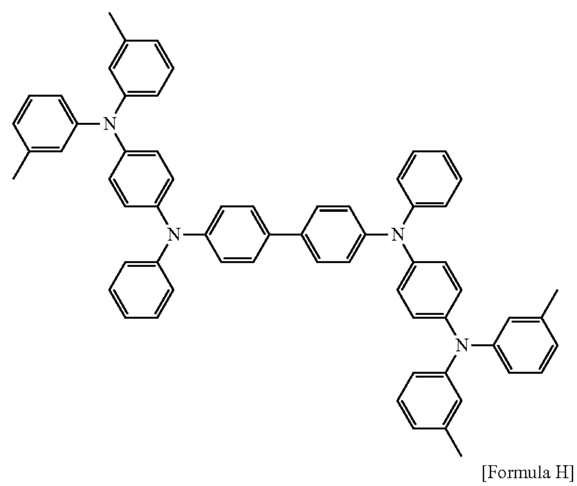

[Formula H]

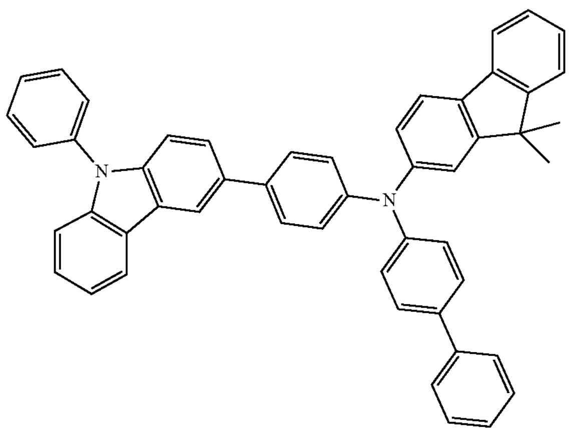

[Formula E-1]

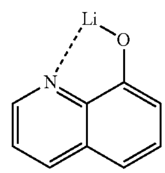

-continued

[Formula E-2]

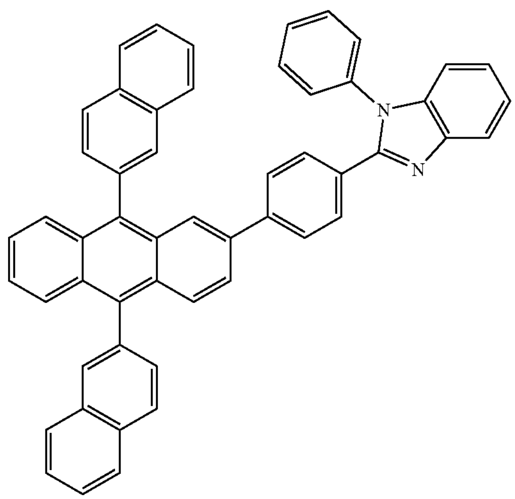

[BH1]

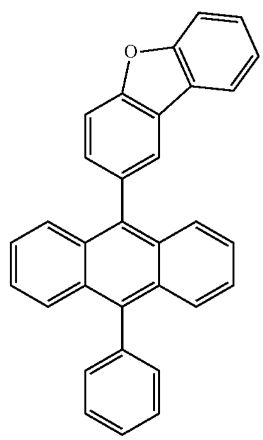

Comparative Examples 1-2

Organic electroluminescent devices were fabricated in the same manner as in Examples 1-5, except that BD1 or BD2 was used instead of the inventive compound. The luminescent properties of the organic electroluminescent devices were measured at 0.4 mA. The structures of BD1 and BD2 are as follow:

[BD1]

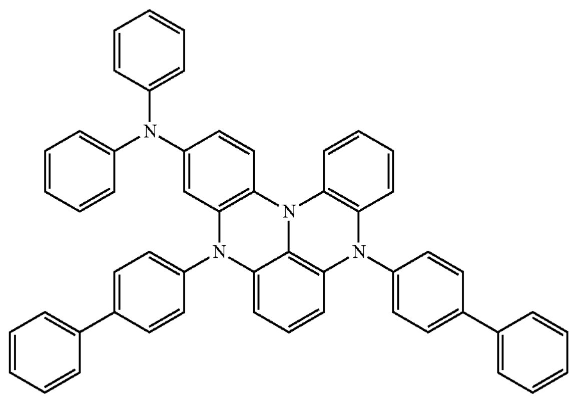

-continued

[BD2]

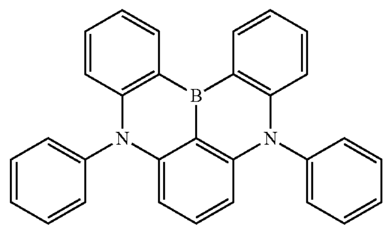

The organic electroluminescent devices of Examples 1-5 and Comparative Examples 1-2 were measured for driving voltage and external quantum efficiency. The results are shown in Table 1.

TABLE 1

| Example No. | Dopant | Driving voltage (V) | External quantum efficiency (%) |
| --- | --- | --- | --- |
| Example 1 | Compound 25 | 3.8 | 7.2 |
| Example 2 | Compound 42 | 3.8 | 7.1 |
| Example 3 | Compound 55 | 3.8 | 6.9 |
| Example 4 | Compound 86 | 3.8 | 7.0 |
| Example 5 | Compound 92 | 3.8 | 6.8 |
| Comparative Example 1 | BD1 | 3.8 | 5.3 |
| Comparative Example 2 | BD2 | 3.8 | 6.2 |

As can be seen from the results in Table 1, the organic electroluminescent devices of Examples 1-6, each of which employed the inventive compound, had high luminous efficiencies compared to the devices of Comparative Examples 1 and 2, which employed BD1 and BD2, respectively.

INDUSTRIAL APPLICABILITY

The polycyclic aromatic derivative of the present invention can be employed in an organic layer of an organic electroluminescent device to achieve high efficiency of the device. Therefore, the polycyclic aromatic derivative of the present invention can find useful industrial applications in various displays, including flat panel displays and flexible displays, and lighting systems, including monochromatic flat panel lighting systems, white flat panel lighting systems, flexible monochromatic lighting systems, and flexible white lighting systems.

The invention claimed is:

1. A polycyclic aromatic derivative represented by Formula A:

[Formula A]

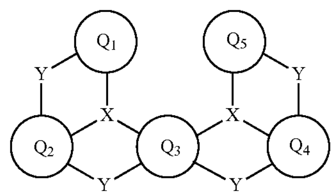

wherein $Q_1$ to $Q_5$ are identical to or different from each other and are each independently a substituted or unsubstituted $C_6$-$C_{50}$ aromatic hydrocarbon ring or a substituted or unsubstituted $C_2$-$C_{50}$ aromatic heterocyclic ring, each X is independently selected from B, P, P═O, and P═S, each Y is independently selected from N—$R_1$, $CR_2R_3$, O, S, Se, and $SiR_4R_5$, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to one of the rings $Q_1$ and $Q_5$ to form an alicyclic or aromatic monocyclic or polycyclic ring, $R_2$ and $R_5$ are optionally linked to each other to form an alicyclic or aromatic monocyclic or polycyclic ring, and $R_4$ and $R_5$ are optionally linked to each other to form an alicyclic or aromatic monocyclic or polycyclic ring, and with the proviso that (i) either or both of $Q_1$ and $Q_5$ are optionally selected from structures represented by Structural Formulae B-1 to B-3:

[Structural Formula B-1]

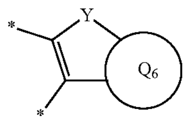

[Structural Formula B-2]

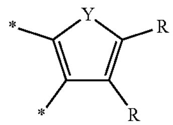

[Structural Formula B-3]

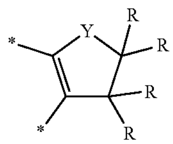

wherein each Y is independently selected from N—$R_1$, $CR_2R_3$, O, S, Se, and $SiR_4R_5$, $R_1$ to $R_5$ are as defined in Formula A, $Q_6$ is a substituted or unsubstituted $C_6$-$C_{50}$ aromatic hydrocarbon ring or a substituted or unsubstituted $C_2$-$C_{50}$ aromatic heterocyclic ring, each R is independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other or are each independently optionally bonded to one of the rings $Q_1$ and $Q_5$ to form an alicyclic or aromatic monocyclic or polycyclic ring, and each * represents a position at which the corresponding ring $Q_1$ or $Q_5$ is bonded to the adjacent X and Y in Formula A, (ii) $Q_3$ is selected from structures represented by Structural Formulae B-4 to B-6:

[Structural Formula B-4]

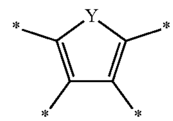

[Structural Formula B-5]

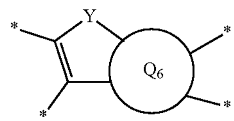

[Structural Formula B-6]

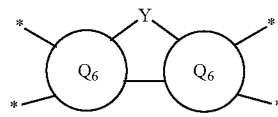

wherein Y and $Q_6$ are as defined above and each * represents a position at which the ring $Q_3$ is bonded to the adjacent X and Y in Formula A, or (iii) either or both of $Q_1$ and $Q_5$ are optionally selected from the structures represented by Structural Formulae B-1 to B-3 and $Q_3$ is optionally selected from the structures represented by Structural Formulae B-4 to B-6.

2. The polycyclic aromatic derivative according to claim 1, wherein $Q_1$ to $Q_6$ are identical to or different from each other and are each independently represented by Structural Formula Q-1:

[Structural Formula Q-1]

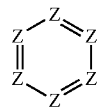

wherein each Z is independently CR or N and each R is independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other or are each independently optionally linked to an adjacent substituent to form an alicyclic or aromatic monocyclic or polycyclic ring, one or more of the carbon atoms in the alicyclic or aromatic monocyclic or polycyclic ring are optionally replaced with heteroatoms selected from N, S, and O, and Z bonded to each of the adjacent X and Y is C—H unless otherwise defined.

3. An organic electroluminescent device comprising a first electrode, a second electrode, and one or more organic layers interposed between the first and second electrodes wherein one of the organic layers comprises the compound represented by Formula A according to claim 1.

4. The organic electroluminescent device according to claim 3, wherein the organic layers comprise an electron injecting layer, an electron transport layer, a hole injecting layer, a hole transport layer, an electron blocking layer, a hole blocking layer, and/or a light emitting layer, at least one of which comprises the compound represented by Formula A.

5. The organic electroluminescent device according to claim 4, wherein the light emitting layer comprises, as a host compound, an anthracene derivative represented by Formula C:

[Formula C]

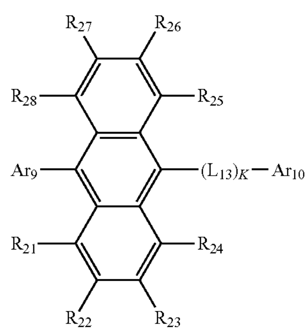

wherein $R_{21}$ to $R_{28}$ are identical to or different from each other and are as defined for $R_1$ to $R_5$ in Formula A according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

6. The organic electroluminescent device according to claim 5, wherein $Ar_9$ in Formula C is represented by Formula C-1:

[Formula C-1]

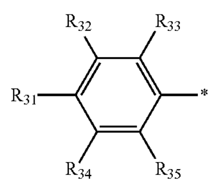

wherein $R_{31}$ to $R_{35}$ are identical to or different from each other and are as defined for $R_1$ to $R_5$ in Formula A according to claim 1 and each of $R_{31}$ to $R_{35}$ is optionally bonded to an adjacent substituent to form a saturated or unsaturated ring.

7. The organic electroluminescent device according to claim 5, wherein the anthracene derivative of Formula C is selected from the compounds represented by Formulae C1 to C48:

C1

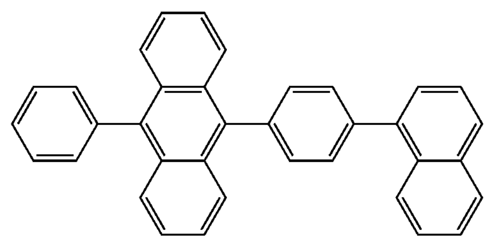

C2

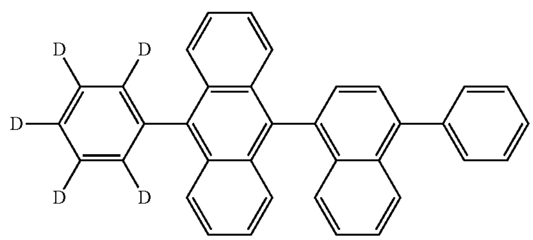

C3

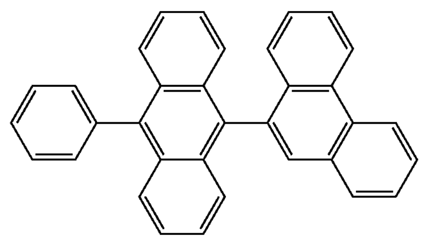

C4

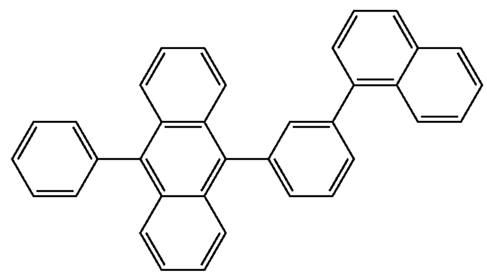

C5

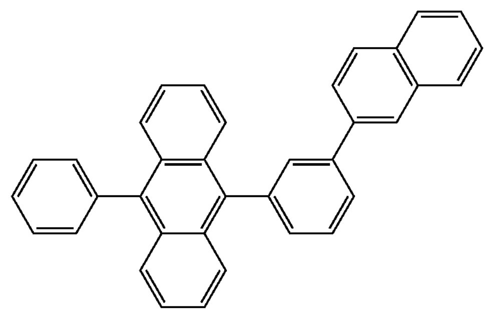

-continued
C6
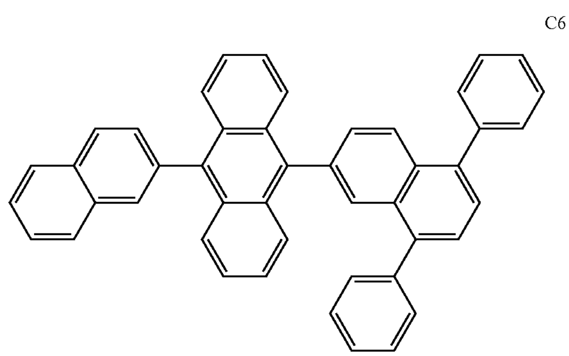
C7
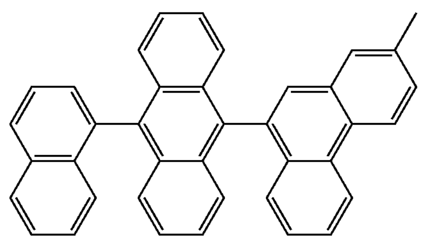
C8
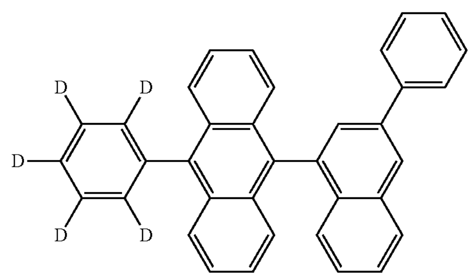
C9
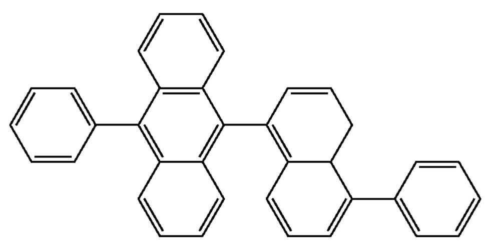
C10
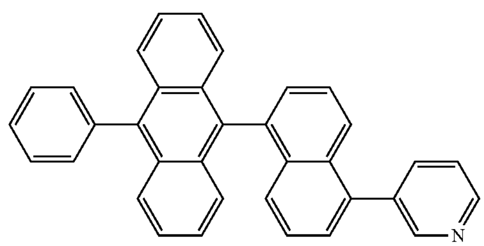
C11
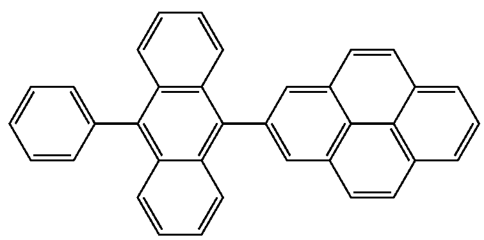
-continued
C12
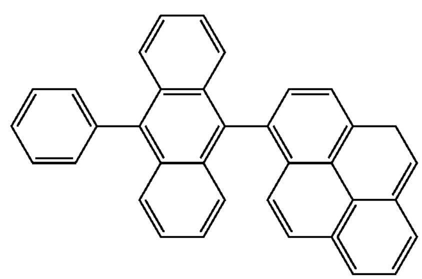
C13
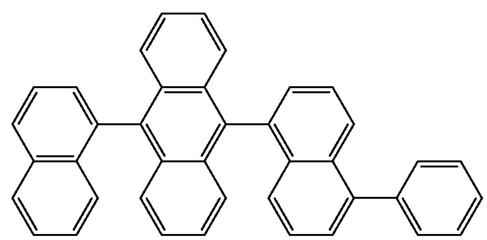
C14
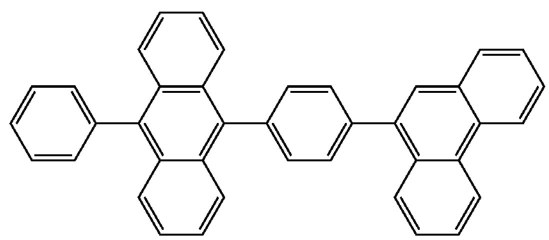
C15
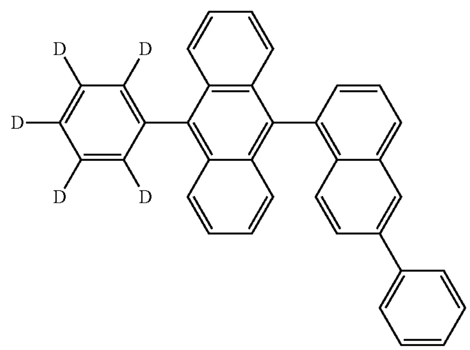
C16
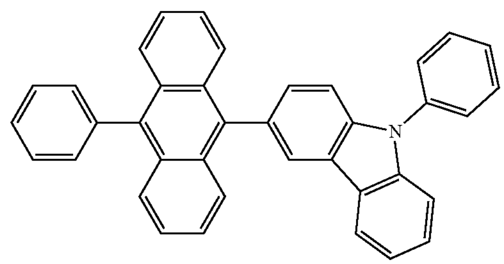

-continued
C17
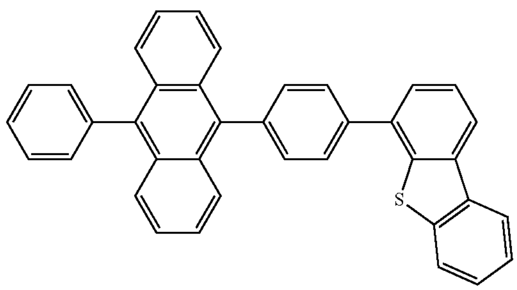
C18
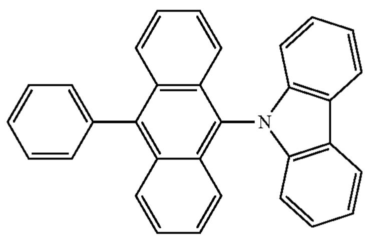
C19
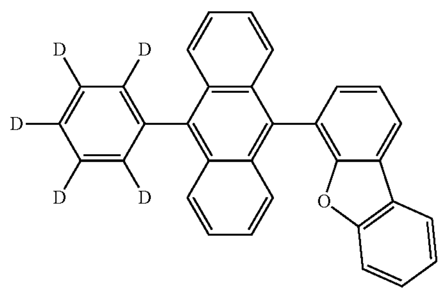
C20
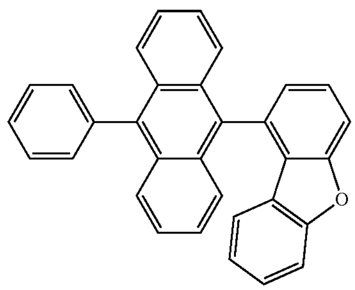
C21
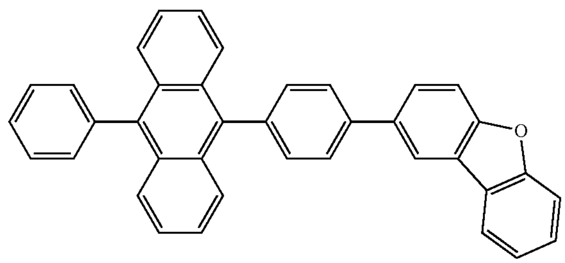
-continued
C22
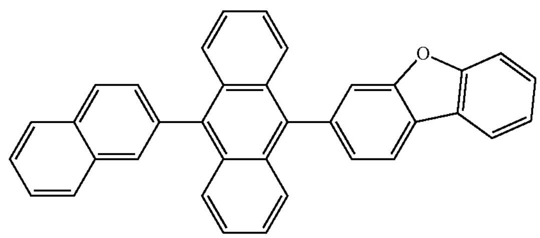
C23
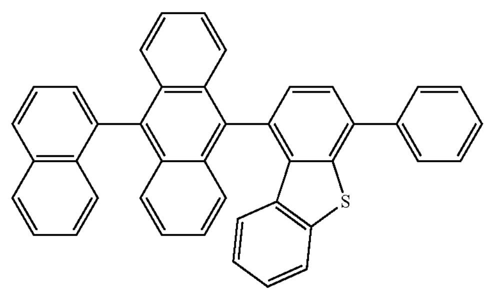
C24
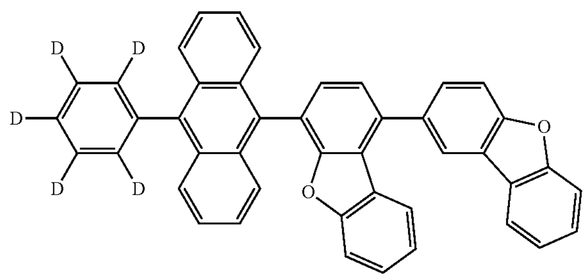
C25
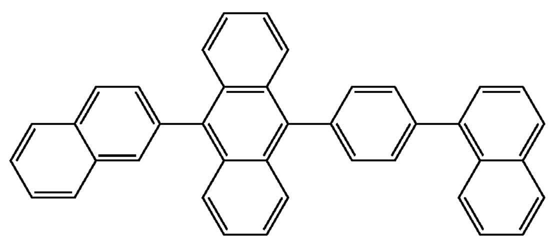
C26
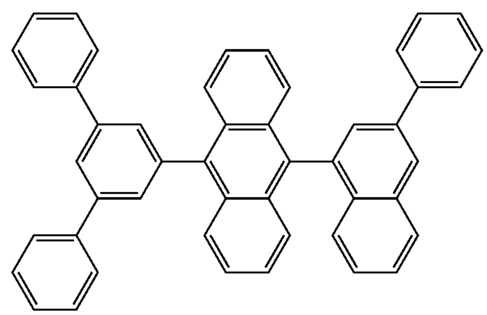

-continued
C27
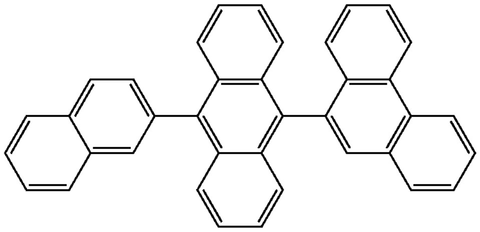
C28
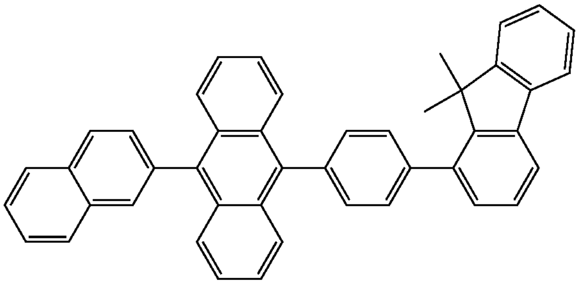
C29
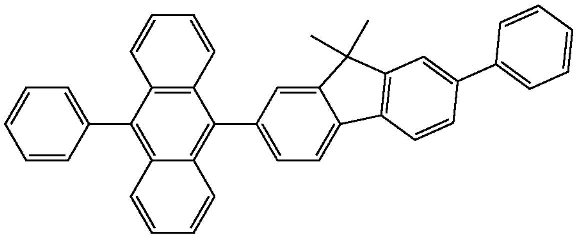
C30
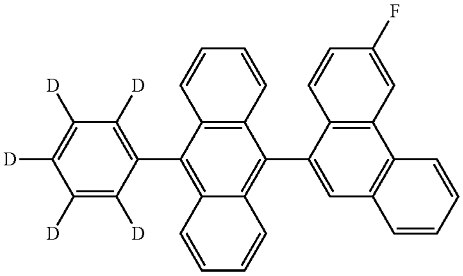
C31
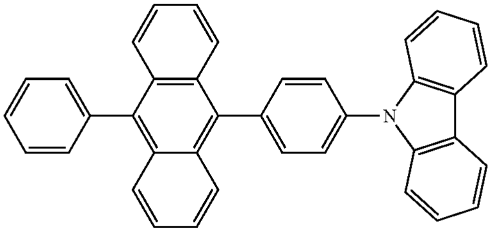
C32
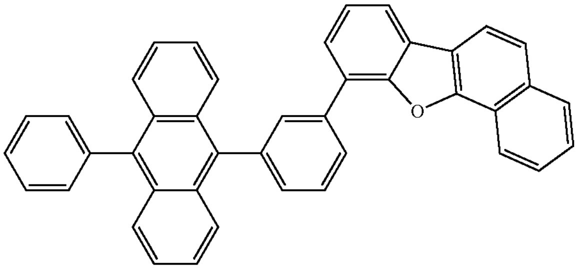
-continued
C33
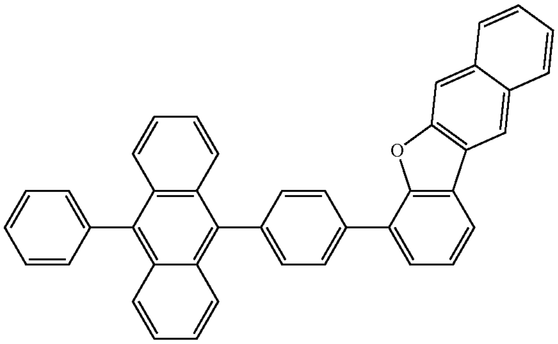
C34
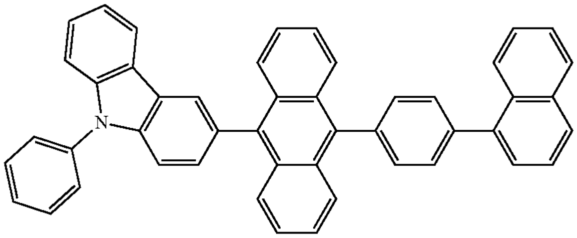
C35
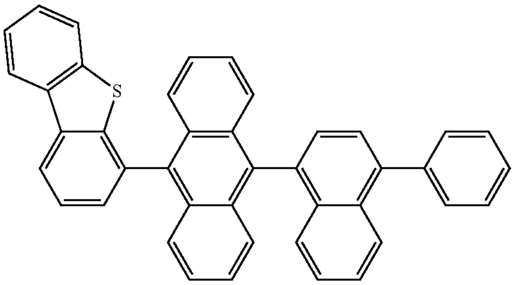
C36
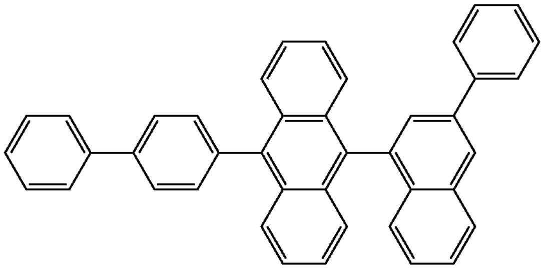
C37
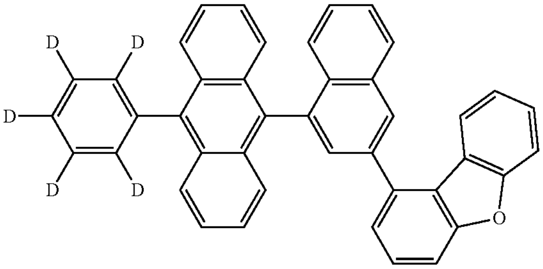

-continued
C38
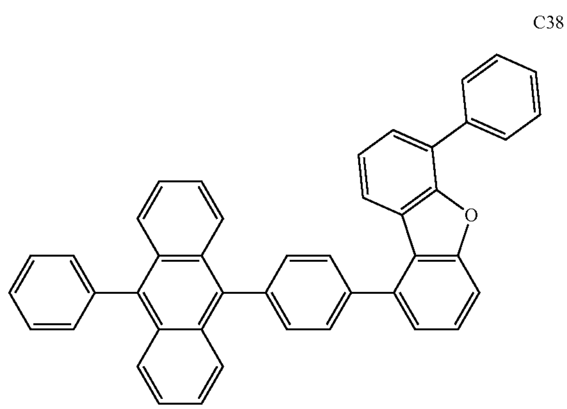
C39
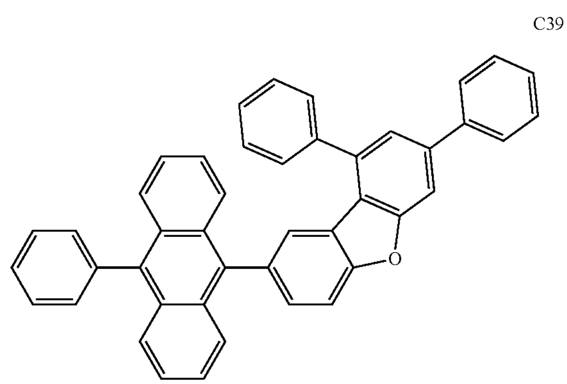
C40
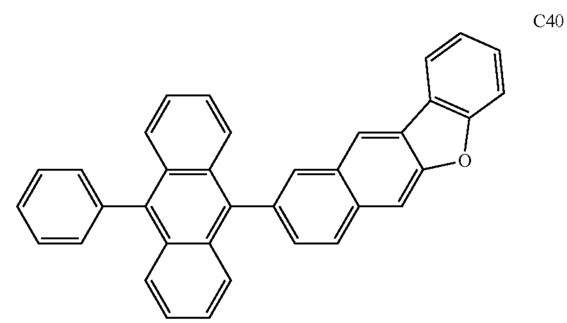
C41
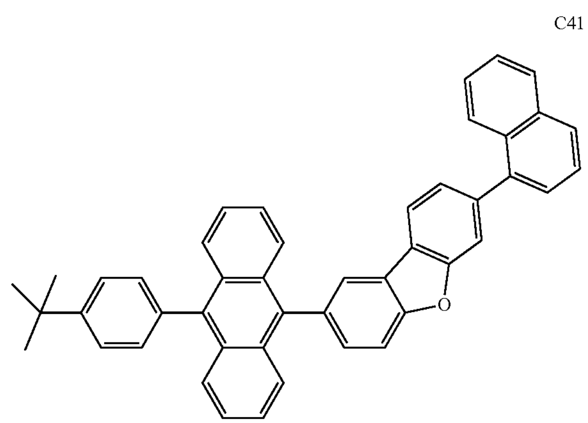
-continued
C42
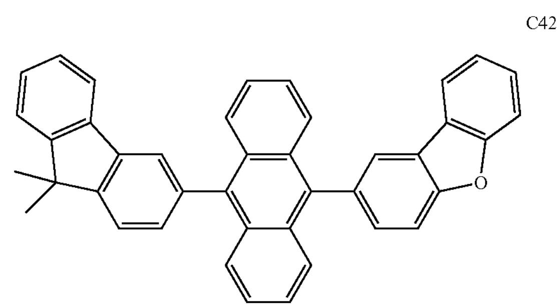
C43
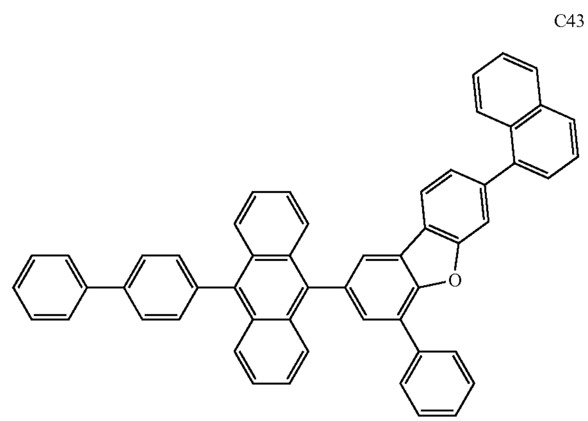
C44
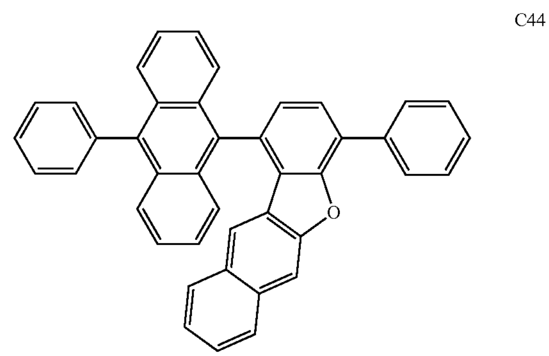
C45
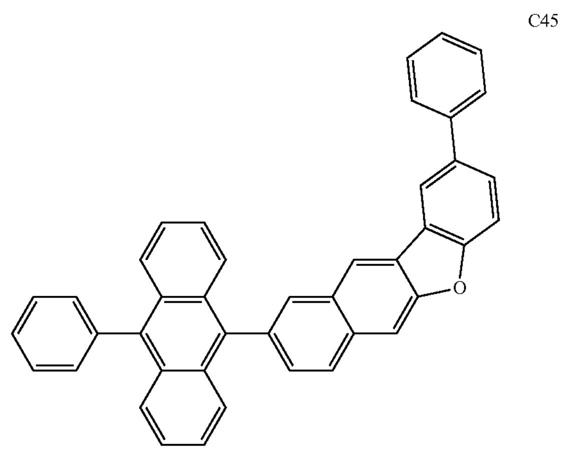

-continued

C46

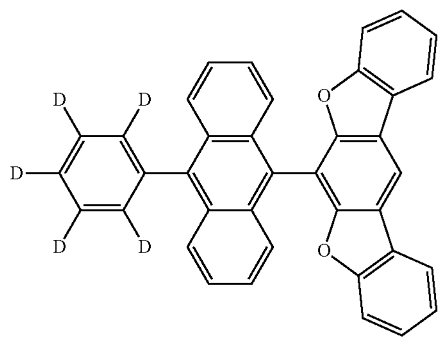

C47

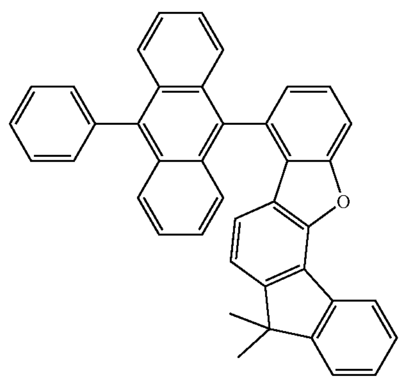

-continued

C48

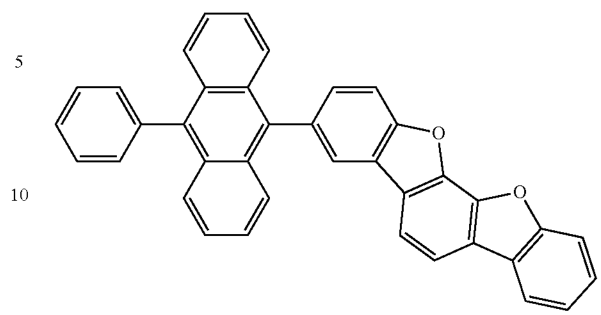

8. The organic electroluminescent device according to claim 4, wherein one or more of the layers are formed by a deposition or solution process.

9. The organic electroluminescent device according to claim 3, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

10. A polycyclic aromatic derivative selected from the following compounds 16-21, 23, 24, 41, 43, 55, 67, 74, 139, 146-148, 150, 152, 154-210, 212, and 225:

16

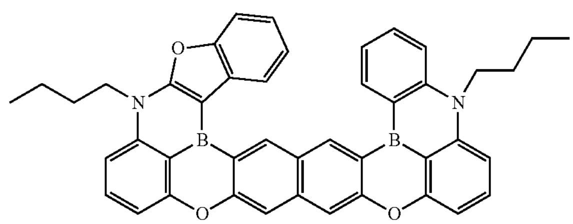

17

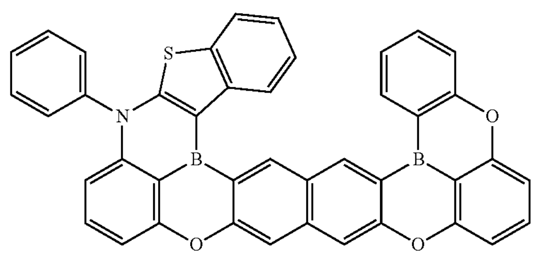

18

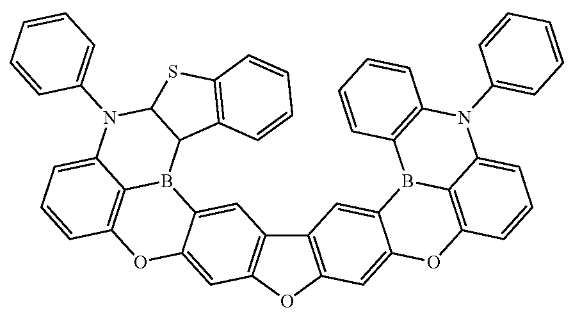

19

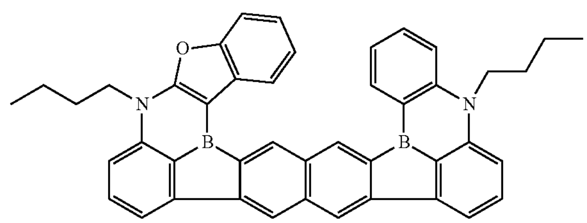

-continued
20
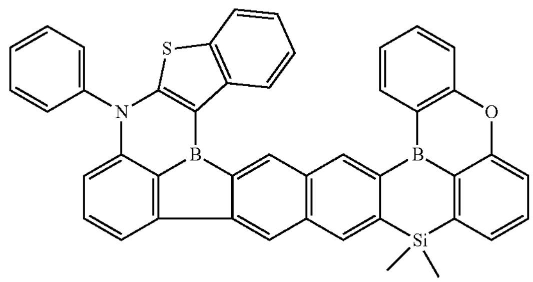
21
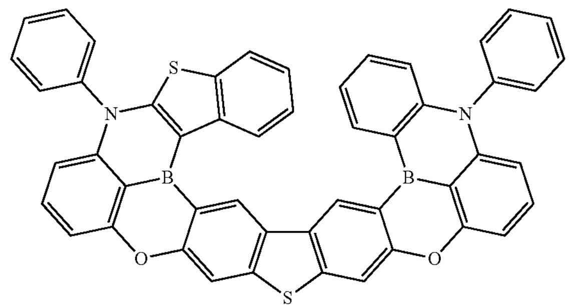
23
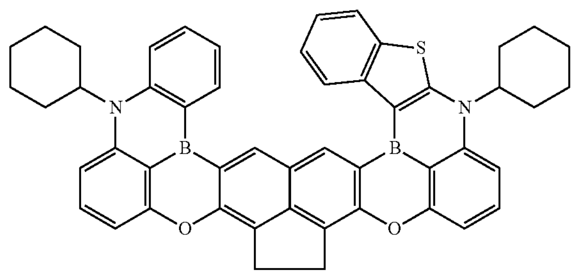
24
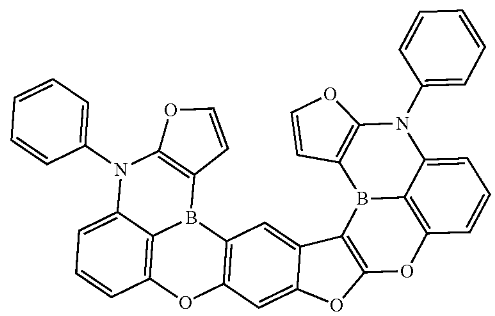
41
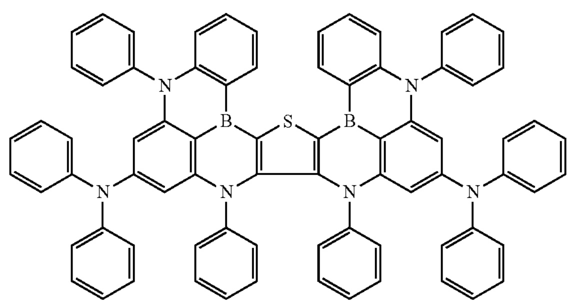
43
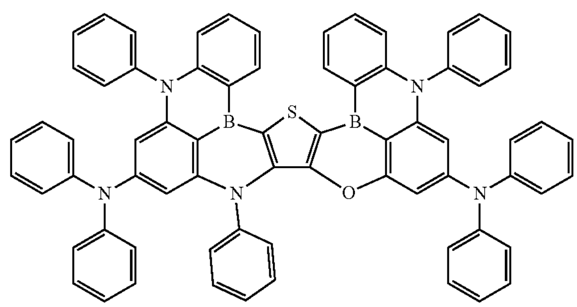
55
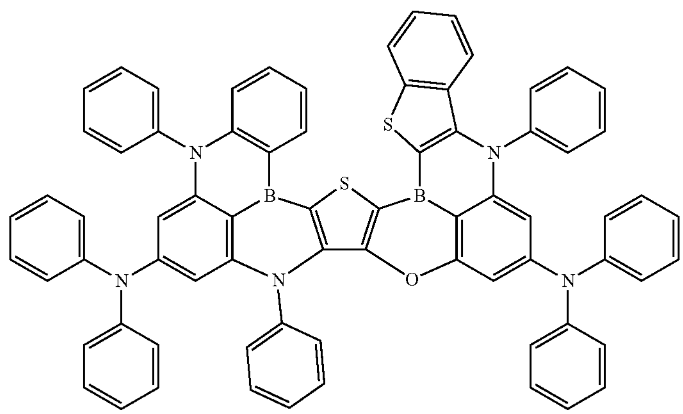

-continued
67
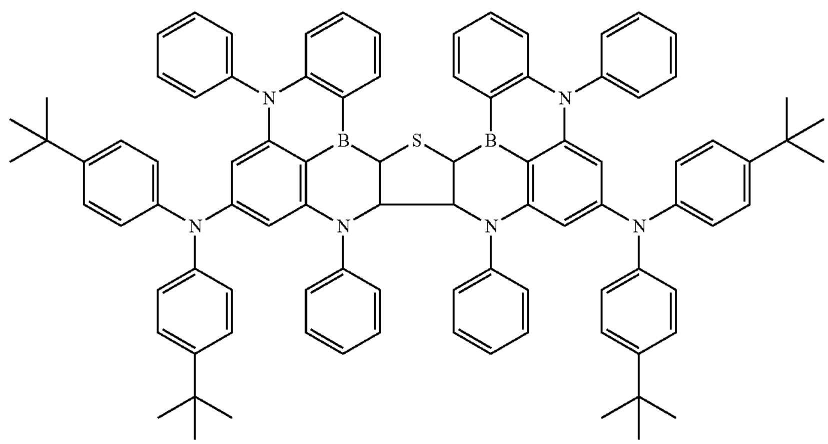
74
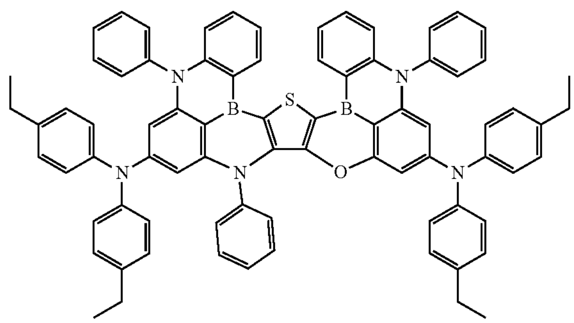
139
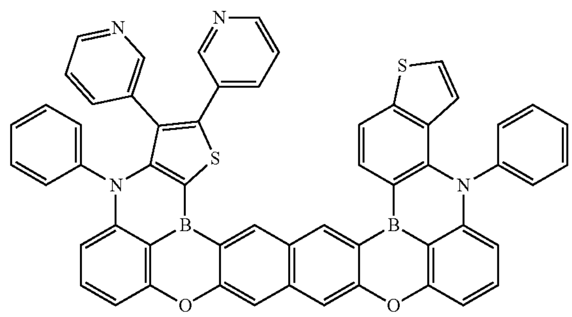
146
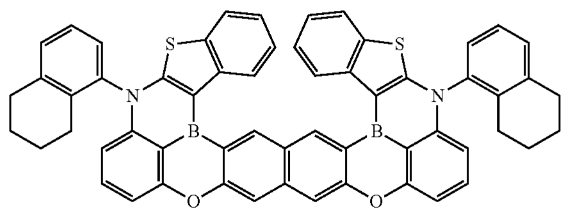
147
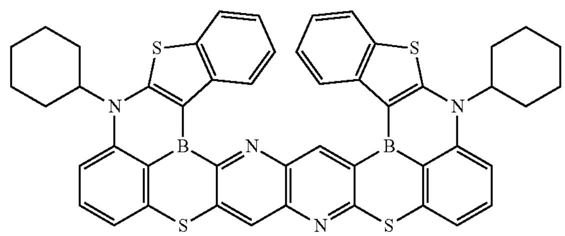
148
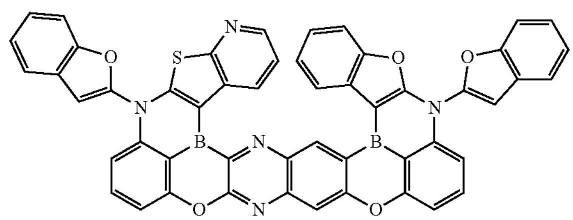
150
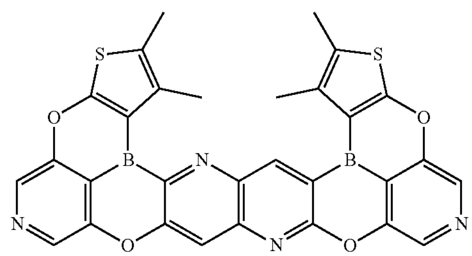
152
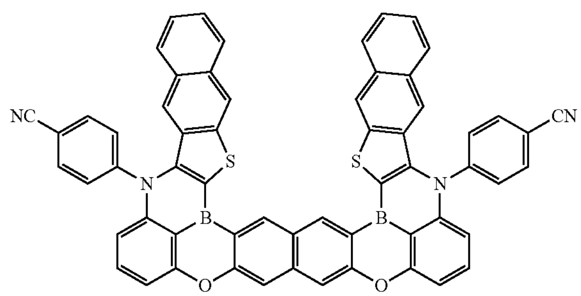
154
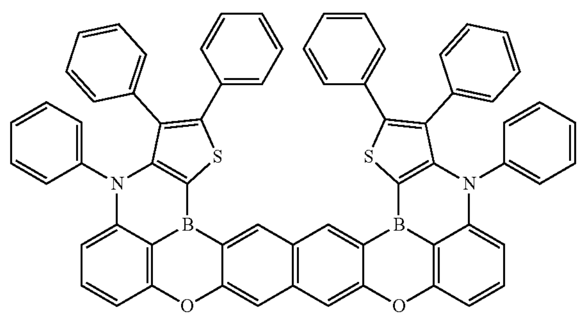

-continued
155
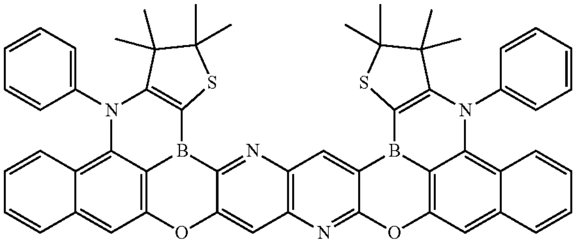
156
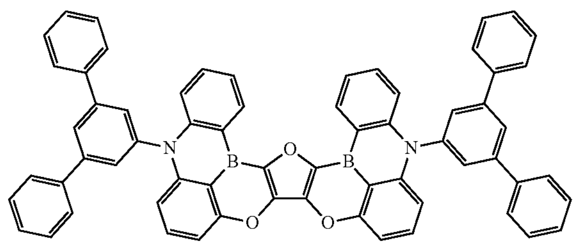
157
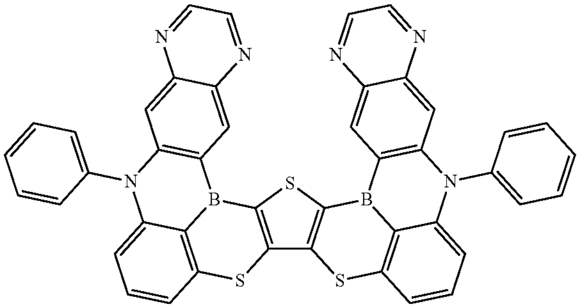
158
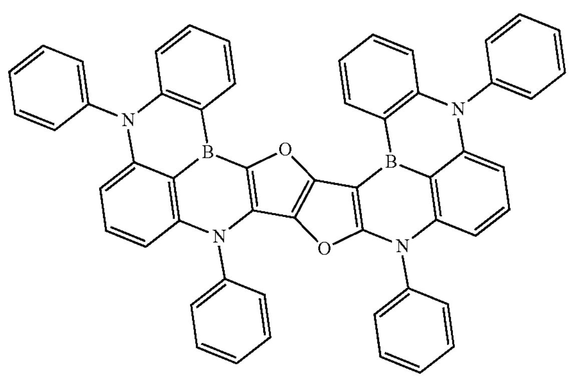
159
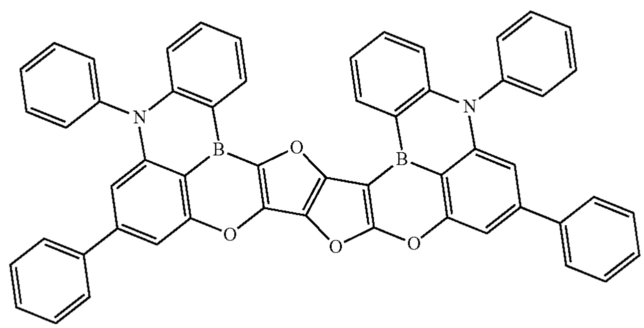
160
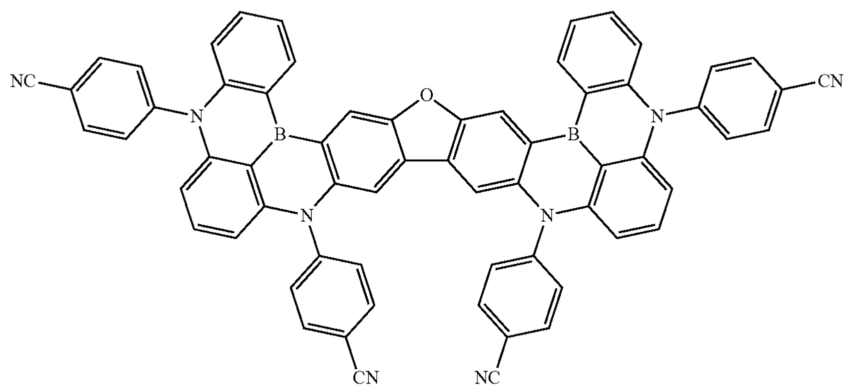

-continued
161
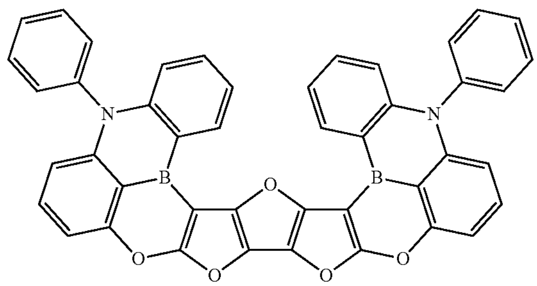
162
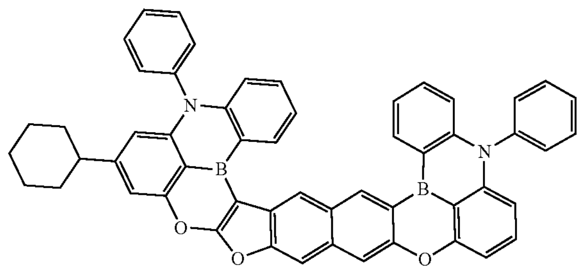
163
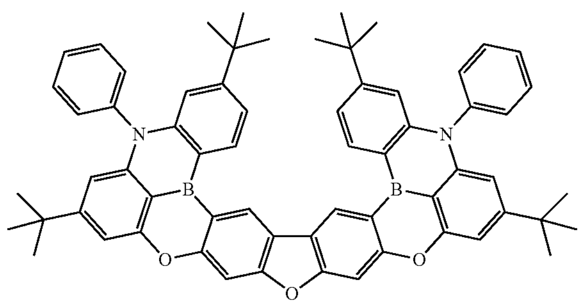
164
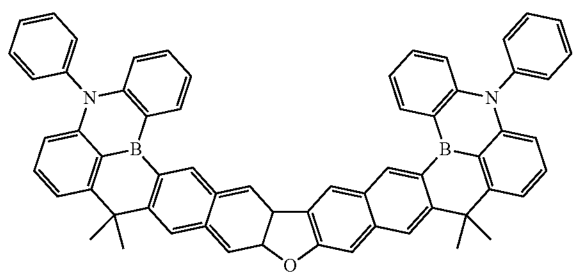
165
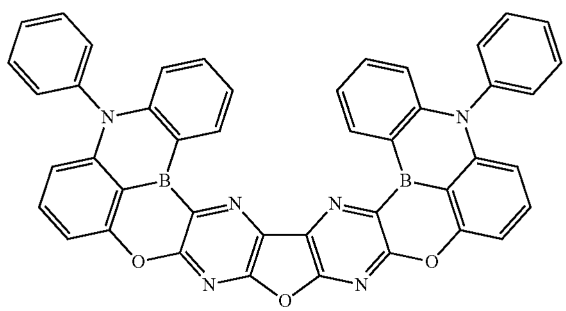
166
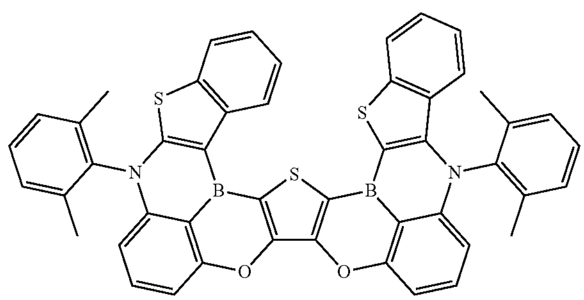
167
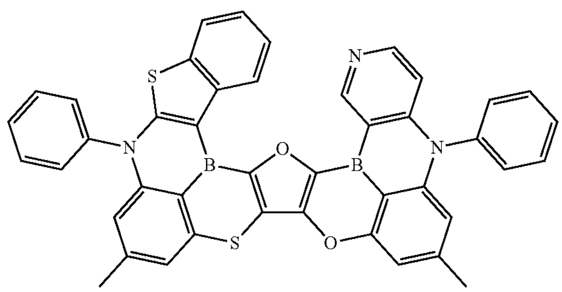
168
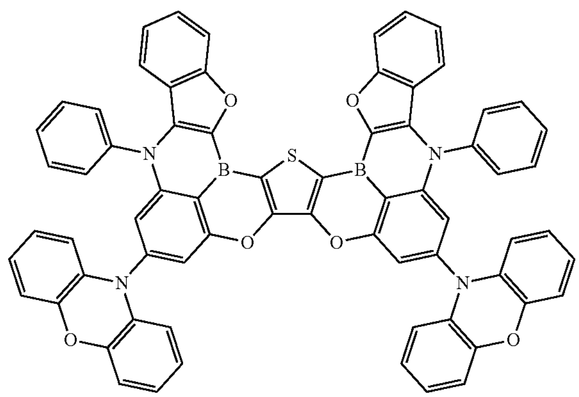

-continued
169
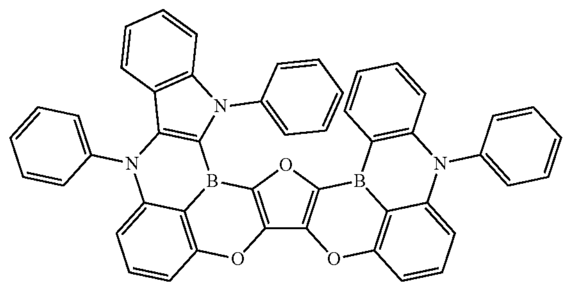
170
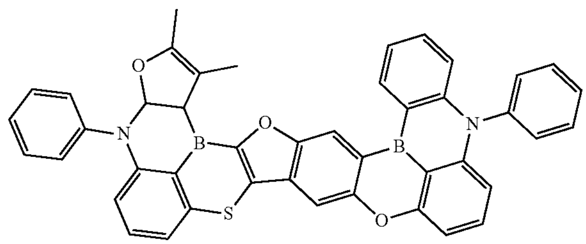
171
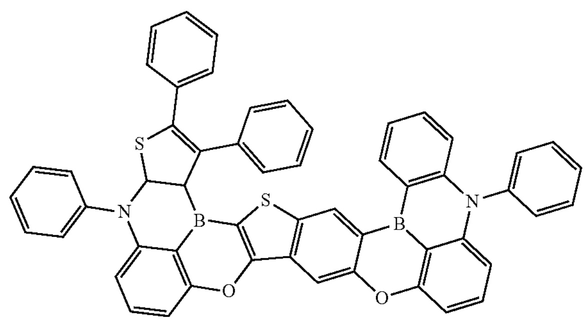
172
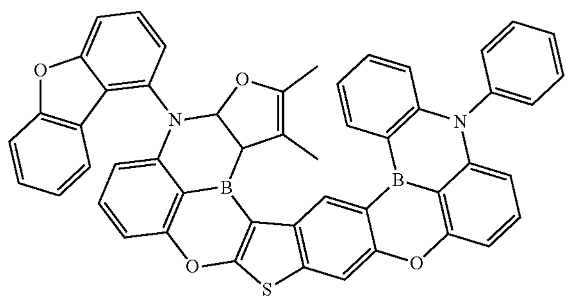
173
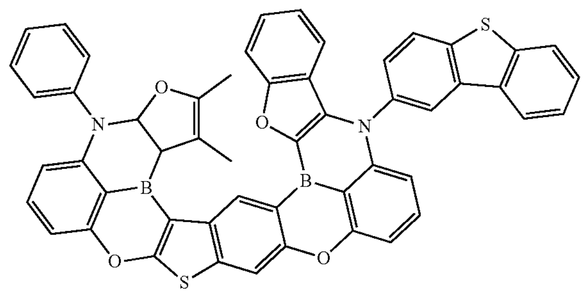
174
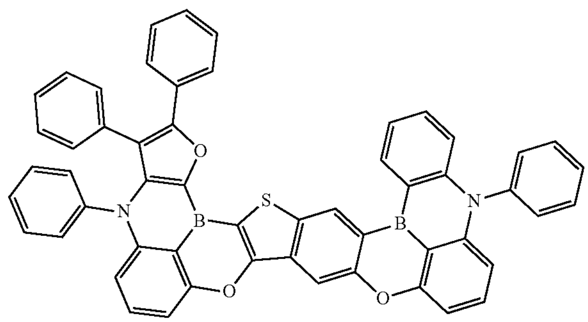
175
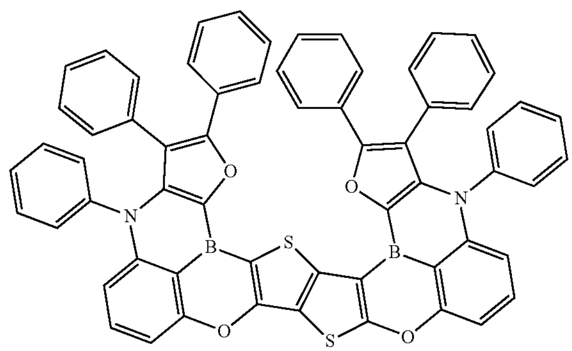
176
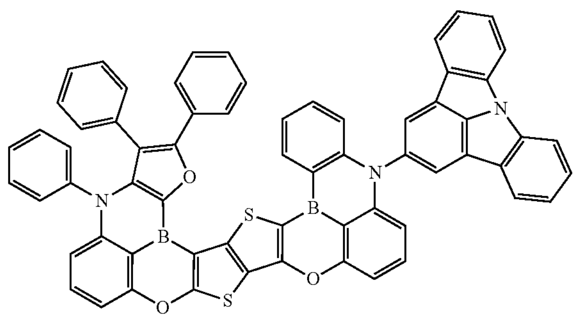

-continued
177
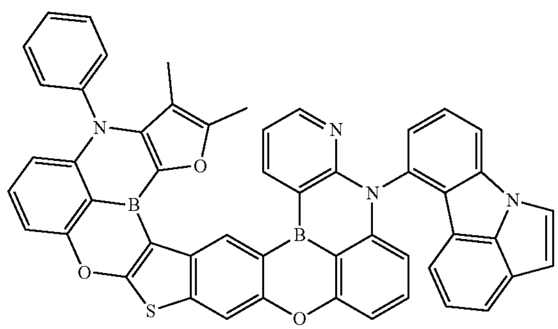
178
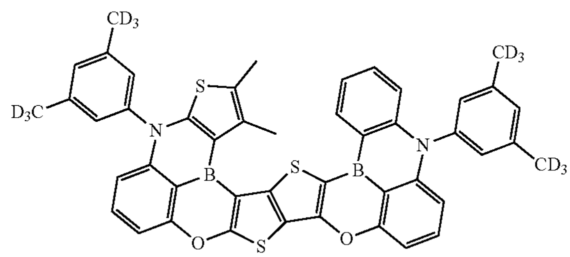
179
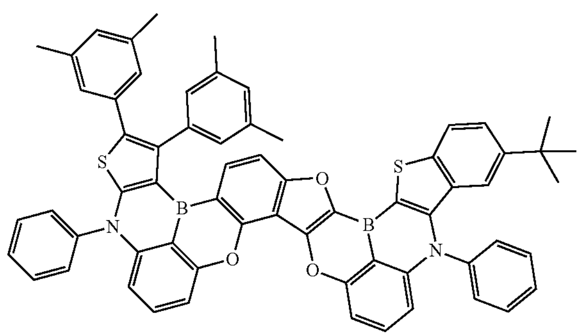
180
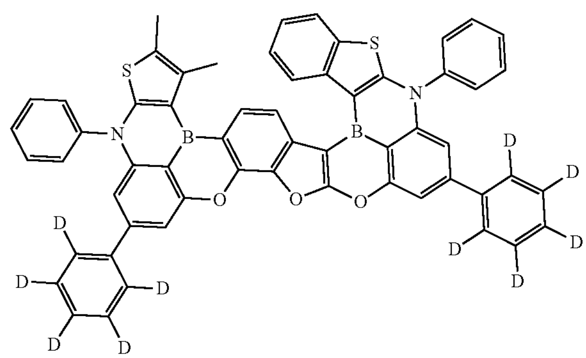
181
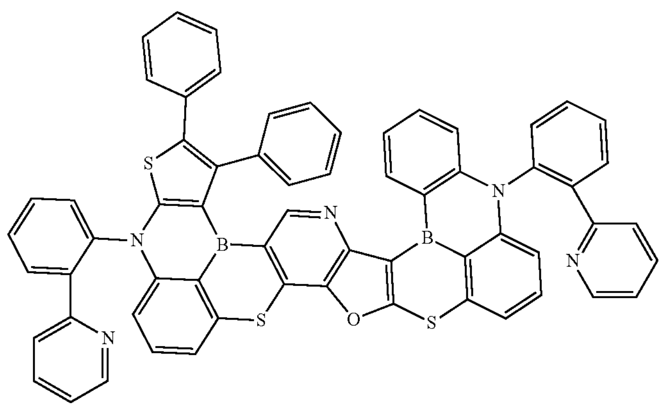
182
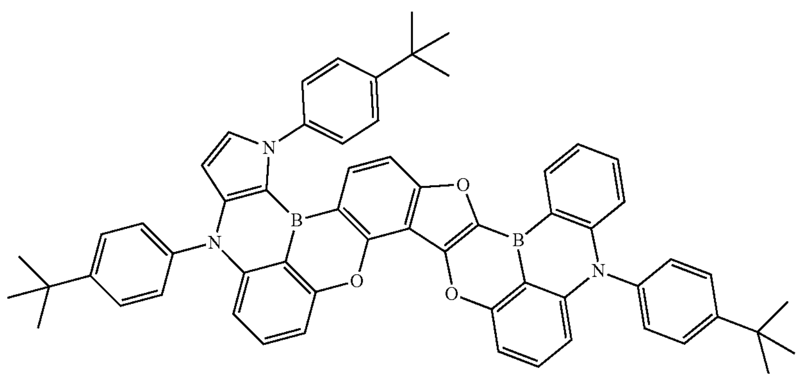

-continued
183
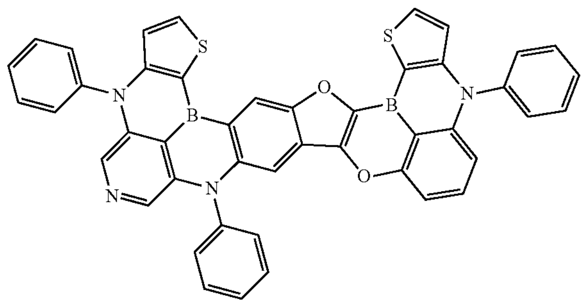
184
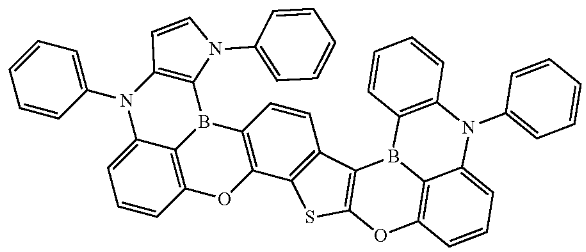
185
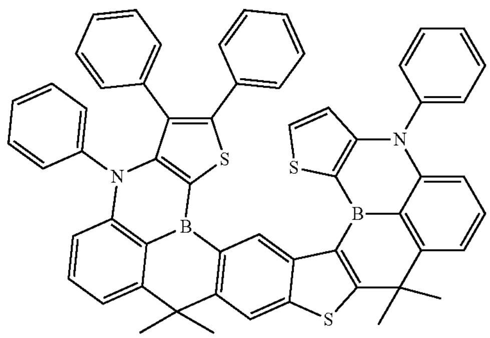
186
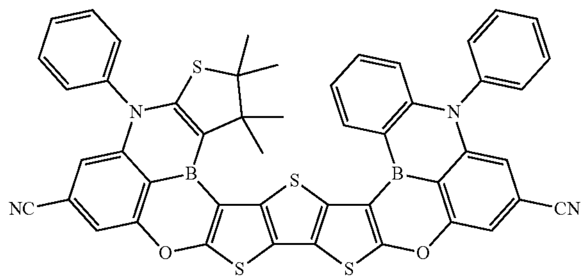
187
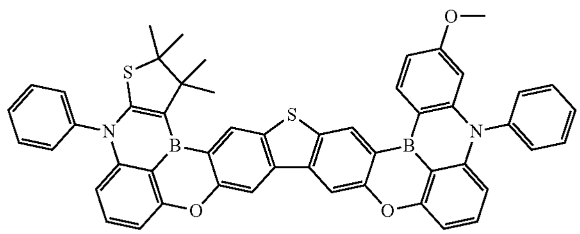
188
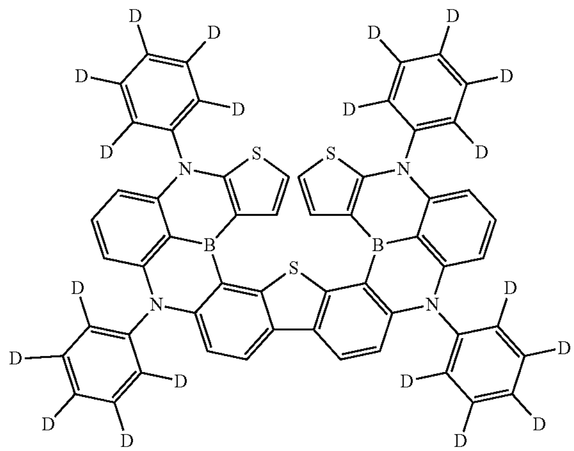
189
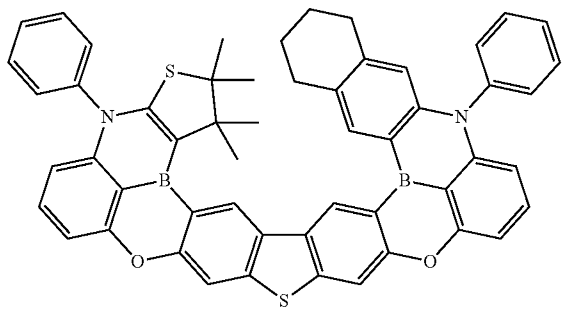
190
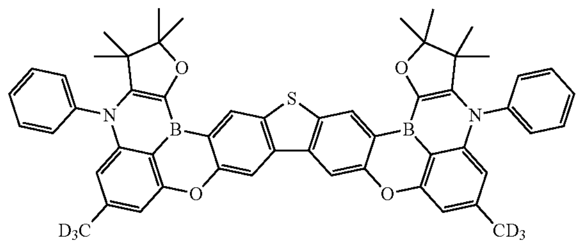

-continued
191
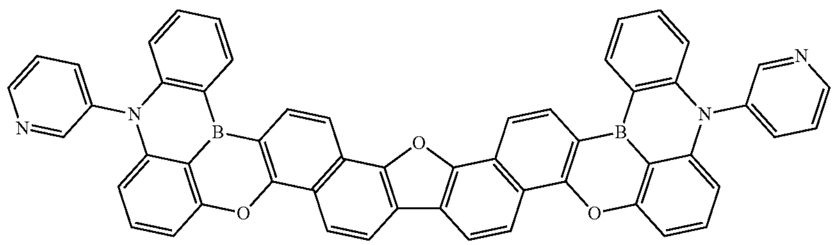
192
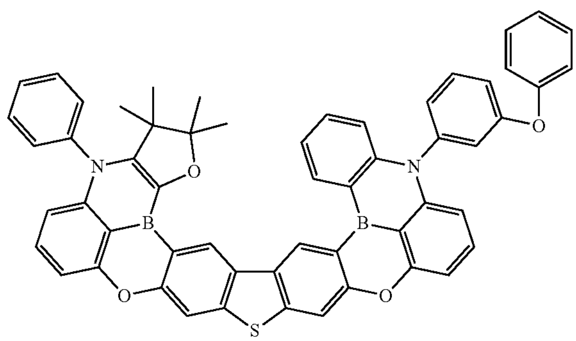
193
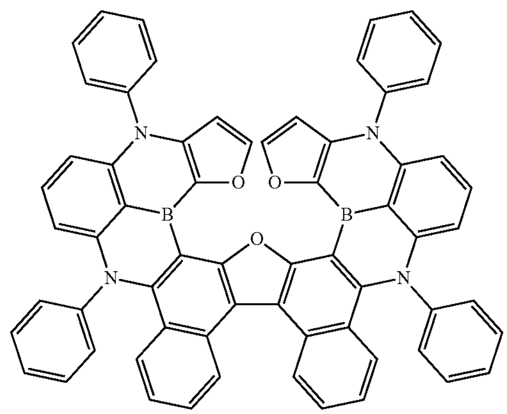
194
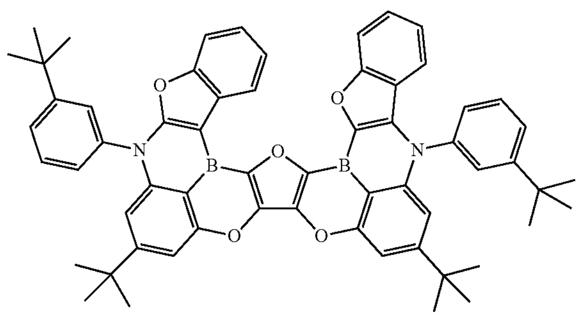
195
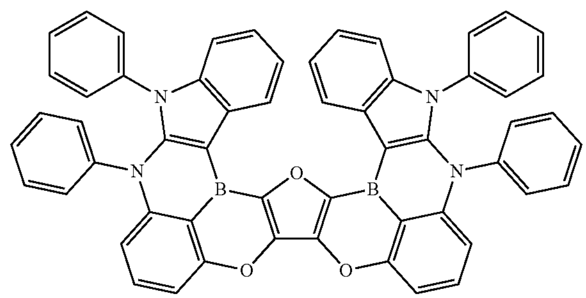
196
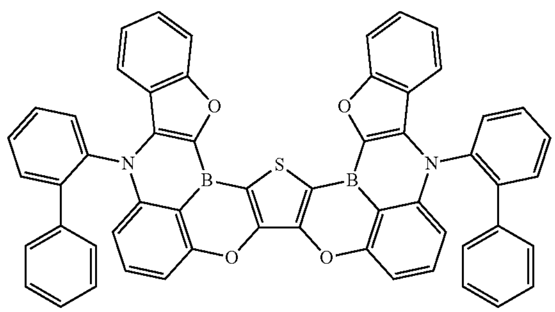
197
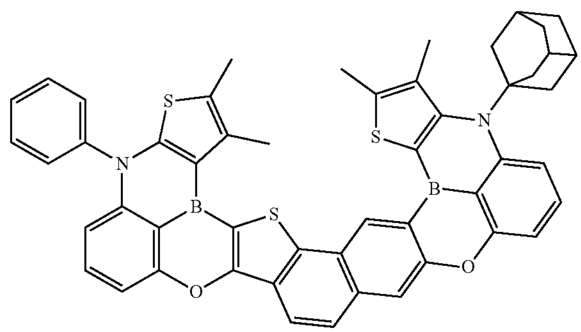

-continued
198
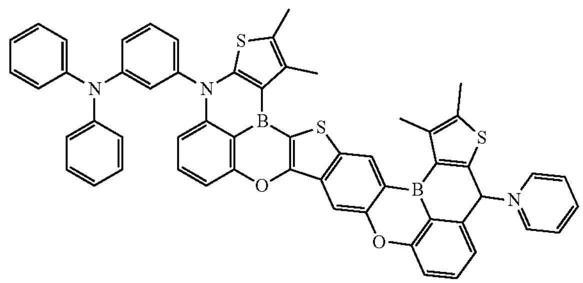
199
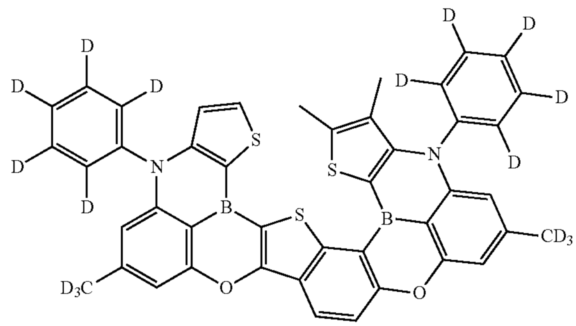
200
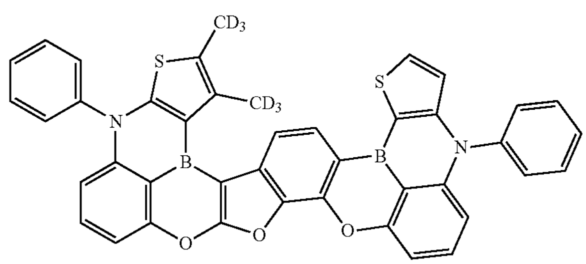
201
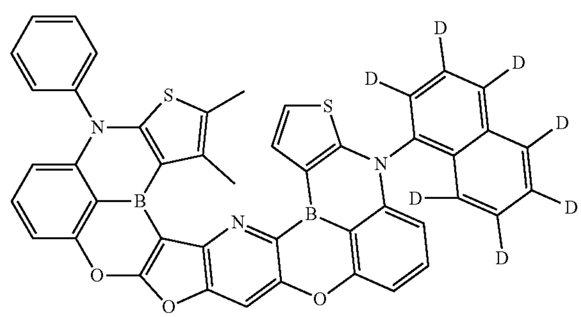
202
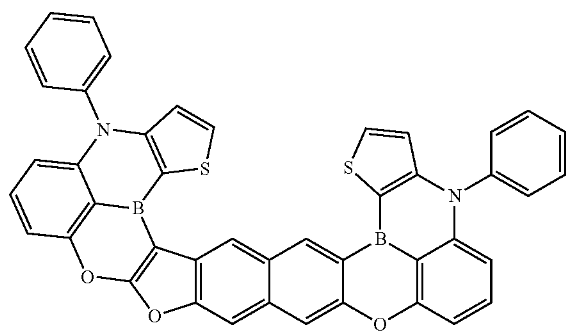
203
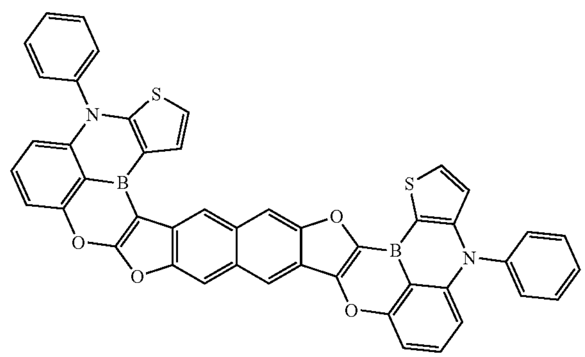
204
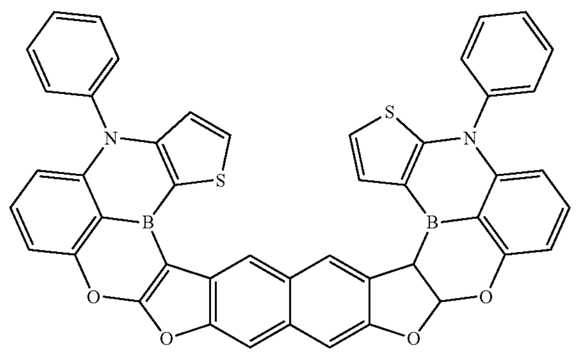
205
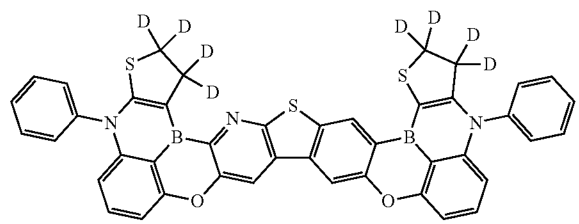

-continued

206

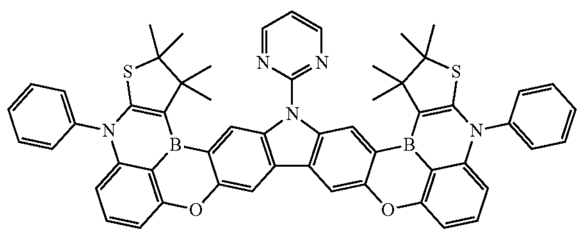

207

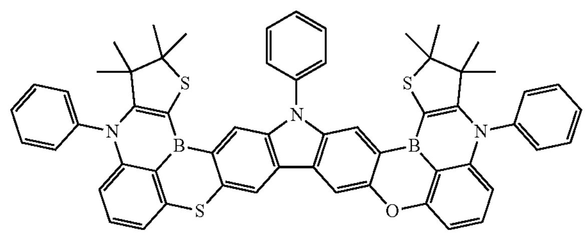

208

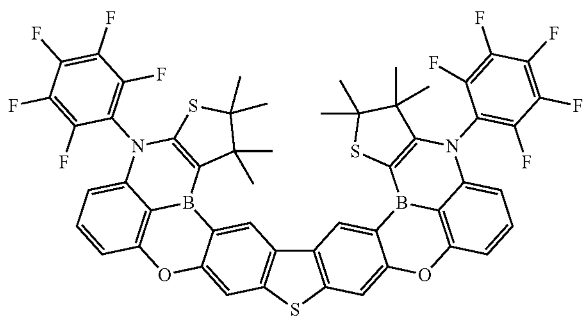

209

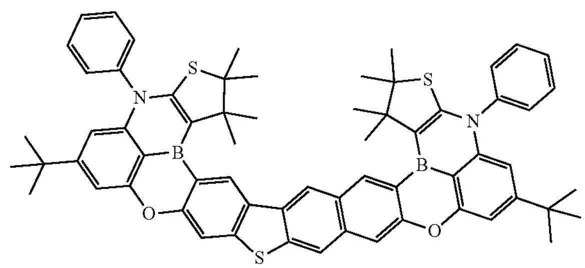

210

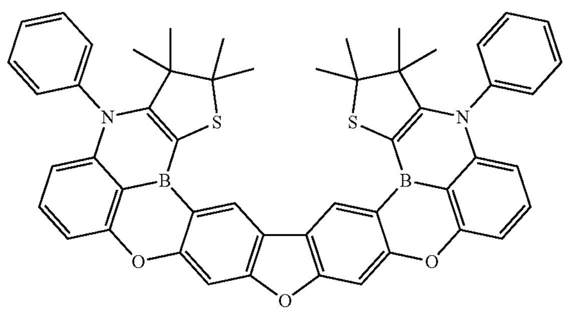

212

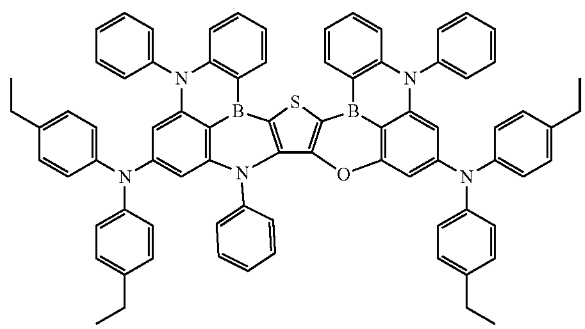

225

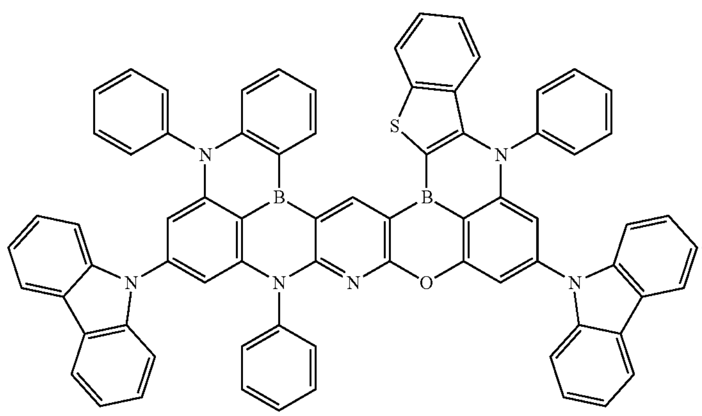

11. An organic electroluminescent device comprising a first electrode, a second electrode, and one or more organic layers interposed between the first and second electrodes, wherein the one or more organic layers comprise the compound of claim 10.

12. An organic electroluminescent device comprising a first electrode, a second electrode, and one or more organic layers interposed between the first and second electrodes, wherein the one or more organic layers comprise an electron injecting layer, an electron transport layer, a hole injecting layer, a hole transport layer, an electron blocking layer, a hole blocking layer, and/or a light emitting layer, at least one of which comprises the compound of claim 10.

13. The organic electroluminescent device according to claim 12, wherein the light emitting layer comprises, as a host compound, an anthracene derivative represented by Formula C:

[Formula C]

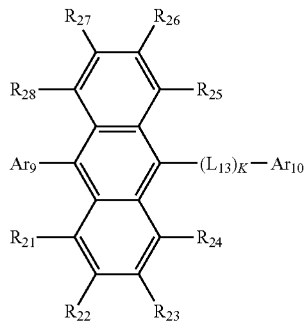

wherein $R_{21}$ to $R_{28}$ are identical to or different from each other and are as defined for $R_1$ to $R_5$ in Formula A according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

14. The organic electroluminescent device according to claim 13, wherein $Ar_9$ in Formula C is represented by Formula C-1:

[Formula C-1]

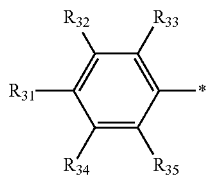

wherein $R_{31}$ to $R_{35}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, and each of $R_{31}$ to $R_{35}$ is optionally bonded to an adjacent substituent to form a saturated or unsaturated ring.

15. The organic electroluminescent device according to claim 13, wherein the anthracene derivative of Formula C is selected from the compounds represented by Formulae C1 to C48:

C1

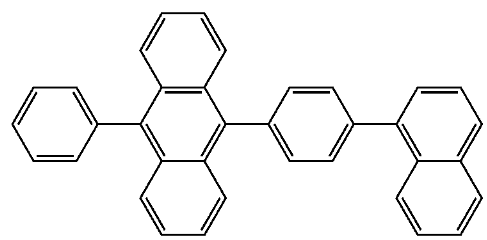

C2

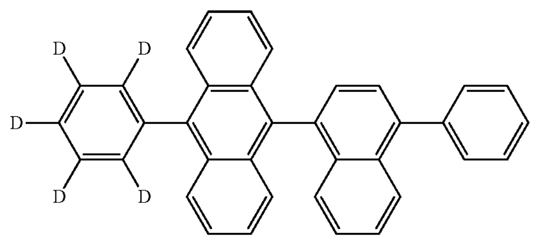

C3

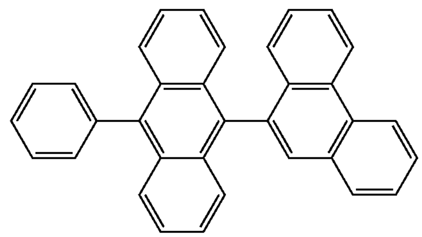

C4

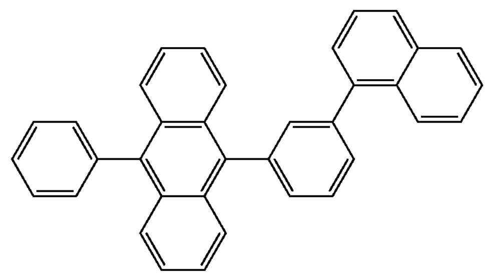

C5

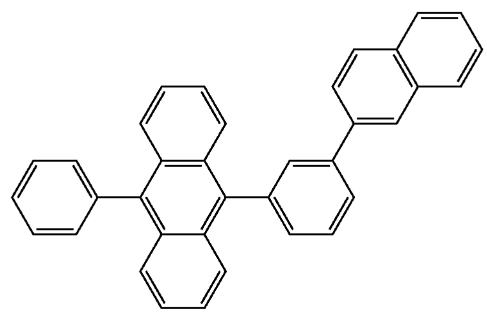

C6
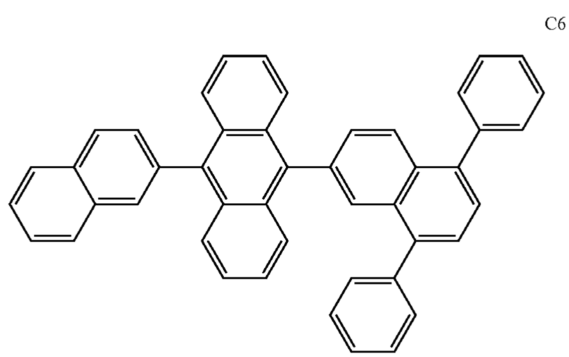
C7
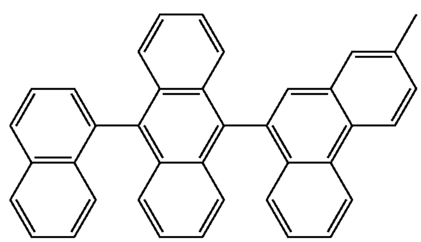
C8
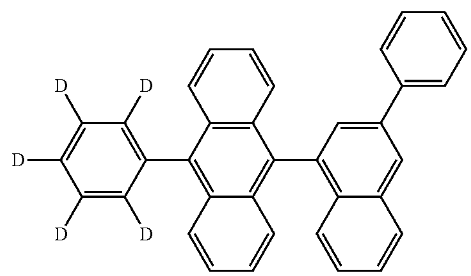
C9
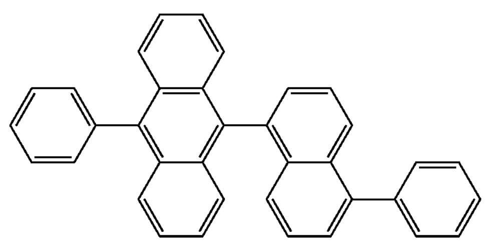
C10
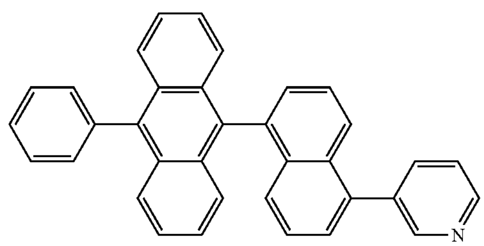
C11
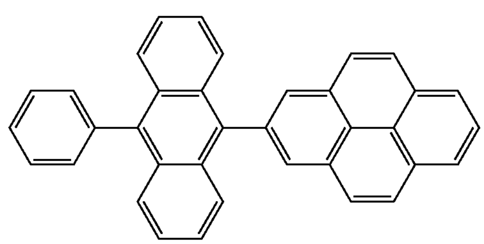
C12
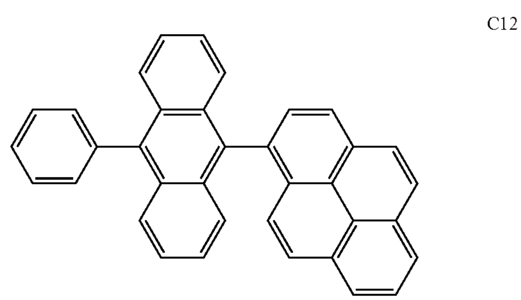
C13
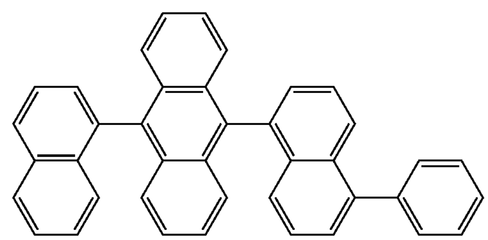
C14
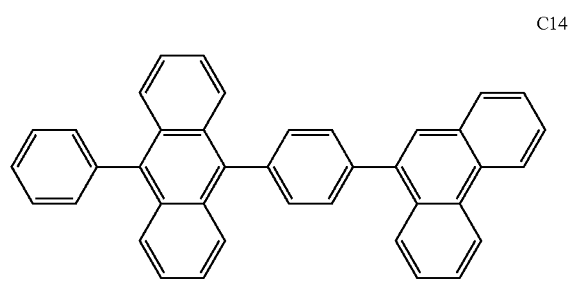
C15
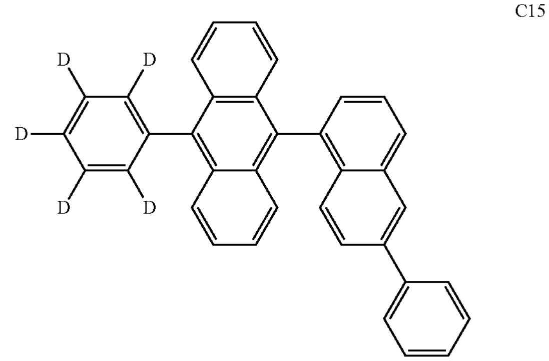
C16
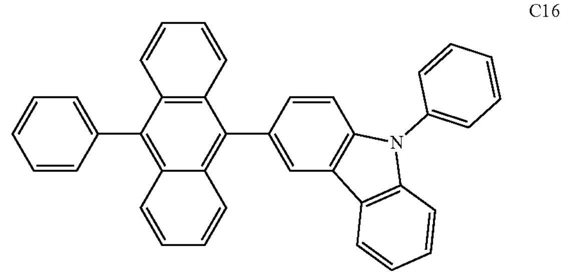

-continued
C17
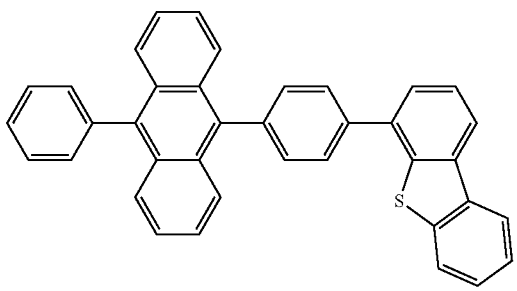
C18
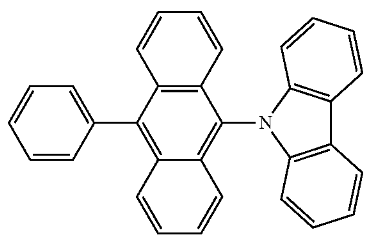
C19
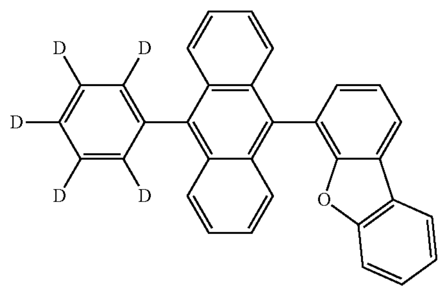
C20
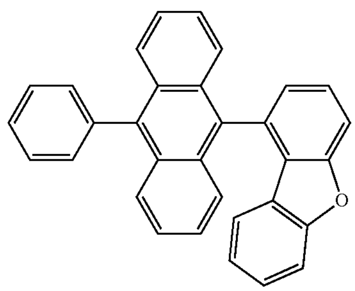
C21
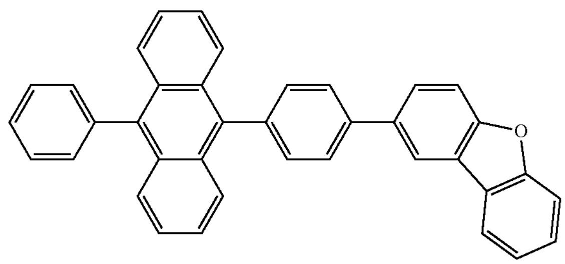
-continued
C22
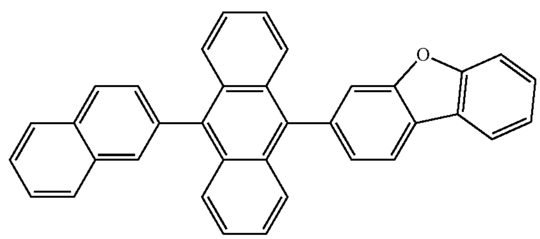
C23
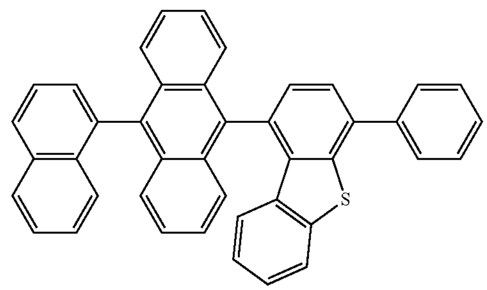
C24
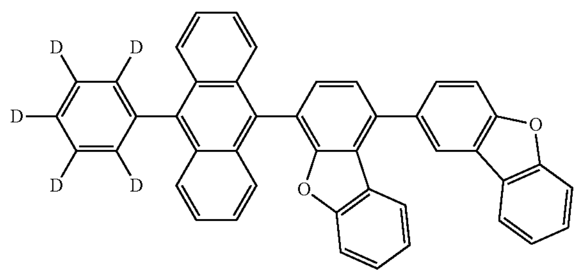
C25
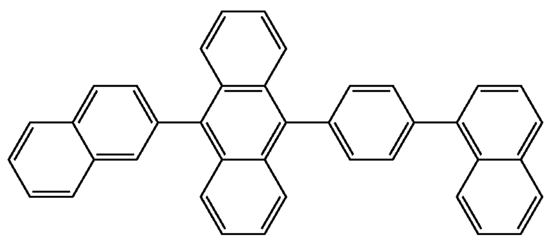
C26
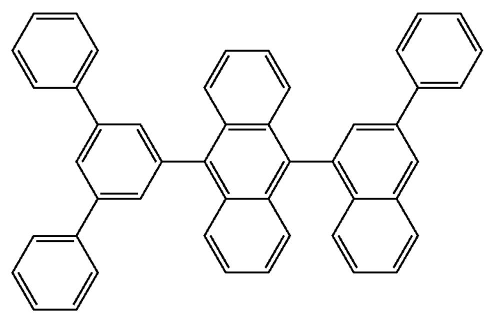

C27
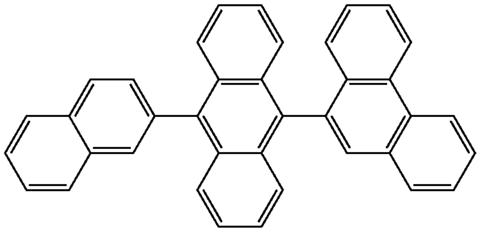
C28
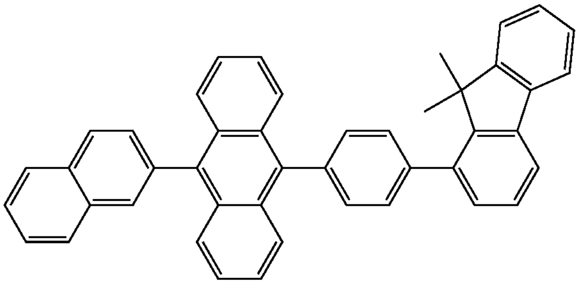
C29
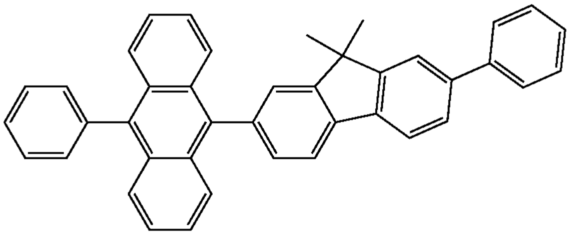
C30
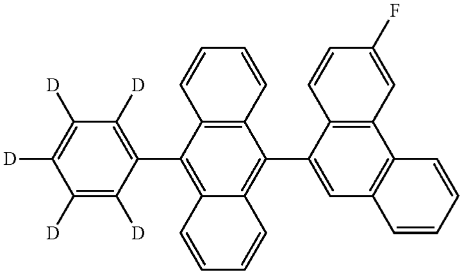
C31
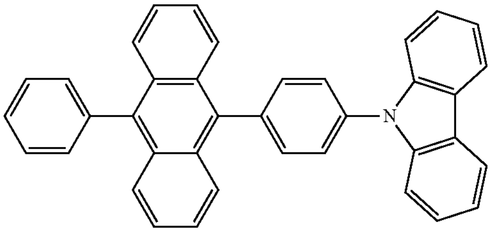
C32
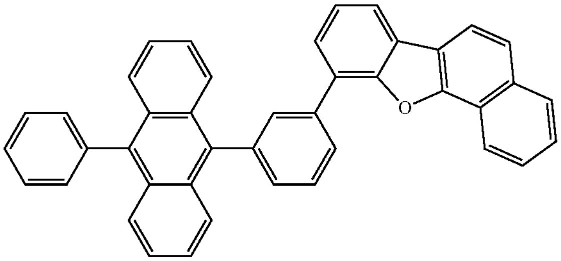
C33
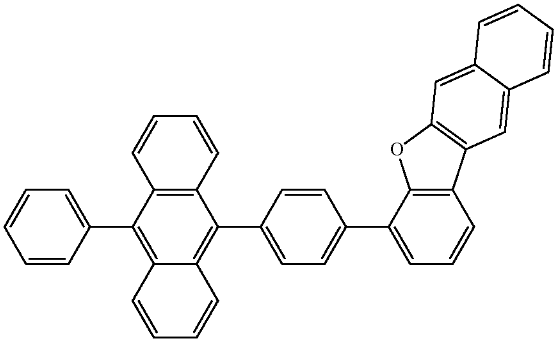
C34
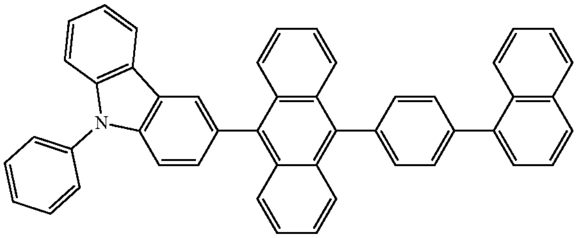
C35
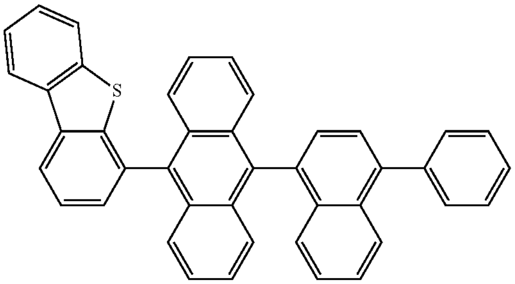
C36
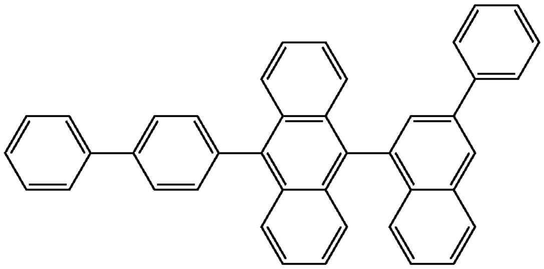
C37
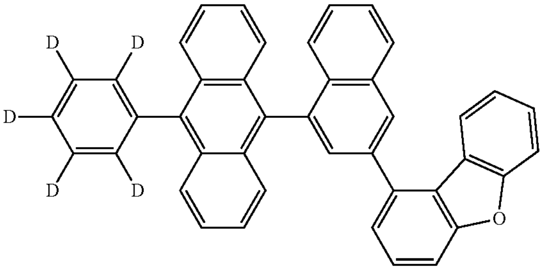

-continued
C38
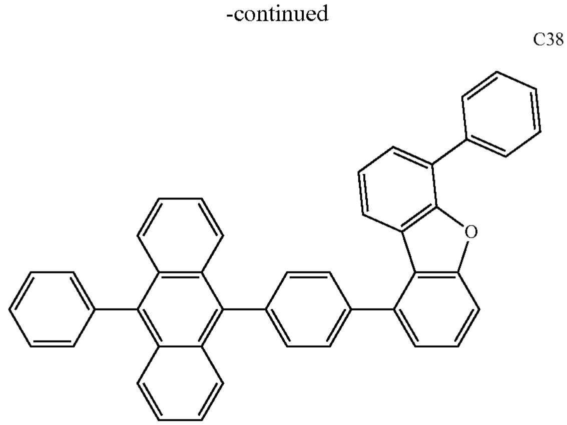
C39
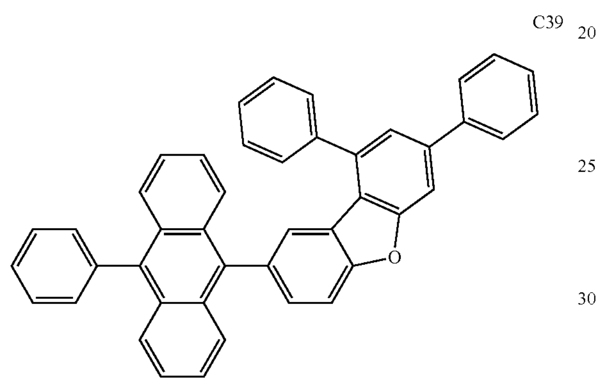
C40
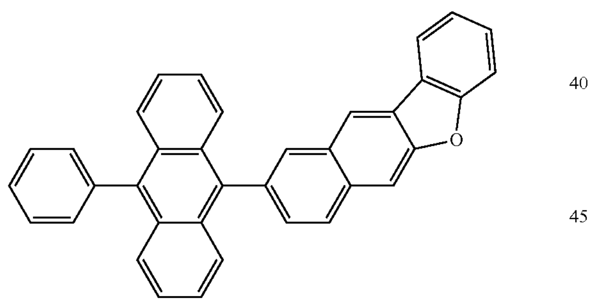
C41
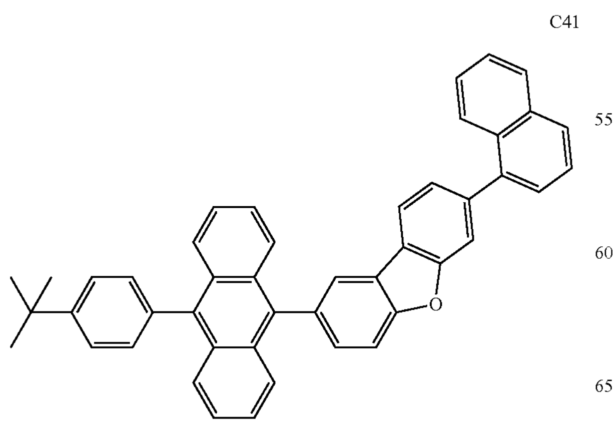
-continued
C42
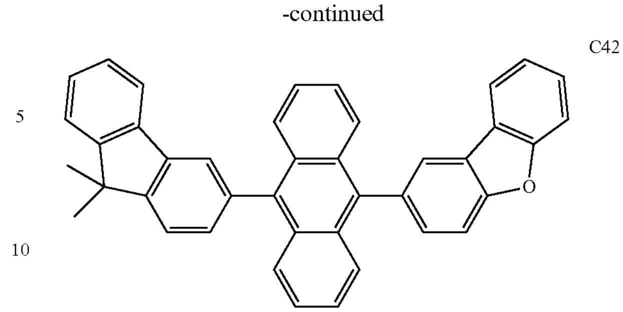
C43
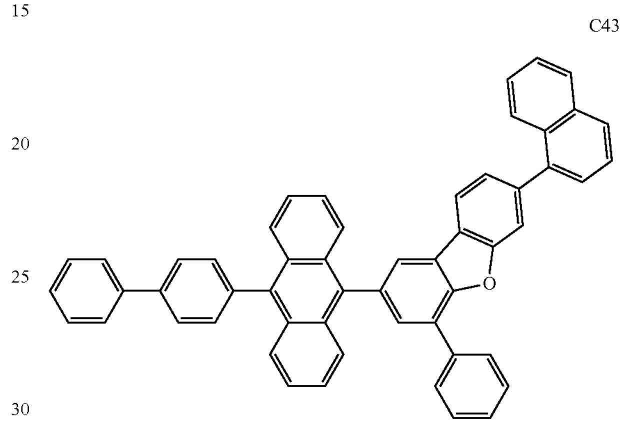
C44
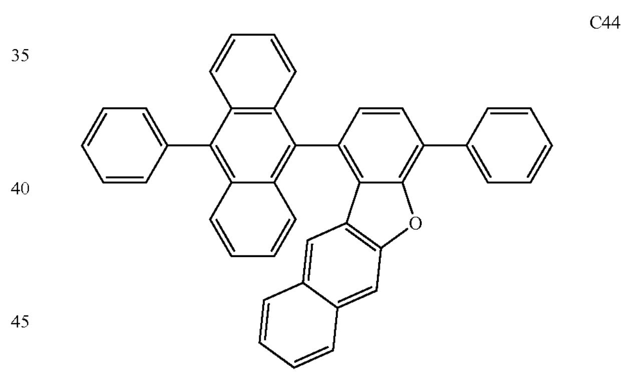
C45
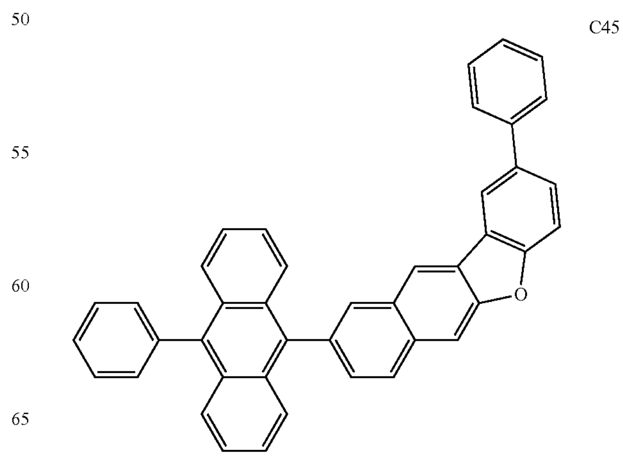

-continued

C46

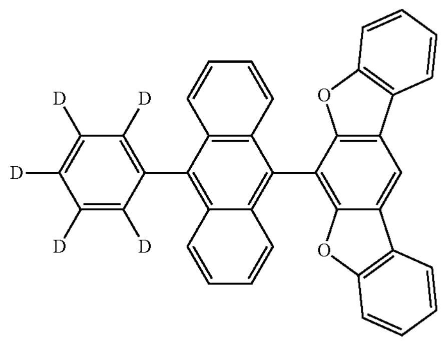

C47

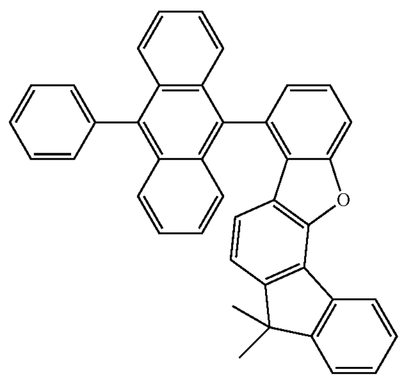

-continued

C48

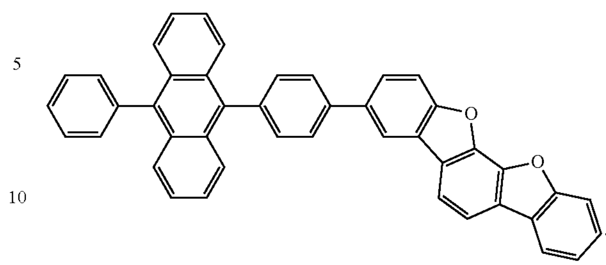

16. The organic electroluminescent device according to claim 11, wherein the one or more organic layers are formed by a deposition or solution process.

17. The organic electroluminescent device according to claim 11, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

* * * * *